(12) United States Patent
Kano et al.

(10) Patent No.: US 8,084,564 B2
(45) Date of Patent: Dec. 27, 2011

(54) METAL-FILM-COATED MATERIAL AND PROCESS FOR PRODUCING THE SAME, METALLIC-PATTERN-BEARING MATERIAL AND PROCESS FOR PRODUCING THE SAME, COMPOSITION FOR POLYMER LAYER FORMATION, NITRILE GROUP-CONTAINING POLYMER AND METHOD OF SYNTHESIZING THE SAME, COMPOSITION CONTAINING NITRILE GROUP-CONTAINING POLYMER, AND LAMINATE

(75) Inventors: Takeyoshi Kano, Kanagawa (JP); Hideo Nagasaki, Kanagawa (JP); Masataka Sato, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 269 days.

(21) Appl. No.: 12/433,034

(22) Filed: Apr. 30, 2009

(65) Prior Publication Data

US 2009/0214876 A1   Aug. 27, 2009

Related U.S. Application Data

(62) Division of application No. 12/446,722, filed as application No. PCT/JP2007/070545 on Oct. 22, 2007.

(30) Foreign Application Priority Data

| Oct. 23, 2006 | (JP) | 2006-287930 |
| Mar. 30, 2007 | (JP) | 2007-095758 |
| Mar. 30, 2007 | (JP) | 2007-095760 |
| May 31, 2007 | (JP) | 2007-146198 |
| May 31, 2007 | (JP) | 2007-146199 |
| Sep. 28, 2007 | (JP) | 2007-256745 |
| Sep. 28, 2007 | (JP) | 2007-256746 |

(51) Int. Cl.
- *B32B 27/08* (2006.01)
- *C08F 22/30* (2006.01)
- *C08K 5/07* (2006.01)
- *C08K 5/16* (2006.01)

(52) U.S. Cl. ........ 526/298; 526/297; 524/205; 524/356; 524/555; 428/500

(58) Field of Classification Search ............... 526/323.2, 526/297, 298; 524/555
See application file for complete search history.

(56) References Cited

U.S. PATENT DOCUMENTS

| 2,885,371 A | 5/1959 | Tavani et al. |
| 3,448,089 A | 6/1969 | Celeste |
| 6,410,206 B1 * | 6/2002 | Ueda et al. ......... 430/280.1 |
| 2002/0172873 A1 | 11/2002 | Ueda et al. |

FOREIGN PATENT DOCUMENTS

| GB | 824225 | 11/1959 |
| GB | 951025 | 3/1964 |
| JP | 51-37316 B1 | 10/1976 |
| JP | 58-196238 A | 11/1983 |
| JP | 62-153340 A | 7/1987 |
| JP | 04-259381 A | 9/1992 |
| JP | 07-267897 A | 10/1995 |
| JP | 11-106372 A | 4/1999 |
| JP | 2000-159727 A | 6/2000 |
| JP | 2000-248024 A | 9/2000 |
| JP | 2004-176025 A | 6/2004 |
| JP | 2006-057059 A | 3/2006 |

OTHER PUBLICATIONS

EP Communication, dated Sep. 29, 2009, issued in corresponding EP Application No. 09008260.3, 4 pages.
En Tang Kang et al., "Surface Modification of Fluoropolymers via Molecular Design", Advanced Materials, Oct. 16, 2000, pp. 1481-1494, vol. 12, No. 20.
International Search Report, mailed Jan. 29, 2008, in corresponding PCT Application No. PCT/JP2007/070545.

\* cited by examiner

*Primary Examiner* — David W Wu
*Assistant Examiner* — Vu A Nguyen
(74) *Attorney, Agent, or Firm* — Sughrue Mion, PLLC

(57) ABSTRACT

The invention provides a polymer containing at least a unit represented by the following Formula (1) and a unit represented by the following Formula (2). In Formula (1) and Formula (2), $R^1$ to $R^5$ each independently represent a hydrogen atom or a substituted or unsubstituted alkyl group; X, Y and Z each independently represent a single bond, a substituted or unsubstituted divalent organic group, an ester group, an amide group or an ether group; and $L^1$ and $L^2$ each independently represent a substituted or unsubstituted divalent organic group. The invention provides a method of synthesizing embodiments of the polymer, a composition containing the polymer, and a laminate formed by applying the composition on a resin base material.

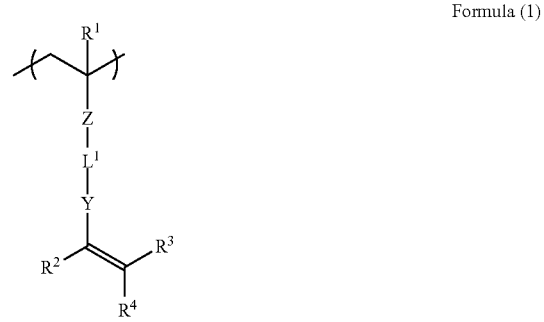

Formula (1)

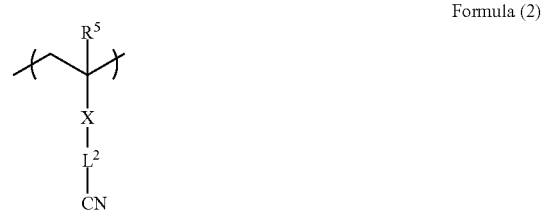

Formula (2)

22 Claims, No Drawings

METAL-FILM-COATED MATERIAL AND PROCESS FOR PRODUCING THE SAME, METALLIC-PATTERN-BEARING MATERIAL AND PROCESS FOR PRODUCING THE SAME, COMPOSITION FOR POLYMER LAYER FORMATION, NITRILE GROUP-CONTAINING POLYMER AND METHOD OF SYNTHESIZING THE SAME, COMPOSITION CONTAINING NITRILE GROUP-CONTAINING POLYMER, AND LAMINATE

This is a divisional of application Ser. No. 12/446,722 filed Apr. 22, 2009, which is a National Stage Application filed under §371 of PCT Application No. PCT/JP2007/070545 filed Oct. 22, 2007, which claims priority to JP 2006-287930 filed Oct. 23, 2006; JP 2007-095758 filed Mar. 30, 2007; JP 2007-095760 filed Mar. 30, 2007; JP 2007-146198 filed May 31, 2007; JP 2007-146199 filed May 31, 2007; JP 2007-256745 filed Sep. 28, 2007; and JP 2007-256746 filed Sep. 28, 2007. The entire disclosure of the prior application, application Ser. No. 12/446,722 is hereby incorporated by reference.

TECHNICAL FIELD

The present invention relates to a process for producing a metal film-coated material, a metal film-coated material, a process for producing a metallic pattern-bearing material, a metallic pattern-bearing material, and a composition for polymer layer formation. The invention further relates to a novel polymer containing a nitrile group and a polymerizable group, a method of synthesizing the polymer, a composition containing the polymer, and a laminate formed by using the composition.

BACKGROUND ART

Conventionally, metallic wiring boards in which wiring based on a metallic pattern is formed on the surface of an insulative substrate have been widely used for electronic parts and semiconductor devices.

A "subtractive method" is mainly used for producing such a metallic pattern-bearing material. The subtractive method includes providing a photosensitive layer, which is sensitized by irradiation with actinic rays, on a metal film formed on a substrate surface, subjecting the photosensitive layer to imagewise exposure, developing the photosensitive layer to form a resist image, etching the metal film to form a metallic pattern, and finally peeling off the resist.

In the metallic pattern obtainable by this method, adhesion between the substrate and the metal film is generated by an anchor effect, which occurs as a result of providing roughness to the substrate surface. However, this has been problematic in that roughness at a substrate interface of the metallic pattern is a cause of poor high frequency properties when the metallic pattern is used as metallic wiring. Furthermore, in order to impart roughness to the substrate surface, the substrate surface must be treated with a strong acid such as chromic acid, which makes it necessary to perform complicated processes in order to obtain a metallic pattern which has excellent adhesion between the metal film and the substrate.

To address these problems, there has been proposed a method of improving adhesion between a substrate and a metal film by performing a plasma surface treatment, including introducing a polymerization initiating group to the substrate surface, and polymerizing a monomer through the polymerization initiating group, thereby generating a surface-grafted polymer having a polar group at the substrate surface, without roughening the surface of the substrate (see, for example, Non-Patent Document 1). However, since in this method the graft polymer has a polar group, absorption or desorption of moisture tends to occur according to changes in temperature or humidity, and as a result, the metal film or substrate tends to be deformed.

Moreover, when the metallic pattern obtained by this method is used as wiring of a metallic wiring board, the graft polymer having a polar group remains at the substrate interface, and is likely to retain moisture, ions or the like, raising concerns with respect to the level of influence of temperature or humidity, resistance to ion migration between wiring, and deformation of wiring. In particular, when the metallic pattern is to be applied to microwiring of printed wiring boards or the like, high insulating properties are required between wiring (metallic patterns), and further improvement of inter-wiring insulation reliability is demanded.

Photocurable resin compositions, due to their excellent characteristics, are used in not only materials for surface treatment applications as described above, but also in resist materials, materials for printing plates, coating materials, materials for rapid prototyping, and the like. A photocurable resin composition which is cured by radical polymerization is generally composed of a binder, a polyfunctional monomer and a photopolymerization initiator. In this case, a binder which has a polymerizable group is used in a technique for enhancing photocuring sensitivity.

Surface treatment materials, particularly those for forming plating films, are required to have a function of adsorbing a plating catalyst. In general, a carboxylic acid group, a hydroxyl group, an ether group and the like are known as groups capable of adsorbing a plating catalyst, but since these functional groups have high hydrophilicity and are prone to hold moisture, ions or the like, there are concerns that their use may result in an undesirable level of influence of temperature or humidity on a plating film, or deformation of the plating film.

In response to these concerns, a method of using a cyano group (nitrile group) as a functional group which provides both satisfactory adsorption of a plating catalyst and satisfactory hydrophobicity, is being considered.

As a polymer having the above cyano group and also a polymerizable group, products synthesized by anion polymerization of the following monomer are known (see, for example, Patent Document 1).

$CH_2=C(CN)COOR^1OOCCH=CH_2$ ($R^1$ is a lower alkylene group)

However, in this synthesis method, anionic polymerization proceeds even with a trace amount of moisture, and handling is difficult.

As another example, Patent Document 2 describes the following macromonomer.

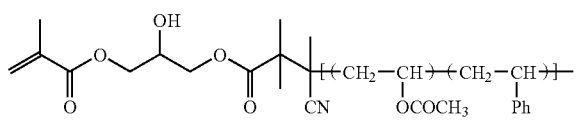

However, since the above macromonomer has few polymerizable groups in the polymer, curability (polymerizability) is low, and since the cyano group content in the polymer is low, there are concerns about adsorbability with respect to a plating catalyst.

Patent Document 1: Japanese Patent Application Laid-Open (JP-A) No. 11-106372

Patent Document 2: JP-A No. 2004-176025

Non-Patent Document 1: Advanced Materials, No. 20, pp. 1481-1494 (2000)

DISCLOSURE OF THE INVENTION

Problems to be Solved by the Invention

The present invention was achieved in consideration of the aforementioned defects of the prior art.

Namely, the invention provides a metal film-coated material which has a metal film with excellent adhesiveness and exhibits reduced fluctuation in adhesive force due to temperature change, as well as a process for producing the same.

The invention further provides a metallic pattern-bearing material which has excellent insulation reliability in an area where no metallic pattern is formed, as well as a process for producing the same.

The invention further provides a composition for polymer layer formation, capable of forming a polymer layer having low water absorbability, high hydrophobicity, and excellent adsorbability with respect to a plating catalyst or a precursor thereof.

The invention further provides a novel polymer which has sufficient adsorbability with respect to a metal of a plating catalyst or the like and has excellent polymerizability, a composition using the same, and a laminate using the same.

Means for Solving the Problems

In a first embodiment of a process for producing a metal film-coated material of the present invention, the process comprises:

(a1) forming, on a substrate, a polymer layer formed from a polymer which has a functional group capable of interacting with a plating catalyst or a precursor thereof, and is directly chemically bonded to the substrate;

(a2) providing a plating catalyst or a precursor thereof to the polymer layer; and (a3) performing plating with respect to the plating catalyst or a precursor thereof;

wherein the polymer layer satisfies all of the following requirements (1) to (4):

(1) the saturated water absorption coefficient of the polymer layer as measured in an environment of temperature of 25° C. and relative humidity of 50% is 0.01 to 10% by mass;

(2) the saturated water absorption coefficient of the polymer layer as measured in an environment of temperature of 25° C. and relative humidity of 95% is 0.05 to 20% by mass;

(3) the water absorption coefficient of the polymer layer as measured after 1 hour of immersion in boiling water at 100° C. is 0.1 to 30% by mass; and (4) the surface contact angle of the polymer layer as measured after dropping 5 μL of distilled water thereonto and leaving to stand for 15 seconds in an environment of temperature of 25° C. and relative humidity of 50% is 50 to 150 degrees.

Herein, it is preferable that the polymer layer satisfy all of the following requirements (1') to (4'):

(1') the saturated water absorption coefficient of the polymer layer as measured in an environment of temperature of 25° C. and relative humidity of 50% is 0.01 to 5% by mass;

(2') the saturated water absorption coefficient of the polymer layer as measured in an environment of temperature of 25° C. and relative humidity of 95% is 0.05 to 10% by mass;

(3') the water absorption coefficient of the polymer layer as measured after 1 hour immersion in boiling water at 100° C. is 0.1 to 20% by mass; and (4') the surface contact angle of the polymer layer as measured after dropping 5 μL of distilled water thereonto and leaving to stand for 15 seconds in an environment of temperature of 25° C. and relative humidity of 50% is 55 to 150 degrees.

Further, the process (a1) preferably comprises directly chemically bonding, to the substrate, a polymer which has a polymerizable group and a functional group capable of interacting with the plating catalyst or the precursor thereof.

In preferable exemplary embodiments, the process (a1) comprises:

(a1-1) producing, on a base material, a substrate which has a polymerization initiation layer containing a polymerization initiator or having a functional group capable of polymerization initiation; and (a1-2) directly chemically bonding, to the polymerization initiation layer, a polymer which has a polymerizable group and a functional group capable of interacting with the plating catalyst or the precursor thereof.

According to the invention, it is preferable that the polymer which has a polymerizable group and a functional group capable of interacting with the plating catalyst or the precursor thereof is a copolymer comprising a unit represented by the following Formula (1) and a unit represented by the following Formula (2).

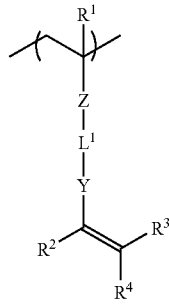

Formula (1)

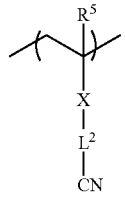

Formula (2)

In Formula (1) and Formula (2), $R^1$ to $R^5$ each independently represent a hydrogen atom or a substituted or unsubstituted alkyl group; X, Y and Z each independently represent a single bond, a substituted or unsubstituted divalent organic group, an ester group, an amide group or an ether group; and $L^1$ and $L^2$ each independently represent a substituted or unsubstituted divalent organic group.

In preferable exemplary embodiments, the polymer which has a polymerizable group and a functional group capable of interacting with the plating catalyst or the precursor thereof has a weight average molecular weight of 20,000 or more.

In a second embodiment of the process for producing a metal film-coated material of the invention, the process comprises:

(a1') forming, on a substrate, a polymer layer formed from a polymer which has a cyano group and is directly chemically bonded to the substrate;

(a2) providing a plating catalyst or a precursor thereof to the polymer layer; and (a3) performing plating with respect to the plating catalyst or a precursor thereof.

In preferable exemplary embodiments, the process (a1') comprises directly chemically bonding, to the substrate, a polymer which has a cyano group and a polymerizable group.

In preferable exemplary embodiments, the process (a1') comprises: (a1-1') producing, on a base material, a substrate which has a polymerization initiation layer containing a polymerization initiator or having a functional group capable of polymerization initiation; and (a1-2') directly chemically bonding, to the polymerization initiation layer, a polymer which has a cyano group and a polymerizable group.

In another preferable exemplary embodiment, the polymer which has a cyano group and a polymerizable group has a weight average molecular weight of 20,000 or more.

Herein, it is preferable that the process (a3) comprises an electroless plating process, and it is more preferable that an electroplating process is performed after the electroless plating process.

It is also preferable that the plating catalyst used in the process (a2) is palladium.

In a third embodiment of the process for producing a metal film-coated material of the invention, the process comprises:

(a1") forming, on each of both sides of a resin film, a polymer layer formed from a polymer which has a functional group capable of interacting with a plating catalyst or a precursor thereof and is directly chemically bonded to the substrate;

(a2) providing a plating catalyst or a precursor thereof to the polymer layer; and (a3) performing plating with respect to the plating catalyst or a precursor thereof, wherein the polymer layer satisfies all of the following requirements (1) to (4):

(1) the saturated water absorption coefficient of the polymer layer as measured in an environment of temperature of 25° C. and relative humidity of 50% is 0.01 to 10% by mass;

(2) the saturated water absorption coefficient of the polymer layer as measured in an environment of temperature of 25° C. and relative humidity of 95% is 0.05 to 20% by mass;

(3) the water absorption coefficient of the polymer layer as measured after 1 hour of immersion in boiling water at 100° C. is 0.1 to 30% by mass; and (4) the surface contact angle of the polymer layer as measured after dropping 5 μL of distilled water thereonto and leaving to stand for 15 seconds in an environment of temperature of 25° C. and relative humidity of 50% is 50 to 150 degrees.

Specifically, according to the third embodiment of the process for producing a metal film-coated material of the invention, a material having, on each of both sides of a resin film which is the substrate, a polymer layer can be obtained by the process (a1"), and a metal film-coated material having, on each of both sides thereof, a metal film can be obtained by the processes (a2) and (a3).

It is preferable that each of the processes (a1"), (a2) and (a3) is performed simultaneously on both sides of the resin film.

The metal film-coated material of the invention is a product obtainable by the process for producing a metal film-coated material of the invention.

In a first embodiment of a composition for polymer layer formation of the invention, the composition comprises: a polymer having a cyano group and a polymerizable group; and a solvent capable of dissolving the polymer, and the composition is used in the process for producing a metal film-coated material of the present invention.

In a second embodiment of the composition for polymer layer formation of the invention, the composition comprises: a polymer which has a polymerizable group and a structure represented by $-O-(CH_2)_n-O-$ (where n is an integer from 1 to 5); and a solvent capable of dissolving the polymer, and the composition is used in the process for producing a metal film-coated material of the invention.

The process for producing a metallic pattern-bearing material of the invention comprises (a4) pattern-wise etching the plating film of the metal film-coated material obtained by the process for producing a metal film-coated material of the invention.

Specifically, the process for producing a metallic pattern-bearing material is performed such that the processes (a1), (a2) and (a3) according to the process (a4) for producing a metal film-coated material are performed and then a process of pattern-wise etching the thus-formed plating film is performed.

The metallic pattern-bearing material of the invention is a product obtained by the process for producing a metallic pattern-bearing material of the invention.

The invention further provides a polymer comprising a unit represented by the following Formula (1) and a unit represented by the following Formula (2).

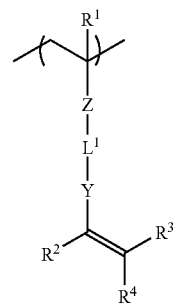

Formula (1)

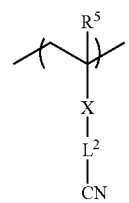

Formula (2)

In Formula (1) and Formula (2), $R^1$ to $R^5$ each independently represent a hydrogen atom or a substituted or unsubstituted alkyl group; X, Y and Z each independently represent a single bond, a substituted or unsubstituted divalent organic group, an ester group, an amide group or an ether group; and $L^1$ and $L^2$ each independently represent a substituted or unsubstituted divalent organic group.

In the polymer of the invention, it is preferable that the unit represented by Formula (1) is a unit represented by the following Formula (3).

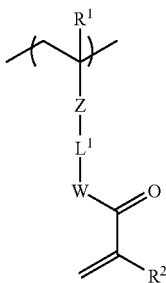

Formula (3)

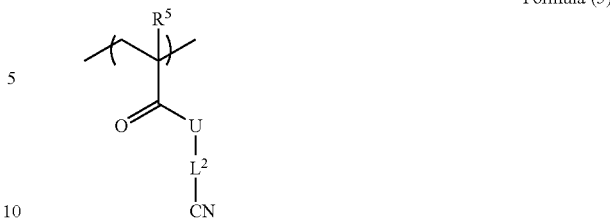

Formula (5)

In Formula (3), $R^1$ and $R^2$ each independently represent a hydrogen atom or a substituted or unsubstituted alkyl group; Z represents a single bond, a substituted or unsubstituted divalent organic group, an ester group, an amide group, or an ether group; W represents an oxygen atom or NR in which R represents a hydrogen atom or an alkyl group; and $L^1$ represents a substituted or unsubstituted divalent organic group.

Further, in the polymer of the invention, it is preferable that the unit represented by Formula (3) is a unit represented by the following Formula (4).

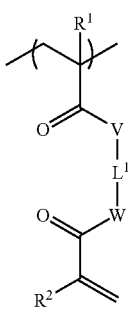

Formula (4)

In Formula (4), $R^1$ and $R^2$ each independently represent a hydrogen atom, or a substituted or unsubstituted alkyl group; V and W each independently represent an oxygen atom, or NR in which R represents a hydrogen atom or an alkyl group; and $L^1$ represents a substituted or unsubstituted divalent organic group.

In a preferable exemplary embodiment, W in Formula (4) is an oxygen atom.

It is also preferable that $L^1$ in Formula (1), Formula (3) or Formula (4) be a divalent organic group having a urethane bond or a urea bond.

Further, it is more preferable that $L^1$ in Formula (1), Formula (3) or Formula (4) is a divalent organic group having 1 to 9 carbon atoms in total.

In the polymer of the invention, it is preferable that the unit represented by Formula (2) is a unit represented by the following Formula (5).

In Formula (5), $R^5$ represents a hydrogen atom or a substituted or unsubstituted alkyl group; U represents an oxygen atom, or NR' in which R' represents a hydrogen atom or an alkyl group; and $L^2$ represents a substituted or unsubstituted divalent organic group.

It is preferable that the linkage site to a cyano group in $L^2$ in Formula (5) is a divalent organic group having a linear, branched or cyclic alkylene group, and it is more preferable that the divalent organic group has 1 to 10 carbon atoms in total.

It is also preferable that the linkage site to a cyano group in $L^2$ in Formula (5) is a divalent organic group having an aromatic group, and it is more preferable that the divalent organic group has 6 to 15 carbon atoms in total.

In preferable exemplary embodiments of the novel polymer of the invention, $L^1$ in Formula (1), Formula (3) or Formula (4) is a divalent organic group having a urethane bond.

It is also preferable that the novel polymer has a weight average molecular weight of 20,000 or more.

In regard to the novel polymer of the invention, the method of synthesizing a polymer in which $L^1$ in Formula (1), Formula (3) or Formula (4) is a divalent organic group having a urethane bond (method of synthesizing the polymer of the invention) will be described.

The method of synthesizing the polymer of the invention is characterized by comprising at least forming, in a solvent, a urethane bond in $L^1$ by adding an isocyanate group to an hydroxyl group, employing a polymer comprising the hydroxyl group in a side chain and a compound comprising the isocyanate group and a polymerizable group.

In the method of synthesizing the polymer of the invention, it is preferable that the polymer having a hydroxyl group in a side chain thereof is synthesized using a hydroxyl group-containing (meth)acrylate obtained by sequentially performing the following processes (1) to (4).

(1) dissolving, in water, a mixture containing the hydroxyl group-containing (meth)acrylate and a bifunctional acrylate which is byproduced upon synthesis of the hydroxyl group-containing (meth)acrylate;

(2) adding, to the obtained aqueous solution, a first organic solvent which is separable from water, and then separating a phase containing the first organic solvent and the bifunctional acrylate from the aqueous phase;

(3) dissolving, in the aqueous phase, a compound having higher water-solubility than that of the hydroxyl group-containing (meth)acrylate; and (4) adding a second organic solvent to the aqueous phase, extracting the hydroxyl group-containing (meth)acrylate, and then concentrating the extract.

In preferable exemplary embodiments, the isolated product containing the hydroxyl group-containing (meth)acrylate, which is obtained by sequentially performing the processes (1) to (4), contains the bifunctional acrylate in an amount in the range of 0% by mass to 0.10% by mass with respect to the total mass of the isolated product.

In the method of synthesizing the polymer of the invention, the SP value (calculated by the Okitsu method) of the solvent is preferably 20 to 23 MPa$^{1/2}$, the solvent is more preferably an ester solvent, and the solvent is even more preferably a diacetate solvent.

The invention further provides a composition containing the polymer of the invention and a ketone solvent or a nitrile solvent. It is particularly preferable that the concentration of the polymer in the composition is from 2% by mass to 50% by mass.

The invention further provides a laminate which is formed by applying the composition of the invention on a resin base material.

Effects of the Invention

According to the invention, a metal film-coated material having a metal film with excellent adhesiveness and less fluctuation due to temperature change in the adhesive force, and a process for producing the same can be provided.

According to the invention, a metallic pattern-bearing material having excellent insulation reliability in the area where no metallic pattern is formed, and a process for producing the same can be further provided.

According to the invention, a composition for forming a polymer layer, the polymer layer having low water absorbability and high hydrophobicity, and having excellent adsorbability to a plating catalyst or a precursor thereof, can be provided.

Further, according to the invention, a novel polymer having sufficient adsorbability to the metal of a plating catalyst or the like and has excellent polymerizability, a method of synthesizing the same, a composition using the novel polymer, and a laminate using the novel polymer, can be provided.

BEST MODE FOR CARRYING OUT THE INVENTION

Hereinafter, the present invention will be described in detail. Process for producing a metal film-coated material and process for producing metallic pattern-bearing material The first embodiment of the process for producing a metal-film-attached substrate of the invention includes: (a1) forming, on a substrate, a polymer layer formed from a polymer which has a functional group capable of interacting with a plating catalyst or a precursor thereof and is directly chemically bonded to the substrate; (a2) providing a plating catalyst or a precursor thereof to the polymer layer; and (a3) performing plating with respect to the plating catalyst or a precursor thereof, and the polymer layer satisfies all of the following requirements (1) to (4).

(1) the saturated water absorption coefficient of the polymer layer as measured in an environment of temperature of 25° C. and relative humidity of 50% is 0.01 to 10% by mass;

(2) the saturated water absorption coefficient of the polymer layer as measured in an environment of temperature of 25° C. and relative humidity of 95% is 0.05 to 20% by mass;

(3) the water absorption coefficient of the polymer layer as measured after 1 hour of immersion in boiling water at 100° C. is 0.1 to 30% by mass; and (4) the surface contact angle of the polymer layer as measured after dropping 5 μL of distilled water thereonto and leaving to stand for 15 seconds in an environment of temperature of 25° C. and relative humidity of 50% is 50 to 150 degrees.

The second embodiment of the process for producing a metal film-coated material of the invention includes: (a1') forming, on a substrate, a polymer layer formed from a polymer which has a cyano group and is directly chemically bonded to the substrate; (a2) providing a plating catalyst or a precursor thereof to the polymer layer; and (a3) performing plating with respect to the plating catalyst or a precursor thereof.

The process for producing a metallic pattern-bearing material of the invention includes (a4) pattern-wise etching the plating film of the metal film-coated material obtained by the process for producing a metal film-coated material of the invention.

Specifically, the process for producing a metallic pattern-bearing material is performed such that the processes either (a1) or (a1') and (a2) and (a3) according to the process for producing a metal film-coated material are performed, and then the process (a4) of pattern-wise etching the formed plating film is performed.

In the first embodiment of the process for producing a metal film-coated material and the process for producing a metallic pattern-bearing material of the invention, the polymer layer which satisfies the four requirements described above may have low water absorbability even under high temperature and high humidity, and may have high hydrophobicity. The polymer layer formed by the second embodiment of the process for producing a metal film-coated material of the invention may also have low water absorbability even under high temperature and high humidity, and may have high hydrophobicity.

Further, a metal film having excellent adhesiveness to a polymer layer may be obtained by providing a plating catalyst or the like to a polymer layer formed from a polymer which has been bound to the substrate, and then performing plating by using the plating catalyst or the like.

From these characteristics, the resulting metal film-coated material may have a metal film having excellent adhesion to the substrate, and the polymer layer may undergo little change in accordance with temperature change. Thus, the metal film-coated material may have less fluctuation due to temperature change in the adhesive force. Such a metal film-coated material may be applied to the process for producing a metallic pattern-bearing material or the like, which will be described below, to be used as a material for electrical wiring, and may also be used in electromagnetic wave shielding films, shielding materials and the like.

In the process for producing a metallic pattern-bearing material, even if there occurs a state in which this polymer layer is exposed at the area where no metallic pattern is formed, the exposed portion may not absorb water, and a decrease in the insulating properties attributable to that may not occur, by obtaining a metallic pattern by pattern-wise etching a plating film formed over the entire substrate surface in the process (a4). As a result thereof, the metallic pattern-bearing material formed in the process for producing a metallic pattern-bearing material of the invention may have excellent insulation reliability in the area where no metallic pattern is formed.

Hereinafter, each of the requirements of the requirements (1) to (4) in the first embodiment of the process for producing a metal film-coated material of the invention will be explained.

The saturated water absorption coefficient and the water absorption coefficient according to the requirements 1 to 3 may be measured by the following method.

First, a substrate is left to stand in a reduced pressure dryer to remove the moisture contained in the substrate. Then, when measurements for the requirements 1 and 2 are to be performed, the substrate is left to stand in a constant-temperature constant-humidity chamber set at desired temperature and humidity. When measurements for the requirement (3) are to be performed, the substrate is kept immersed in a water bath holding boiling water at 100° C. for 1 hour. Measurements of the saturated water absorption coefficient and the water absorption coefficient of the substrate can be performed by measuring consequent changes in the mass of the substrate. Here, the saturated water absorption coefficient in the requirements 1 and 2 represents the water absorption coefficient at a time point where the mass does not change even after 24 hours. Besides, the saturated water absorption coefficient and the water absorption coefficient of a laminate having a polymer layer formed on the substrate, for which the change in the mass is already known, can be measured by the same operation as those for the substrate. The water absorption coefficient of the polymer layer can be measured based on the difference between the water absorption coefficient of the substrate and the water absorption coefficient of the laminate. Alternatively, a single film of the polymer which forms the polymer layer may be produced by using a petri dish or the like, instead of providing the polymer layer on the substrate, and the resulting single polymer film may be directly subjected to the above described method to measure the water absorption coefficient of the polymer layer.

The contact angle according to the requirement (4) may be measured by the following method.

First, a laminate having a polymer layer formed on a substrate is provided, and is stored in a constant temperature-and-constant-humidity chamber set at temperature of 25° C. and relative humidity of 50%. 5 µL of distilled water is automatically dropped from a syringe onto the substrate (polymer layer) of the thus-stored sample in a measurement chamber adjusted to 25° C.-relative humidity of 50%, and images in the cross-sectional direction of the substrate are taken by a CCD camera as an input to personal computer, by using a contact angle meter for surface contact angle (trade name: OCA20, manufactured by DataPhysics Instruments GmbH). Then, the angle of contact of a water droplet on the substrate (polymer layer) is numerically calculated based on the analysis of the taken images.

Further, in a preferable exemplary embodiment according to the invention, the polymer layer obtained by the process (a1) satisfies all of the following requirements (1') to (4'):

(1') the saturated water absorption coefficient of the polymer layer as measured in an environment of temperature of 25° C. and relative humidity of 50% is 0.01 to 5% by mass;

(2') the saturated water absorption coefficient of the polymer layer as measured in an environment of temperature of 25° C. and relative humidity of 95% is 0.05 to 10% by mass;

(3') the water absorption coefficient of the polymer layer as measured after 1 hour immersion in boiling water at 100° C. is 0.1 to 20% by mass; and (4') the surface contact angle of the polymer layer as measured after dropping 5 µL of distilled water thereonto and leaving to stand for 15 seconds in an environment of temperature of 25° C. and relative humidity of 50% is 55 to 150 degrees.

Here, examples for obtaining a polymer layer which satisfies all of the above requirements (1) to (4) (preferably 1' to 4') include: a method of using a polymer having low water absorbability or a hydrophobic polymer (a polymer with low hydrophilicity) as the polymer configurating the polymer layer; a method of adding a substance which deteriorates water absorbability or a substance which is likely to enhance hydrophobicity to the polymer layer; and a method of forming a polymer layer and then immersing the polymer layer in a solution or the like which contains a reactive substance which can hydrophobilize the polymer molecules forming the polymer layer to allow the polymer to react with the reactive substance to hydrophobize the polymer. From the viewpoint of the ease of regulation of water absorbability or hydrophobicity, it is preferable to use the method of using a polymer having low water absorbability or a hydrophobic polymer (a polymer with low hydrophilicity) as the polymer which configures the polymer layer.

first, the respective processes of (a1) to (a3) according to the first embodiment of the process for producing a metal film-coated material of the invention, and the respective processes of (a1') to (a3) according to the second metal film-coated material of the invention will be described.

Process (a1)

In the process (a1) according to the first embodiment of the process for producing a metal film-coated material of the invention, there is formed, on a substrate, a polymer layer formed from a polymer which has a functional group capable of interacting with a plating catalyst or a precursor thereof (hereinafter, it may be simply referred to as "interactive group") and is directly chemically bonded to the substrate.

This polymer layer is required to satisfy all of the requirements (1) to (4).

The process (a1) is preferably performed by directly chemically bonding a polymer having a polymerizable group and a functional group capable of interacting with a plating catalyst or a precursor thereof, onto the substrate.

Further, in preferable exemplary embodiments, the process (a1) includes: (a1-1) producing, on a base material, a substrate which has a polymerization initiation layer containing a polymerization initiator or having a functional group capable of polymerization initiation; and (a1-2) directly chemically bonding, to the polymerization initiation layer, a polymer which has a polymerizable group and a functional group capable of interacting with the plating catalyst or the precursor thereof.

The process (a1-2) is preferably a process of directly chemically bonding the polymer having a polymerizable group and an interactive group with the polymerization initiation layer to the entire substrate surface (the entire surface of the polymerization initiation layer) by contacting the polymer with the layer and then imparting energy.

Surface Grafting

The formation of a polymer layer on a substrate may employ a technique which is generally called a surface graft polymerization. Graft polymerization is a method of synthesizing a graft polymer by providing an active species on a macromolecular compound chain so that a monomer, which can be initiated to be polymerized with the macromolecular compound chain by the active species, is polymerized with the macromolecular compound chain. Particularly, in the case where the macromolecular compound providing an active species forms a solid surface, the method is referred to as surface graft polymerization.

Any of known methods described in the literature may be used as the surface graft polymerization method applicable to the invention. For example, photograft polymerization methods and plasma-induced graft polymerization methods are described as the surface graft polymerization method, in New Polymer Experimentology, Vol. 10, edited by the Society of Polymer Science, Japan, published by Kyoritsu Shuppan Co., Ltd., p. 135 (1994). Further, radiation-induced graft polymerization methods using y-ray, electron beam or the like are described in the Handbook of Adsorption Technology, NTS Co., Ltd., reviewed by Takeuchi, published in February 1999, p. 203 and p. 695.

Specific methodological examples of the photograft polymerization method include the methods described in JP-A No. 63-92658, JP-A No. 10-296895 and JP-A No. 11-119413.

In addition to the surface graft polymerization method, examples of the method for forming the polymer layer in the process for producing a metal film-coated material of the invention further include a method of providing a reactive functional group such as a trialkoxysilyl group, an isocyanate group, an amino group, a hydroxyl group or a carboxyl group, to a trminal of a macromolecular compound chain, and binding the functional group to a functional group which resides on the substrate surface by coupling reaction.

Among these methods, from the viewpoint of producing a larger amount and/or number of graft polymers, it is preferable to form the polymer layer by a photograft polymerization method, and it is particularly preferable to form the polymer layer by a photograft polymerization method utilizing UV light.

Substrate

The "substrate" according to the process for producing a metal film-coated material of the invention is a substrate which has a surface with a function to form a state in which a polymer having a functional group which is capable of interacting with a plating catalyst or a precursor thereof is directly chemically bonded to the surface. A base material itself may have such surface characteristics and constitute the substrate, or a separate intermediate layer (for example, a polymerization initiation layer described below) having such surface characteristics may be provided on a base material to configure the substrate.

Base Material and Substrate

The base material used in the invention is preferably a dimensionally stable plate-like object, and examples thereof include paper, paper laminated with plastics (for example, polyethylene, polypropylene, polystyrene and the like), metal plates (for example, aluminum, zinc, copper and the like), plastic films (for example, cellulose diacetate, cellulose triacetate, cellulose propionate, cellulose butyrate, cellulose acetate, nitrocellulose, polyethylene terephthalate, polyethylene, polystyrene, polypropylene, polycarbonates, polyvinylacetal, polyimides, epoxies, bismaleimide resins, polyphenylene oxide, liquid crystalline polymers, polytetrafluoroethylene and the like), paper or plastic films laminated or deposited with metals such as any of the above-described ones, and the like. Preferable examples of the base material to be used in the invention include an epoxy resin and a polyimide resin.

In the case where the surface of the base material has a function to form a state in which a polymer having a functional group which is capable of interacting with a plating catalyst or a precursor thereof can be directly chemically bonded to the surface, the base material itself may be used as the substrate.

Examples of the substrate used the invention further include a base material containing a polyimide which has a polymerization initiation site in the skeleton, as described in paragraphs [0028] to [0088] of JP-A No. 2005-281350.

The metallic pattern-bearing material obtained by the process for producing a metallic pattern-bearing material of the invention may be applied to semiconductor packages, various electrical wiring boards, and the like. In the case of using the material in such applications, it is preferable to use a substrate containing an insulating resin, which will be described below. Specifically, it is preferable to use a substrate formed from an insulating resin or a substrate having a layer which is provided on a base material and formed from an insulating resin.

Any known insulating resin composition can be used for obtaining a substrate formed from an insulating resin or a layer formed from an insulating resin. Various additives may be used in the insulating resin composition in addition to the resin which is the main component according to the purposes. Examples of such measures include adding a polyfunctional acrylate monomer for the purpose of increasing the strength of the insulating layer, adding inorganic or organic particles for the purpose of increasing the strength of the insulating layer and improving electrical properties, and the like.

Here, the "insulating resin" herein means a resin having insulating properties to the extent that the resin may be used in known insulating films or insulating layers. Even a resin, which is not a material having perfect insulating property, can be used in the invention as long as the insulating property thereof meets purposes thereof.

The insulating resin may be a thermosetting resin, a thermoplastic resin, or a mixture thereof. Specific examples of the thermosetting resin include epoxy resins, phenolic resins, polyimide resins, polyester resins, bismaleimide resins, polyolefin resins, isocyanate resins, and the like.

Examples of the epoxy resins include cresol novolac epoxy resins, bisphenol A epoxy resins, bisphenol F epoxy resins, phenol novolac epoxy resins, alkylphenol novolac epoxy resins, biphenol F epoxy resins, naphthalene epoxy resins, dicyclopentadiene epoxy resins, epoxides of condensates of a phenol and an aromatic aldehyde having a phenolic hydroxyl group, triglycidyl isocyanurate, alicyclic epoxy resins, and the like. These may be used alone, or may be used in combination of two or more species thereof. The use of the epoxy resins may result in a product having excellent heat resistance and the like.

Examples of the polyolefin resins include polyethylene, polystyrene, polypropylene, polyisobutylene, polybutadiene, polyisoprene, cycloolefin resins, copolymers of any of these resins, and the like.

Examples of the thermoplastic resins include phenoxy resins, polyethersulfone, polysulfone, polyphenylenesulfone, polyphenylene sulfide, polyphenyl ether, polyetherimide, and the like.

Examples of the thermoplastic resins further include 1,2-bis(vinylphenylene)ethane resin, or a modified resin of the 1,2-bis(vinylphenylene)ethane resin and a polyphenylene ether resin (described in Satoru Amou, et al., Journal of Applied Polymer Science, Vol. 92, 1252-1258 (2004)), liquid crystalline polymers (specifically, Vecstar manufactured by Kuraray Co., Ltd., and the like), fluororesins (PTFE), and the like.

The thermoplastic resins and the thermosetting resins may be respectively used alone, or may also be used in combination of two or more species thereof. The combinational use can be implemented for the purpose of making up the defects of the individual resins and exhibiting more excellent effects. For example, since thermoplastic resins such as polyphenylene ether (PPE) may have low resistance to heat, thermoplastic resins can be made into an alloy with thermosetting resins or the like. For example, a product obtained by alloying PPE with epoxy, a product obtained by alloying PPE with triallyl isocyanate, or a product obtained by alloying a PPE resin having a polymerizable functional group introduced thereinto with another thermosetting resin can be used. While cyanate esters have the most excellent dielectric properties among the thermosetting resins, cyanate esters are used alone only in few cases. Cyanate esters are typically used by being modifies with epoxy resins, maleimide resins, thermoplastic resins or the like. Details of these are described in "Electronic Technology," No. 2002/9, p. 35. Further, a product containing an epoxy resin and/or a phenolic resin as the thermosetting resin and containing a phenoxy resin and/or polyethersulfone (PES) as the thermoplastic resin can be used to improve the dielectric properties.

The insulating resin composition may contain a compound such as one having a polymerizable double bond, which is preferably a polyfunctional compound, in order to allow crosslinking to proceed. Specific examples thereof include an acrylate and a methacrylate compound. Specific examples of the compound having a polymerizable double bond further include a resin obtained by subjecting a part of a thermosetting resin or a thermoplastic resin such as an epoxy resin, a phenolic resin, a polyimide resin, a polyolefin resin, a fluororesin or the like to a (meth)acrylation reaction by using methacrylic acid, acrylic acid or the like.

Examples of the insulating resin composition used in the invention further include composites of a resin and another component (composite materials) which can be employed in view of reinforcing the properties such as mechanical strength, heat resistance, weather resistance, flame retardancy, water resistance and electrical properties, of resin films. Examples of the material that may be used for producing composite materials include paper, glass fiber, silica particles, phenolic resins, polyimide resins, bismaleimide triazine resins, fluororesins, polyphenylene oxide resins, or the like.

The insulating resin composition may contain, if necessary, one or two or more fillers that can be used in general resin materials for wiring boards and are compounded therewith. Examples thereof include inorganic fillers such as silica, alumina, clay, talc, aluminum hydroxide and calcium carbonate, and organic fillers such as hardened epoxy resins, crosslinked benzoguanamine resins and crosslinked acrylic polymers. Among them, it is preferable to use silica as the filler.

One or two or more of various additives, including a colorant, a flame retardant, a tackifier, a silane coupling agent, an antioxidant, an ultraviolet absorbent, and the like, may also be added to the insulating resin composition according to necessity.

When these materials are added to the insulating resin composition, it is preferable that a total amount all of the materials to be added is in the range of 1 to 200% by mass, and more preferably in the range of 10 to 80% by mass, based on the amount of the resin. If the amount of addition is less than 1% by mass, the effects of reinforcing the aforementioned properties may not be obtained, while if the amount of addition is more than 200% by mass, the properties inherent to the resin, such as strength, may be deteriorated.

Specific preferable examples of the substrate to be used in such applications include a substrate formed from an insulating resin having a dielectric constant (relative dielectric constant) at 1 GHz of 3.5 or less and a substrate having, on a base material, a layer formed from the insulating resin. Specific preferable examples further include a substrate formed from an insulating resin having a dielectric loss tangent at 1 GHz of 0.01 or less, and a substrate having, on a base material, a layer formed from the insulating resin.

The dielectric constant and the dielectric loss tangent of an insulating resin may be measured by standard methods. For example, the properties may be measured by using a cavity resonator perturbation method (for example, $\varepsilon r$ for ultrathin sheet, tan $\delta$ measuring system, manufactured by Keycom Corp.).

As described above, it can be useful in the invention to select an insulating resin material with considering dielectric constant or dielectric loss tangent. Examples of the insulating resin having a dielectric constant of 3.5 or less and a dielectric loss tangent of 0.01 or less include liquid crystalline polymers, polyimide resins, fluororesins, polyphenylene ether resins, cyanate ester resins, bis(bisphenylene)ethane resins, and modified resins of these.

The substrate to be used in the invention preferably has a surface roughness of 500 nm or less, more preferably 100 nm or less, even more preferably 50 nm or less, and particularly preferably 20 nm or less, in view of the applications in semiconductor packages, various electrical wiring boards and the like. As the surface roughness of the substrate (, which means the surface roughness of an intermediate layer or a polymerization initiation layer in the case where the intermediate layer or the polymerization initiation layer is provided,) is smaller, the electric loss at the time of high frequency transmission becomes smaller when the resulting metallic pattern-bearing material is applied to wiring or the like, which is preferable.

According to the invention, when the substrate is a plate-shaped object such as a resin film (plastic film), both sides thereof can be subjected to the process (a1) to form polymer layers on both sides of the resin film (process (a1")) according to the third embodiment of the process for producing a metal film-coated material of the invention).

When polymer layers have been formed on both sides of the resin film (substrate) as such, the process (a2) and process (a3), that will be described below, may be further performed to form a metal film-coated material having metal films provided on both sides thereof.

According to the invention, in the case of utilizing a surface graft polymerization method which provides an active species on the substrate surface and produces a graft polymer while taking the active species as a starting point, it is preferable, upon the production of a graft polymer, to use a substrate which has a polymerization initiation layer which is formed on a base material and either contains a polymerization initiator or has a functional group capable of polymerization initiation. By using the substrate, active sites may be efficiently generated, and a larger amount and/or number of graft polymer may be produced.

Hereinafter, the polymerization initiator layer used in the invention will be discussed. When the base material is a plate-shaped object, the polymerization layer may be formed on both sides thereof.

Polymerization Initiation Layer

Examples of the polymerization initiation layer used in the invention include a layer containing a macromolecular compound and a polymerization initiator; a layer containing a polymerizable compound and a polymerization initiator; and a layer having a functional group capable of polymerization initiation.

The polymerization initiation layer according to the invention may be formed by dissolving necessary components in a solvent capable of dissolving them, providing a film on the surface of a base material by methods such as coating, and curing the film by heating or photoirradiation.

Any compound may be used as the compound to be used in the polymerization initiation layer in the invention without particular limitation, as long as it is a compound which has good adhesion to the base material and generates active species by application with energy such as actinic ray irradiation. Specific examples thereof include a mixture of a polymerization initiator and either a hydrophobic polymer having a polyfunctional monomer or a polymerizable group in the molecule may be used.

Specific examples of such hydrophobic polymer having a polymerizable group in the molecule include: diene homopolymers such as polybutadiene, polyisoprene and polypentadiene, homopolymers of allyl group-containing monomers such as allyl (meth)acrylate and 2-allyloxyethyl methacrylate;

bicomponent or multicomponent copolymers of styrene, (meth)acrylic acid ester, (meth)acrylonitrile and the like, containing a diene monomer such as butadiene, isoprene or pentadiene, or an allyl group-containing monomer as the constituent unit;

linear macromolecules or three-dimensional macromolecules having carbon-carbon double bonds in the molecules, such as unsaturated polyesters, unsaturated polyepoxides, unsaturated polyamides, unsaturated polyacrylics, and high density polyethylene; and the like.

Herein, in the case of referring to both or any one of acryl and methacryl, the expression of "(meth)acryl" may be employed.

The content of these polymerizable compounds in the polymerizable layer is preferably in the range of 10 to 100% by mass, and particularly preferably 10 to 80% by mass, in terms of the solid content in the polymerizable layer.

The polymerization initiation layer contains a polymerization initiator for exhibiting the polymerization initiation ability by being provided with energy. A known thermal polymerization initiator, photopolymerization initiator or the like, which may manifest the polymerization initiation ability by providing predetermined energy, for example, irradiation of actinic radiation, heating, irradiation of electron beam, or the like, may be appropriately selected and used as the polymerization initiator used herein according to the purpose. Among them, it is preferable to use a photopolymerization initiator, since photopolymerization can be preferably performed from the viewpoint of suitability to production.

The photopolymerization initiator is not particularly limited as long as it is active to the actinic ray irradiated thereto, and allows surface graft polymerization to occur in the polymerization initiation layer containing the initiator, and examples thereof include a radical polymerization initiator, an anionic polymerization initiator, and a cationic polymerization initiator. From the viewpoints of easiness in handling property and reactivity, a radical polymerization initiator and a cationic polymerization initiator are preferable, and a radical polymerization initiator can be more preferable.

Specific examples of such photopolymerization initiator include: acetophenones such as p-tert-butyltrichloroacetophenone and 2,2'-diethoxyacetophenone, or 2-hydroxy-2-methyl-1-phenylpropan-1-one; ketones such as benzophenone, 4,4'-bisdimethylaminobenzophenone, 2-chlorothioxanthone, 2-methylthioxanthone, 2-ethylthioxanthone or 2-isopropylthioxanthone; benzoin ethers such as benzoin, benzoin methyl ether, benzoin isopropyl ether or benzoin isobutyl ether; benzyl ketals such as benzyl dimethyl ketal or hydroxycyclohexyl phenyl ketone; sulfonium salts such as triphenylsulfonium chloride or triphenylsulfonium pentafluorophosphate, iodonium salts such as diphenyliodonium chloride or diphenyliodonium sulfate; and the like.

The content of the polymerization initiator in the polymerization initiation layer is preferably in the range of 0.1 to 70% by mass, and particularly preferably in the range of 1 to 40% by mass, in terms of the solid content in the polymerization initiation layer.

The solvent that may be used when the polymerizable compound and the polymerization initiator are applied is not particularly limited as long as it dissolves components of these. From the viewpoints of the ease of drying and suitability to operation, a solvent having a boiling temperature which is not excessively high is preferable, and specifically, a solvent having a boiling temperature of about 40° C. to about 150° C. may be selected.

Specific examples of the solvent include acetone, methyl ethyl ketone, cyclohexane, ethyl acetate, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, methanol, ethanol, 1-methoxy-2-propanol, 3-methoxypropanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, and 3-methoxypropyl acetate.

The solvents may be used alone or as a mixture of any of these. The concentration of solid components in the coating solution is suitably 2 to 50% by mass.

The amount of coating of the polymerization initiation layer in the case of forming the polymerization initiation layer on a base material is, from the viewpoints of sufficiently exhibiting the polymerization initiation ability and preventing delamination by maintaining the film formability, preferably in the range of 0.1 to 20 g/m², more preferably 0.1 to 15 g/m², and even more preferably 0.1 to 2 g/m², in terms of the mass after drying.

According to the invention, the polymerization initiation layer is formed by disposing the composition for polymerization initiation layer formation on a base material through coating or the like, and removing the solvent to form a film, as described above. At this point, it is preferable to cure the film by performing heating and/or photoirradiation. In particular, it is preferable to cure the film in advance by drying with heat and then photoirradiating, since this process may enable to cure the polymerizable compound to some extent in advance, so as to effectively prevent a situation in which the polymerization initiation layer as a whole is detached from the base material after the generation of the graft polymer on the polymerization initiation layer.

The heating temperature and time may be selected to provide conditions under which the coating solvent may be sufficiently dried. In view of suitability to production, a temperature of 100° C. or less and a drying time of 30 minutes or less are preferable, and it is more preferable to select heating conditions in which a drying temperature is in the range of 40 to 80° C. and a drying time is in the range of 10 minutes or less.

The photoirradiation which can be performed after heating and drying as desired may be performed by using a light source which is used in the reaction for graft polymer production that will be described below. From the viewpoint of avoiding inhibition of the generation of the active sites in the polymerization initiation layer, which are generated by imparting energy, and the production of graft polymers in the subsequently performed graft polymer production process, it is preferable to perform the photoirradiation to the extent that the polymerizable compound is not completely consumed even if the polymerization initiator present in the polymerization initiation layer causes radical polymerization of the polymerizable compound upon the curing. The period for photoirradiation may vary depending on the intensity of the light source, while it is in general preferably within 30 minutes. The criteria for such preliminarily curing may be that the film residual ratio of the preliminarily cured resultant which is further subjected to solvent washing is 80% or less and the residual ratio of the initiator after the preliminarily curing is 1% or more.

In addition to the polymerization initiation layer containing the polymerizable compound and the polymerization initiator, preferable examples of the polymerization initiation layer further include one which utilizes a polymer having a polymerization initiating group in the side chain as a pendant group as described in JP-A No. 2004-161995. This polymer, which is hereinafter referred to as polymerization initiating polymer, is specifically a polymer which has a functional group having polymerization initiation ability (polymerization initiating group) and a crosslinkable group in the side chain, and this polymer allows to form a polymerization initiation layer containing polymer chains, which have a polymerization initiating group bound to the polymer chains and are fixed by a crosslinking reaction.

The polymerization initiation layer thus formed is also suitable as the polymerization initiation layer of the present application.

Examples of the polymerization initiating polymer used herein include the polymer described in paragraphs [0011] to [0158] of JP-A No. 2004-161995. Particularly preferable specific examples of the polymerization initiating polymer include the followings.
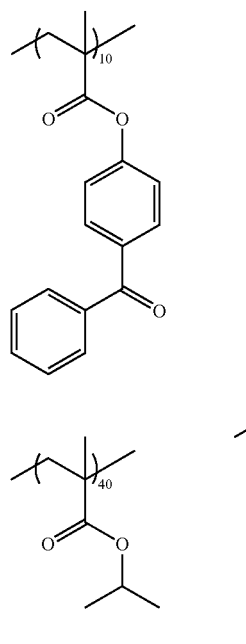
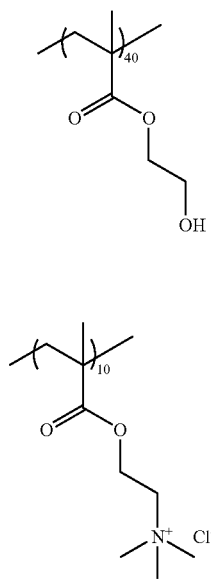
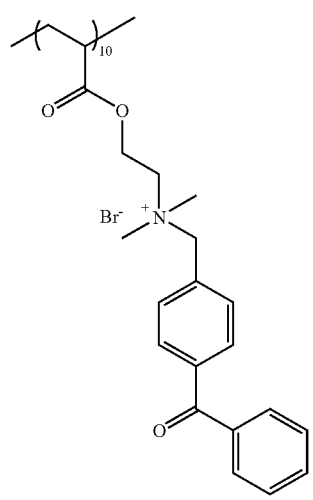
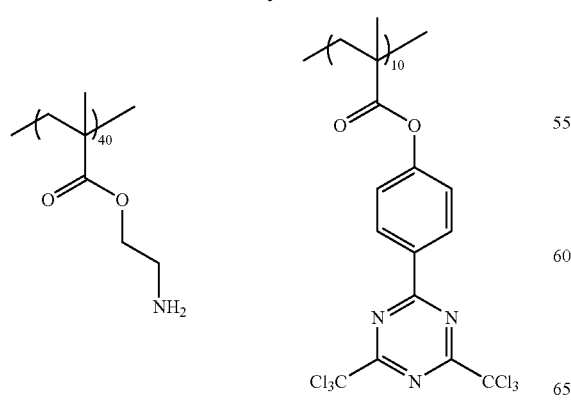
-continued
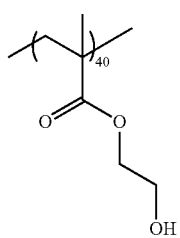
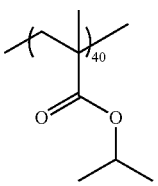
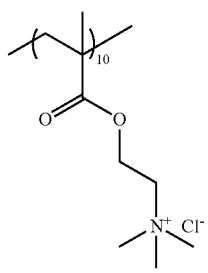
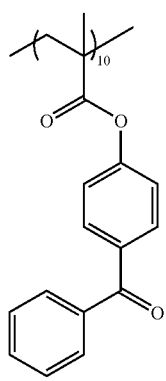
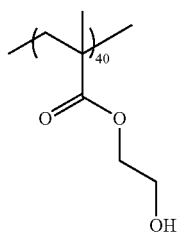
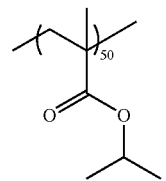
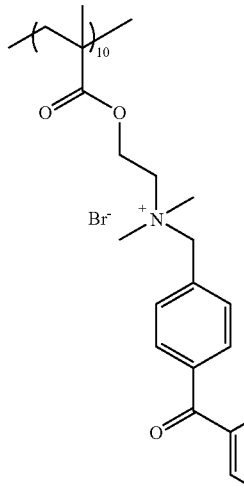
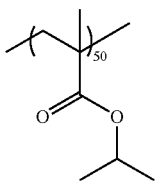

-continued

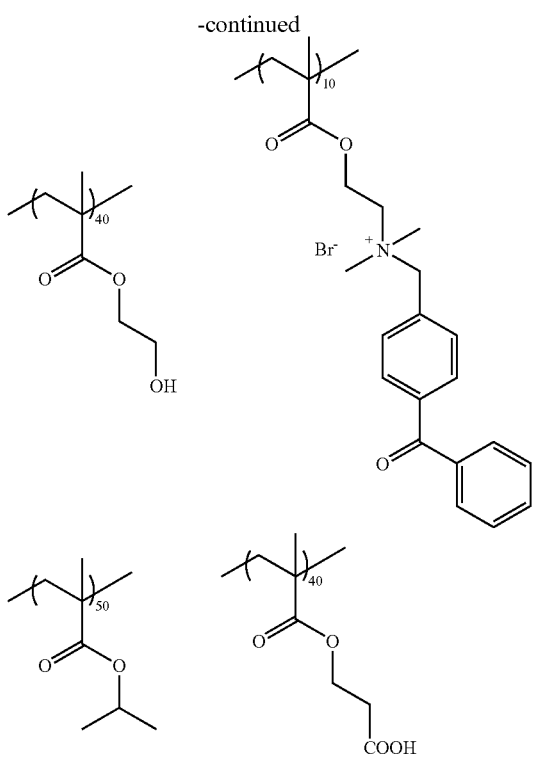

Film Formation of Polymerization Initiation Layer

The polymerization initiating polymer can be formed into a film of the polymerization initiation layer in the invention by dissolving the polymerization initiating polymer in an appropriate solvent to prepare a coating solution, disposing the coating solution on a base material by coating or the like, removing the solvent, and allowing a crosslinking reaction to proceed. That is, when the crosslinking reaction proceeds, the polymerization initiating polymer is fixed. Examples of a method for implementing the fixation based on this crosslinking reaction include a method of using a self-condensation reaction of the polymerization initiating polymer and a method of using a crosslinking agent in combination. It is preferable to use a crosslinking agent. Examples of the method of using a self-condensation reaction of the polymerization initiating polymer include a method which relies on the property of a crosslinkable group to proceed self-condensation reaction by being applied with heat in the case where the crosslinkable group is —NCO. The progress of the self-condensation reaction may lead to formation of a crosslinking structure.

Examples of the crosslinking agent used in the method including use of a crosslinking agent in combination include conventionally known agents such as those published in the "Handbook of Crosslinking Agents," edited by Yamashita Shinji.

Examples of preferable combinations of the crosslinkable group in the polymerization initiating polymer and the crosslinking agent, which are expressed in the order of (crosslinkable group, crosslinking agent), include: (—COOH, polyvalent amine); (—COOH, polyvalent aziridine); (—COOH, polyvalent isocyanate); (—COOH, polyvalent epoxy); (—NH$_2$, polyvalent isocyanate); (—NH$_2$, aldehydes); (—NCO, polyvalent amine); (—NCO, polyvalent isocyanate); (—NCO, polyhydric alcohol); (—NCO, polyvalent epoxy); (—OH, polyhydric alcohol); (—OH, polyvalent halogenated compound); (—OH, polyvalent amine); and (—OH, acid anhydride). Examples of the combination which is more preferable from the viewpoint of enabling forming crosslinks with high strength by generation of urethane bonds after crosslinking, which are expressed in the order of ((functional group, crosslinking agent), include: (—OH, polyvalent isocyanate).

Specific examples of the crosslinking agent according to the invention include the compounds having the structures shown below.

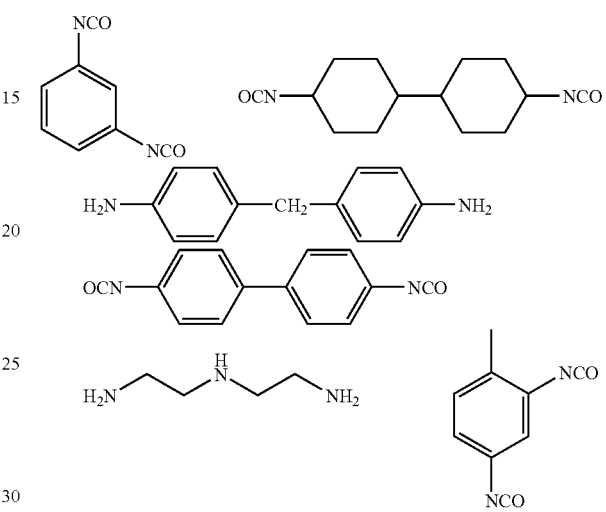

Such a crosslinking agent can be added to the coating solution containing the polymerization initiating polymer during the formation of the polymerization initiation layer. Thereafter, a crosslinking reaction is promoted by heat applied during the heating for drying of the film, so that a firm crosslinked structure can be formed. More specifically, the crosslinking reaction proceeds based on the dehydration reaction shown in the following ex1., or the addition reaction shown in the following ex2., to form a crosslinked structure. The temperature condition of these reactions is preferably 50° C. or higher and 300° C. or lower, and more preferably 80° C. or higher and 200° C. or lower.

ex1.

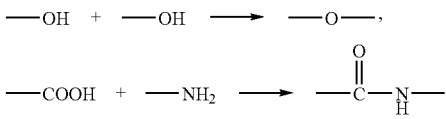

ex2.

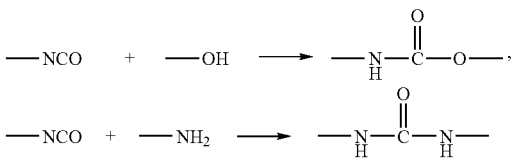

The addition amount of the crosslinking agent in the coating solution may vary with the amount of the crosslinkable group introduced in the polymerization initiating polymer, while from the viewpoints of the extent of crosslinking and the influence of the remaining of unreacted crosslinking components on the polymerization reaction, it is usually preferably in the range of 0.01 to 50 equivalents, more preferably in the range of 0.01 to 10 equivalents, and even more preferably in the range of 0.5 to 3 equivalents, relative to the number of moles of the crosslinkable group.

The solvent used in coating the polymerization initiation layer is not particularly limited as long as the polymerization initiating polymer is dissolved therein. From the viewpoints of the ease of drying and workability, a solvent having a boiling temperature which is not excessively high is preferable, and specifically, a solvent having a boiling temperature of about 40° C. to 150° C. may be selected.

Specific examples thereof include acetone, methyl ethyl ketone, cyclohexane, ethyl acetate, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, methanol, ethanol, 1-methoxy-2-propanol, 3-methoxypropanol, diethylene glycol monomethyl ether, diethylelne glycol monoethyl ether, diethylene glycol dimethyl ether, diethylene glycol diethyl ether, propylene glycol monomethyl ether acetate, propylene glycol monoethyl ether acetate, and 3-methoxypropyl acetate.

These solvents may be used alone or as mixtures. The concentration of solid components in the coating solution is suitably 2 to 50% by mass.

The amount of coating of the polymerization initiation layer which is formed by using the polymerization initiating polymer is preferably 0.1 to 20 g/m$^2$, and more preferably 1 to 15 g/m$^2$, in terms of the mass after drying, from the viewpoints of the initiation ability of surface graft polymerization or film forming property.

In the case that a substrate which has, on a base material, a layer formed from an insulating resin such as previously described, is used in the invention, it is preferable to have a known polymerization initiator be contained in this layer formed from the insulating resin so as to form an insulative polymerization initiation layer. The polymerization initiator to be contained in the insulative polymerization initiation layer is not particularly limited, and example thereof include the above-described thermal polymerization initiators, photopolymerization initiators (radical polymerization initiators, anionic polymerization initiators, and cationic polymerization initiators), the macromolecular compounds having an active carbonyl group in the side chain as described in JP-A No. 9-77891 and JP-A No. 10-45927, a polymer having a crosslinkable group and a functional group with polymerization initiation ability in the side chain (polymerization initiating polymer), and the like.

The amount of the polymerization initiator to be contained in the insulative polymerization initiation layer is generally preferably about 0.1 to 50% by mass, and more preferably about 1.0 to 30.0% by mass, based on the solid components in the insulating layer.

Production of Graft Polymer

In an exemplary embodiment of the production of a graft polymer in the process (a1), as described above, a method of utilizing the coupling reaction between the functional group present at the substrate surface and the reactive functional group which resides in the macromolecular compound at a terminal of its main chain or in its side chain, or a photograft polymerization method may be used.

In a preferable exemplary embodiment of the invention, a substrate having a polymerization initiation layer formed on a base material is used, and a polymer layer formed from a polymer which has a functional group capable of interacting with a plating catalyst or a precursor thereof (interactive group), and is directly chemically bonded to the polymerization initiation layer, is formed on the polymerization initiation layer [process (a1-2)]. In a more preferable exemplary embodiment, a polymer having a polymerizable group and an interactive group is contacted with the polymerization initiation layer, and then energy is imparted so that the polymer is directly chemically bonded to the entire surface of the substrate (entire surface of the polymerization initiation layer). That is, while a composition containing a compound having a polymerizable group and an interactive group is contacted with the surface of the polymerization initiation layer, the compound is directly bound to the surface of the polymerization initiation layer by the active species generated at the surface.

While the contacting may be performed by immersing a substrate having a polymerization initiation layer formed thereon into a liquid composition containing a compound having a polymerizable group and an interactive group (composition for polymer layer formation of the invention), it is preferable, from the viewpoint of handlability or production efficiency, to form a layer formed from the composition containing a compound having a polymerizable group and an interactive group (composition for polymer layer formation of the invention) on the substrate surface (surface of the polymerization initiation layer) by a coating method, as will be described below.

Here, similarly to the process (a1″) according to the third embodiment of the process for producing a metal film-coated material of the invention, even in the case of forming polymer layers on both sides of a resin film, it is preferable to use a coating method from the viewpoint that it is easy to form polymer layers simultaneously on both sides.

The compound having a polymerizable group and an interactive group used in the invention, which is used in the case of producing the graft polymer by the surface graft polymerization method, will be described.

As for the compound having a polymerizable group and an interactive group used in the invention, it is preferable to use a compound which has a polymerizable group and an interactive group, and also has low water absorbability and high hydrophobicity, so that the polymer layer formed from the graft polymer produced therefrom satisfies all of the requirements (1) to (4).

The interactive group in the compound is preferably a non-dissociative functional group. The "non-dissociative functional group" herein means a functional group which does not produce protons through dissociation.

Such functional group has a function to interact with a plating catalyst or a precursor thereof, while it does not have such high water absorbability and hydrophilicity as those of a dissociative polar group (hydrophilic group). Therefore, a polymer layer formed from a graft polymer having this functional group is able to satisfy the requirements (1) to (4).

The polymerizable group used in the invention is a functional group which works to bind the compounds having a polymerizable group and an interactive group, or to bind the compound having a polymerizable group and an interactive group with the substrate, upon impartation of energy. Specific examples thereof include a vinyl group, a vinyloxy group, an allyl group, an acryloyl group, a methacryloyl group, an oxetane group, an epoxy group, an isocyanate group, a functional group containing active hydrogen, the active group of an azo compound, and the like.

As for the interactive group according to the invention, specifically, a group capable of coordinating with a metal ion, a nitrogen-containing functional group, a sulfur-containing functional group, an oxygen-containing functional group, and the like are preferable, and specifically, nitrogen-containing functional groups such as an imide group, a pyridine group, a tertiary amino group, an ammonium group, a pyrrolidone group, an amidino group, a group containing a triazine ring structure, a group containing an isocyanuric structure, a nitro group, a nitroso group, an azo group, a diazo group, an azide group, a cyano group and a cyanate (R—O—CN) group; oxygen-containing functional groups such as an ether group, a carbonyl group, an ester group, a group containing an N-oxide structure, a group containing an S-oxide structure and a group containing an N-hydroxy structure; sulfur-containing functional groups such as a thioether group, a thioxy group, a sulfoxide group, a sulfone group, a sulfite group, a group containing a sulfoximine structure, a group containing a sulfoxonium structure, and a group containing a sulfonic acid ester structure; phosphorus-containing functional groups such as a phosphine group; a group containing a halogen atom such as chlorine or bromine; unsaturated ethylene groups; and the like may be mentioned. In an exemplary embodiment showing non-dissociativeness based on adjacent atoms or atomic groups, an imidazole group, a urea group or a thiourea group may also be used.

Among them, an ether group (more specifically, a structure represented by —O—$(CH_2)_n$—O— (wherein n is an integer from 1 to 5)) or a cyano group is particularly preferable from the viewpoint of having high polarity and high adsorption capacity to a plating catalyst or the like, and a cyano group may be mentioned as the most preferable group.

In general, as the polarity increases, the water absorption coefficient tends to increase. However, since cyano groups interact with each other such as to cancel the polarity of each other in the polymer layer, which may result in making the film be dense and decreasing the polarity of the polymer layer, so that the water absorbability can be lowered. Further, in the process (a2) that will be described below, when the catalyst is adsorbed in a good solvent for the polymer layer, the cyano group becomes solvated, and the interaction between cyano groups is canceled, and the cyano groups become to be able to interact with a plating catalyst. Due to the above reasons, a polymer layer having a cyano group is preferable from the viewpoint of exhibiting contradictory performances of smaller hygroscopicity and favorable interactivity with a plating catalyst.

The interactive group used in the invention is more preferably an alkylcyano group. An aromatic ring in an aromatic cyano group may withdraw electrons to result in lowering of the donating property of unpaired electrons, which are important to provide the adsorbability of the interactive group to a plating catalyst or the like. In contrast, since an alkylcyano group does not have such an aromatic ring bound thereto, the alkylcyano group is preferable in view of the adsorbability to a plating catalyst or the like.

In the invention, the compound having a polymerizable group and an interactive group may be in any form of a monomer, a macromonomer or a polymer, while it is preferable to use a polymer (polymer having a polymerizable group and an interactive group) as the compound from the viewpoint of the formability of polymer layer and easiness in regulation.

The polymer having a polymerizable group and an interactive group is preferably a polymer obtained by introducing, into a homopolymer or a copolymer obtainable by using a monomer having an interactive group, an ethylene addition polymerizable unsaturated group (polymerizable group) such as a vinyl group, an allyl group or a (meth)acryl group as a polymerizable group. The polymer having a polymerizable group and an interactive group is preferably a polymer which has a polymerizable group at least a terminal of its main chain or its side chain, and is preferably a polymer which has a polymerizable group in its side chain.

Any monomer may be used as the monomer having an interactive group, which is used for forming the polymer having a polymerizable group and an interactive group as long as it is a monomer having a non-dissociative functional group described above. Specific examples thereof include those shown below.

These may be used alone, or may also be used in combination of two or more species thereof.

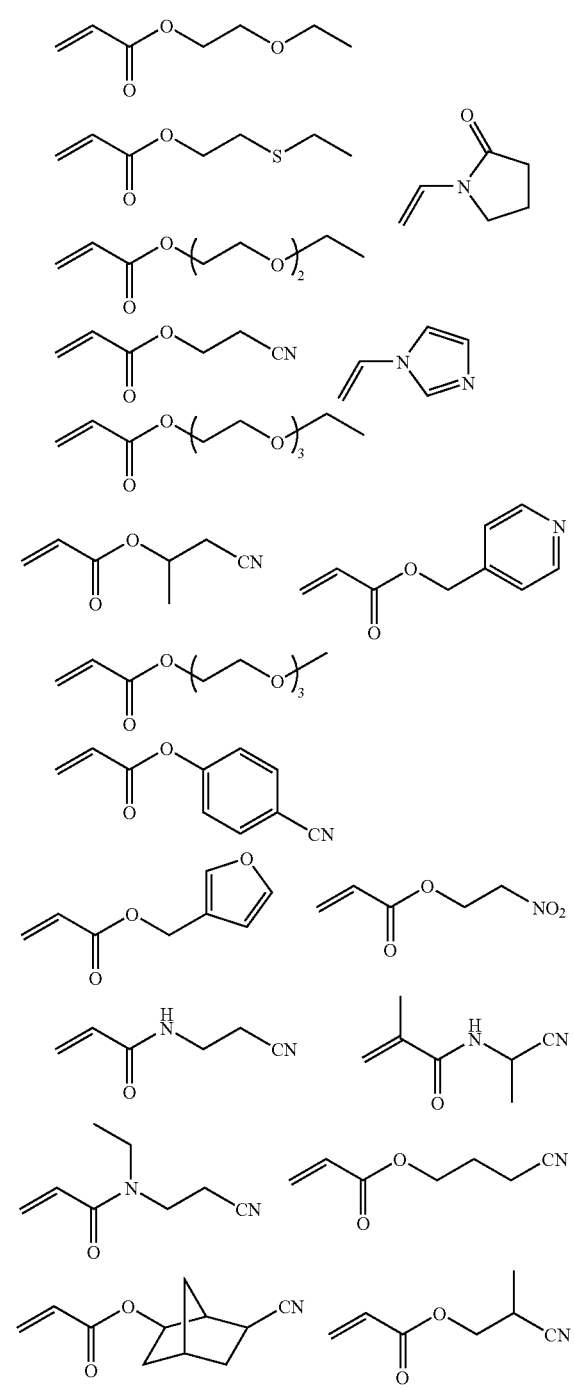

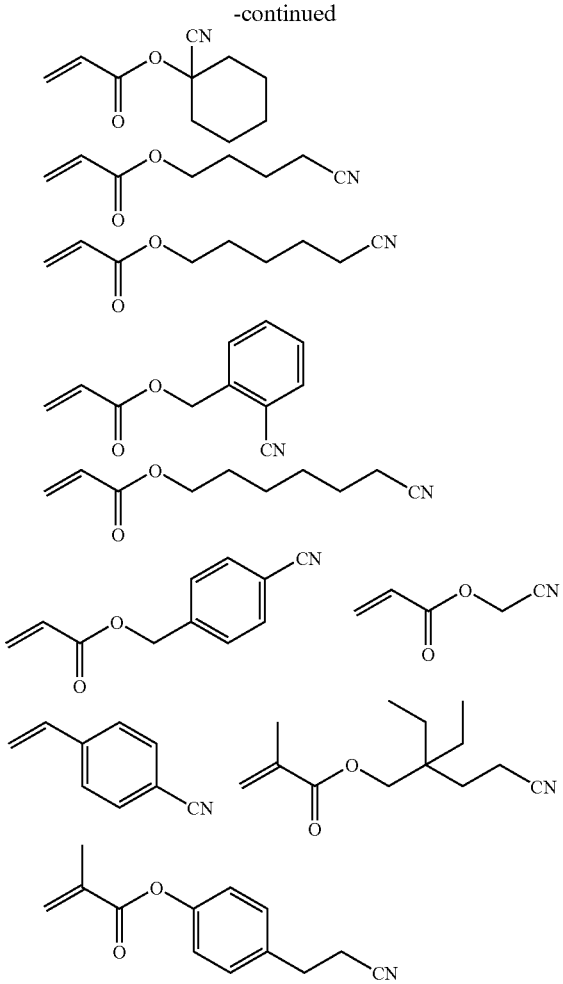

From the viewpoint of the interactability of the polymer having a polymerizable group and an interactive group with a plating catalyst or a precursor thereof, it is preferable that an amount of a unit derived from a monomer having an interactive group and contained in the polymer having a polymerizable group and an interactive group is in the range of 50 to 95% by mole, and more preferably in the range of 40 to 80% by mole with respect to the amount of the polymer.

A monomer other than the monomer having an interactive group may also be used for obtaining a polymer having a polymerizable group and an interactive group in view of decreasing water absorbability and enhancing hydrophobicity. Examples of the other monomer include general polymerizable monomers such as diene monomers, acrylic monomers or the like. Among them, unsubstituted alkyl acrylic monomers are preferable. Specifically, tertiary butyl acrylate, 2-ethylhexyl acrylate, butyl acrylate, cyclohexyl acrylate, benzyl methacrylate and the like may be preferably used.

The polymer having a polymerizable group and an interactive group may be synthesized as follows.

Examples of the synthesis method include i) a method of copolymerizing a monomer having an interactive group and a monomer having a polymerizable group; ii) a method of copolymerizing a monomer having an interactive group and a monomer having a double bond precursor, and then introducing a double bond thereinto by treatment with a base or the like; and iii) a method of reacting a polymer having an interactive group with a monomer having a polymerizable group, and introducing a double bond thereinto (introducing a polymerizable group). From the viewpoint of synthesis suitability, ii) the method of copolymerizing a monomer having an interactive group and a monomer having a double bond precursor, and then introducing a double bond thereinto by treatment with a base or the like; and iii) the method of reacting a polymer having an interactive group with a monomer having a polymerizable group, and introducing a polymerizable group thereinto can be preferable.

Examples of the monomer having an interactive group, which is used in the synthesis of the polymer having a polymerizable group and an interactive group, include the same monomers as the monomers having an interactive group. The monomers may be used alone, or may also be used in combination of two or more species thereof.

Examples of the monomer having a polymerizable group, which is copolymerized with a monomer having an interactive group, include allyl (meth)acrylate, 2-allyloxyethyl methacrylate, and the like.

Further, examples of the monomer having a double bond precursor include 2-(3-chloro-1-oxopropoxy)ethyl methacrylate, 2-(3-bromo-1-oxopropoxy)ethyl methacrylate, and the like.

Examples of the monomer having a polymerizable group, which is used to introduce an unsaturated group by using a reaction with a functional group such as a carboxyl group, an amino group or a salt thereof, a hydroxyl group or an epoxy group, and is contained in the polymer having an interactive group, include (meth)acrylic acid, glycidyl (meth)acrylate, allyl glycidyl ether, 2-isocyanatoethyl (meth)acrylate, and the like.

Hereinafter, specific examples of the polymer having a polymerizable group and an interactive group, which is suitably used in the invention, will be given, while the invention is not limited thereby.

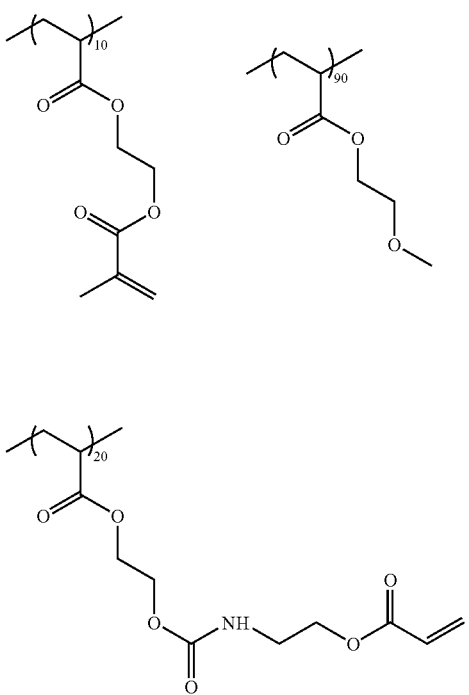

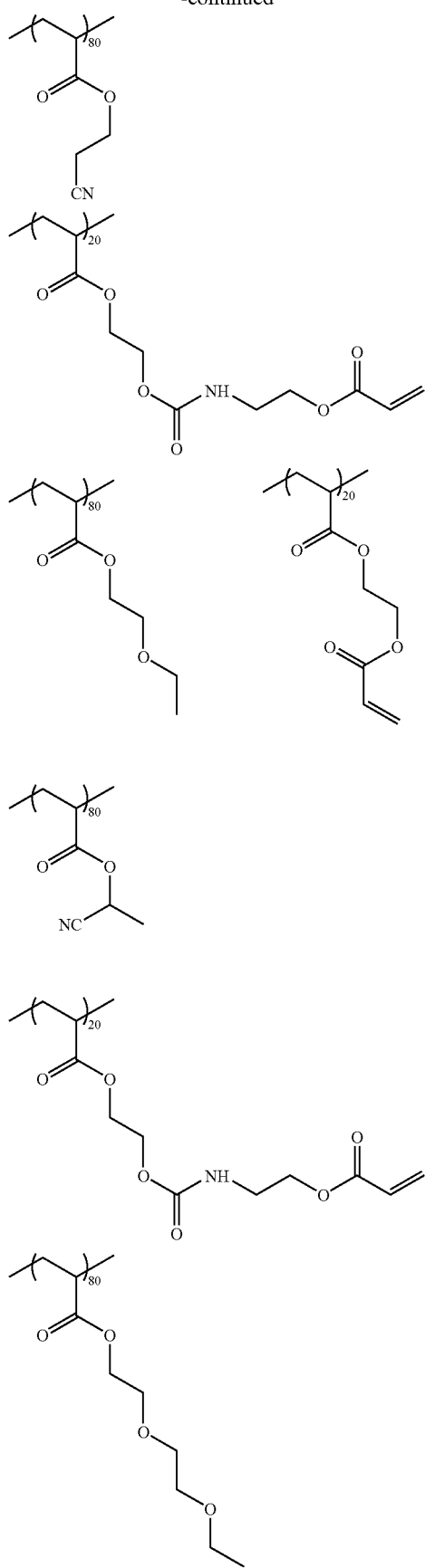
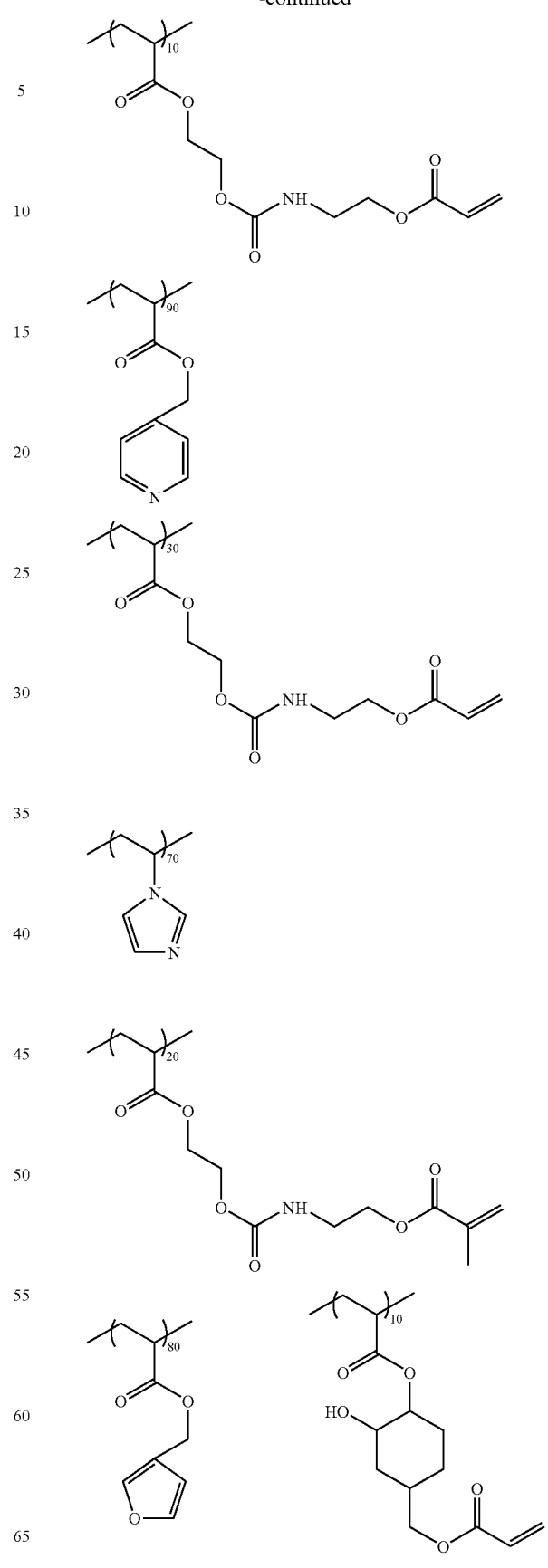

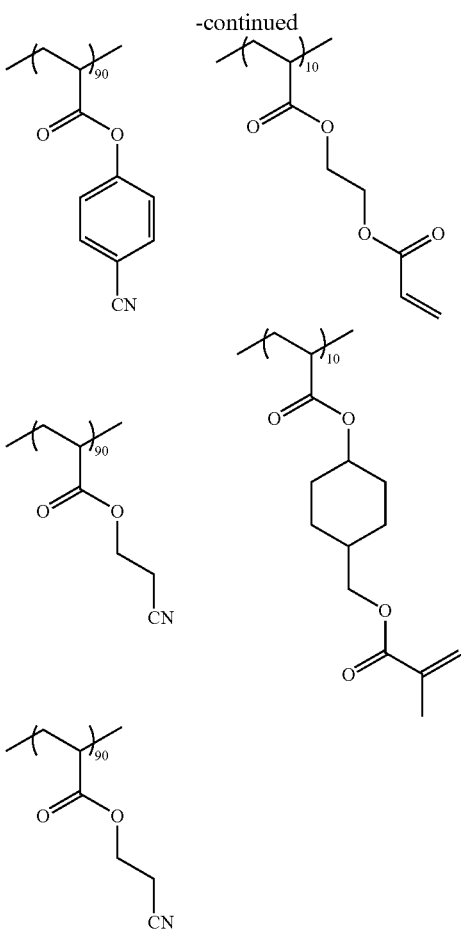

As the polymer having a polymerizable group and an interactive group, which is used in the process for producing a metal film-coated material as an exemplary embodiment of the invention, a polymer having a cyano group as the interactive group (hereinafter, referred to as "cyano group-containing polymerizable polymer") is preferable.

The compound having a polymerizable group and an interactive group, such as the cyano group-containing polymerizable polymer used in the invention, may further have a polar group in addition to the polymerizable group and the interactive group.

Particularly, when a metal film-coated material according to the invention is produced and the polymer layer produced thereby satisfies all of the requirements (1) to (4), the adhesive force in the contact area between the polymer layer and a protective layer may be enhanced by the inclusion of the polar group in the polymer when, for example, a protective layer is provided after a metal film has been formed by a process described below.

As described above, it is preferable in formation of the polymer layer in the invention to use a liquid composition containing: a compound having a polymerizable group and an interactive group, such as a polymer having a polymerizable group and an interactive group, that is, a composition containing a compound having a polymerizable group and an interactive group; and a solvent capable of dissolving the compound. It is preferable to use a composition for polymer layer formation of the invention containing: a polymer having a cyano group or a structure represented by the formula: —O—(CH$_2$)$_n$—O— (wherein n is an integer from 1 to 5) and a polymerizable group; and a solvent capable of dissolving the polymer.

The content of the compound having a polymerizable group and an interactive group (for example, a cyano group-containing polymerizable polymer) in the composition is preferably 2% by mass to 50% by mass with respect to the total mass of the composition.

The solvent used for the composition is not particularly limited as long as it is able to dissolve the compound having a polymerizable group and an interactive group, which is the main component of the composition. A surfactant may be added to the solvent.

Examples of the solvent that may be used herein include alcohol solvents such as methanol, ethanol, propanol, ethylene glycol, glycerin or propylene glycol monomethyl ether; acids such as acetic acid; ketone solvents such as acetone, methyl ethyl ketone or cyclohexanone; amide solvents such as formamide, dimethylacetamide or N-methylpyrrolidone; nitrile solvents such as acetonitrile or propionitrile; ester solvents such as methyl acetate or ethyl acetate; carbonate solvents such as dimethyl carbonate or diethyl carbonate; and the like.

Among these, in the case of preparing the composition using a cyano group-containing polymerizable polymer, amide, ketone, nitrile solvents and carbonate solvents are preferably used, and specifically, acetone, dimethylacetamide, methyl ethyl ketone, cyclohexanone, acetonitrile, propionitrile, N-methylpyrrolidone, and dimethyl carbonate are preferably used.

In the case of coating the composition containing a cyano group-containing polymerizable polymer, a solvent having a boiling temperature of 50 to 150° C. is preferably used from the viewpoint of easiness in handling. These solvents may be used alone, or may also be used in a form of a mixture.

In the case of applying the composition containing a compound having a polymerizable group and an interactive group on a substrate or on a polymerization initiation layer, a solvent may be selected such that the solvent absorption rate of the substrate or the polymerization initiation layer is 5 to 25%. The solvent absorption rate may be determined from the change in the mass of a substrate or a base material having a polymerization initiation layer formed thereon measured when the substrate or the base material is immersed in a solvent and that measured when the immersed substrate or the base material are salvaged from the solvent at 1000 minutes after the immersion.

In the case of applying the composition containing a compound having a polymerizable group and an interactive group on a substrate or on a polymerization initiation layer, the solvent may be selected such that the swelling ratio of the substrate or the polymerization initiation layer is 10 to 45%. The swelling ratio may be determined from the change in the thickness of a substrate or a base material having a polymerization initiation layer formed thereon measured when the substrate or the base material is immersed in a solvent and that measured when the immersed substrate or the base material are salvaged from the solvent at 1000 minutes after the immersion.

The surfactant which may be added to the solvent as necessary may be any surfactant as long as it is soluble in the solvent. Examples of the surfactant include anionic surfactants such as sodium n-dodecylbenzenesulfonate; cationic surfactants such as n-dodecyltrimethylammonium chloride; nonionic surfactants such as polyoxyethylene nonylphenol ether (examples of commercially available products include Emulgen 910, manufactured by Kao Corp., and the like), polyoxyethylene sorbitan monolaurate (examples of commercially available products include "TWEEN 20" (trade name)), or polyoxyethylene lauryl ether; and the like.

If necessary, a plasticizer may also be added to the composition. As for the plasticizer that are usable, general plasticizers may be used, and examples thereof include phthalic acid esters (dimethyl ester, diethyl ester, dibutyl ester, di-2-ethylhexyl ester, di-normal-octyl ester, diisononyl ester, dinonyl ester, diisodecyl ester, butylbenzyl ester), adipic acid esters (dioctyl ester, diisononyl ester), dioctyl azelate, sebacic acid esters (dibutyl ester, dioctyl ester), tricresyl phosphate, tributyl acetylcitrate, epoxidated soybean oil, trioctyl trimellitate, chlorinated paraffins, and high boiling temperature solvents such as dimethylacetamide or N-methylpyrrolidone.

The composition containing a compound having a polymerizable group and an interactive group may also be added with a polymerization inhibitor if necessary. Examples of the polymerization inhibitor that may be used include hydroquinones such as hydroquinone, di-tertiary-butylhydroquinone and 2,5-bis(1,1,3,3-tetramethylbutyl)hydroquinone; phenols such as p-methoxyphenol and phenol; benzoquinones; free radicals such as TEMPO (2,2,6,6-tetramethyl-1-piperidinyloxy free radical) and 4-hydroxy-TEMPO; phenothiazines; nitrosoamines such as N-nitrosophenylhydroxyamine and aluminum salt thereof; and catechols.

The composition containing a compound having a polymerizable group and an interactive group may also be added, if necessary, with a curing agent and/or a curing accelerator in order to allow curing of the polymerization initiation layer to proceed. Known products may be used as for the curing agent and curing accelerator. Specific examples of the curing accelerator include; a polyaddition accelerator such as aliphatic polyamines, alicyclic polyamines, aromatic polyamines, polyamides, acid anhydrides, phenol, phenol novolac, polymercaptans, compounds having two or more active hydrogen atoms, or the like; and as a catalyst accelerator such as aliphatic tertiary amines, aromatic tertiary amines, imidazole compounds, Lewis acid complexes, or the like.

Examples of the curing agent and/or the curing accelerator which initiate curing under the action of heat, light, humidity, pressure, acid, base or the like, include diethylenetriamine, triethylenetetramine, tetraethylenepentamine, diethylaminopropylamine, polyamidoamine, menthenediamine, isophorone diamine, N-aminoethylpiperazine, 3,9-bis(3-aminopropyl)-2,4,8,10-tetraoxyspiro(5,5)undecane adduct, bis(4-amino-3-methylcyclohexyl)methane, bis(4-aminocyclohexyl)methane, m-xylenediamine, diaminodiphenylmethane, m-phenylenediamine, diaminodiphenylsulfone, dicyandiamide, adipic acid dihydrazide, phthalic anhydride, tetrahydrophthalic anhydride, hexahydrophthalic anhydride, methyltetrahydrophthalic anhydride, methylhexahydrophthalic anhydride, methylnadic anhydride, dodecylsuccinic anhydride, chlorendic anhydride, pyromellitic anhydride, benzophenonetetracarboxylic acid anhydride, ethylene glycol bis(anhydrotrimellitate), methylcyclohexenetetracarboxylic acid anhydride, trimellitic anhydride, polyazelaic anhydride, phenol novolac, xylylene novolac, bis-A novolac, triphenylmethane novolac, biphenyl novolac, dicyclopentadiene phenol novolac, terpene phenol novolac, polymercaptans, polysulfides, 2,4,6-tris(dimethylaminomethyl)phenol, 2,4,6-tris(dimethylaminomethyl)phenol-tri-2-ethylhexanoate, benzyldimethylamine, 2-(dimethylaminomethyl)phenol, 2-methylimidazole, 2-ethyl-4-methylimidazole, 2-undecylimidazole, 2-heptadecylimidazole, 2-phenylimidazole, 1-benzyl-2-methylimidazole, 1-cyanoethyl-2-methylimidazole, 2,4-di-amino-6-(2-methylimidazolyl-(1))-ethyl S-triazine, $BF_3$ monoethylamine complex, Lewis acid complexes, organic acid hydrazides, diaminomaleonitrile, melamine derivatives, imidazole derivatives, polyamine salts, aminimide compounds, aromatic diazonium salts, diallyliodonium salts, triallylsulfonium salts, triallylselenium salts, ketimine compounds, and the like.

From the viewpoint of the coatability of the solution, adhesion to the substrate or the plating film, or the like, these curing agent and/or the curing accelerator is preferably added up to about 0 to 50% by mass with respect to the non-volatile components remaining after the removal of solvents. The curing agent and/or the curing accelerator may be added to the polymerization initiation layer, and in that situation, it is preferable that the total amount of the amount added to the polymerization initiation layer and that added to the polymer layer meets the above-mentioned range.

In addition, a gum component (for example, carboxyl-terminated butadiene acrylonitrile (CTBN)), a flame retardant (for example, phosphorus flame retardants), a diluent or a thixotropic agent, a pigment, a defoaming agent, a leveling agent, a coupling agent, and the like may also be added to the composition. These additives may be added to the polymerization initiation layer as necessary.

The utilization of a composition formed by appropriately mixing such compound having a polymerizable group and an interactive group and various additives, the properties of the formed polymer layer such as the thermal expansion coefficient, glass transition temperature, Young's modulus, Poisson's ratio, rupture stress, yield stress, thermal decomposition temperature or the like may be set at the optimal values. Particularly, it is preferable that the rupture stress, yield stress and thermal decomposition temperature are higher.

Thermal durability of the thus-obtained polymer layer may be measured by a temperature cycle test, a thermal aging test, a reflow test or the like. For example, in regard to thermal decomposition, the polymer layer may be evaluated to have sufficient thermal durability when the mass reduction after an exposure to an environment of 200° C. for 1 hour is 20% or less.

In the case of bringing the composition containing a compound having a polymerizable group and an interactive group into contact, the amount of coating is preferably 0.1 to 10 $g/m^2$, and particularly preferably 0.5 to 5 $g/m^2$, in terms of the solid content, from the viewpoint of achieving sufficient interacting ability with a plating catalyst or a precursor thereof.

When a layer containing a compound having a polymerizable group and an interactive group is formed by coating a substrate with a composition containing the compound having a polymerizable group and an interactive group and drying the coated substrate, a remaining solvent may be removed by allowing the coated substrate to stand for 0.5 to 2 hours at 20 to 40° C. between the processes of coating and drying.

Impartation of Energy

Examples of the method of imparting energy to the substrate surface include a method of utilizing irradiation of radiant rays such as heating or light exposure. Examples of the irradiation method include photoirradiation by means of a UV lamp or visible light, heating by means of a hot plate, and the like. Examples of the light sources that may be used for the methods include a mercury lamp, a metal halide lamp, a xenon lamp, a chemical lamp, a carbon arc lamp, and the like. Examples of the radiation include electron beam, X-rays, ion beam, far-infrared rays, and the like. Examples of the radiation further include g-rays, i-rays, deep-UV light, and high density energy beam (laser beam).

Preferable examples of generally used specific embodiments of the energy imparting include direct image-wise recording with a thermal recording head or the like, scanning exposure using infrared laser, high illuminance flash exposure using a xenon discharge lamp or the like, exposure using an infrared lamp, and the like.

The time required for imparting energy may vary in accordance with the amount of production of the desired graft polymer and the light source, while the time is usually in the range of from 10 seconds to 5 hours.

In the case of imparting energy by light exposure, the exposure power is preferably in the range of 10 mJ/cm$^2$ to 5000 mJ/cm$^2$, and more preferably in the range of 50 mJ/cm$^2$ to 3000 mJ/cm$^2$, in view of easily progressing graft polymerization, and suppressing the decomposition of the produced graft polymer.

If a polymer having an average molecular weight of 20,000 or more and a degree of polymerization of 200-mers or more is used as the compound having a polymerizable group and an interactive group, the graft polymerization process may easily proceed by exposure to low energy radiation, so that decomposition of the produced graft polymer may be further suppressed.

Through the process (a1) described above, a polymer layer formed from a graft polymer having an interactive group (graft polymer layer) may be formed on the substrate.

In regard to the obtained polymer layer, the polymer layer may be subjected to washing with a highly alkaline solution when the ratio of a number of decomposed polymerizable group site with respect to the total number of the polymerizable group site in the obtained polymer layer is, for example, 50% or less when the polymer layer is added to an alkaline solution at pH 12 and stirred for 1 hour.

Process (a1')

In the process (a1') in the second embodiment of the process for producing a metal film-coated material of the invention, there is formed, on a substrate, a polymer layer formed from a polymer which has a cyano group and is directly chemically bonded to the substrate.

Methods which are used in this process are similar to those described for the process (a1), except that a compound having a polymerizable group and a cyano group is used as the compound having a polymerizable group and an interactive group of the process (a1), and the preferable exemplary embodiments thereof are also similar to those of the process (a1).

Through the process (a1'), a polymer layer formed from a graft polymer having a cyano group (graft polymer layer) may be formed on the substrate.

The polymer which configurates the polymer layer obtained by this process has a cyano group as the functional group capable of interacting with a plating catalyst or a precursor thereof. The cyano group has high polarity and has high adsorption capacity to a plating catalyst or the like as discussed above, but does not have such high water absorbability and hydrophilicity as those of a dissociative polar group (hydrophilic group). Thus, the polymer layer formed from a graft polymer having the cyano group has low water absorbability and high hydrophobicity.

Process (a2)

In the process (a2), a plating catalyst or a precursor thereof is provided to the polymer layer formed in the process (a1) or (a1'). In regard to this process, the interactive group (cyano group) carried by the graft polymer configurating the polymer layer attaches (adsorbs) to the provided plating catalyst or a precursor thereof according to the function of the group.

Here, examples of the plating catalyst or a precursor thereof include those work as catalysts for plating or as electrodes in the plating process (a3) that will be described below. For that reason, the plating catalyst or a precursor thereof can be determined on the basis of the type of plating in the plating process (a3).

The plating catalyst or a precursor thereof used in this process is preferably an electroless plating catalyst or a precursor thereof.

Electroless Plating Catalyst

In regard to the electroless plating catalyst used in the invention, any compound may be used as long as it serves as an active core during electroless plating. Examples thereof include those metals having catalytic ability for the self-catalytic reduction reaction (those known as metals capable of electroless plating with low ionization tendency than that of Ni), and the like. Specific examples thereof include Pd, Ag, Cu, Ni, Al, Fe, Co and the like. Among them, those capable of multidentate coordination are preferable. In particular, from the viewpoints of the number of types of the functional group capable of coordination and the superiority of the catalytic ability, Pd is preferable.

This electroless plating catalyst may be used in the form of a metal colloid. In general, a metal colloid may be produced by reducing metal ions in a solution containing a surfactant carrying an electrical charge or a protective agent carrying an electrical charge. The electrical charge of the metal colloid may be regulated by the surfactant or protective agent used herein.

Electroless Plating Catalyst Precursor

Any compound may be used as for the electroless plating catalyst precursor used in this process without particularly limitation as long as it may become an electroless plating catalyst by a chemical reaction. In most cases, metal ions of those metals mentioned as the electroless plating catalyst can be used. A metal ion which is an electroless plating catalyst precursor becomes zero-valent metal which is an electroless plating catalyst through a reduction reaction. The metal ion which is an electroless plating catalyst precursor may be converted to zero-valent metal through a separate reduction reaction after being provided to the polymer layer and before being immersed into an electroless plating bath to obtain an electroless plating catalyst, or may be immersed in an electroless plating bath as it is being an electroless plating catalyst precursor, and be converted to metal (electroless plating catalyst) by a reducing agent in the electroless plating bath.

Practically, the metal ion as the electroless plating precursor can be provided onto the polymer layer by using a metal salt. The metal salt is not particularly limited as long as it may be dissolved in an appropriate solvent to be dissociated into a metal ion and a base (anion). Specific examples thereof include $M(NO_3)_n$, $MCl_n$, $M_{2/n}(SO_4)$, and $M_{3/n}(PO_4)$ (wherein M represents an n-valent metal atom). Preferable examples of the metal ions include the resultants of dissociation of the above-mentioned metal salts. Specific examples thereof include Ag ion, Cu ion, Al ion, Ni ion, Co ion, Fe ion, and Pd ion. Among them, those capable of multidentate coordination are preferable. In particular, from the viewpoints of the number of types of the functional group capable of coordination and the catalytic ability, Pd ion is preferable.

The method of providing a metal as an electroless plating catalyst or a metal salt as an electroless plating precursor to the polymer layer may include: preparing a dispersion having a metal dispersed in an appropriate dispersion solvent, or a solution containing dissociated metal ions resulting from dissolution of a metal salt in an appropriate solvent; and applying the dispersion or the solution onto the polymer layer or immersing, in the dispersion or the solution, a substrate having the polymer layer formed thereon.

When the surface graft polymerization method for the process (a1) or (a1'), a composition containing a compound having a polymerizable group and an interactive group (cyano group) is contacted with a substrate at the top of the substrate. Herein, a method of adding an electroless plating catalyst or a precursor thereof into this composition may be employed. A polymer layer containing a polymer which has an interactive group (cyano group) and is directly chemically bonded to the substrate and a plating catalyst or a precursor thereof may be formed by contacting, with a substrate at the top of the substrate, a composition containing a compound having a polymerizable group and an interactive group (cyano group) and an electroless plating catalyst or a precursor thereof and then performing the surface graft polymerization. This method enables to perform the process (a1) or (a1') and the process (a2) in one process.

In the case where a polymer layer is formed on both sides of a resin film by carrying out the process (a1") according to the third embodiment of the process for producing a metal film-coated material of the invention, it is preferable to use the above-described immersion method to simultaneously bring the polymer layers on both sides of the film into contact with an electroless plating catalyst or a precursor thereof.

When the electroless plating catalyst or a precursor thereof is contacted as described above, the electroless plating catalyst or a precursor thereof may be adsorbed to the interactive group (cyano group) in the polymer layer by using the interaction based on intermolecular force such as van der Waals force or the interaction based on the coordinate covalent bonding by lone pair electrons.

In view of sufficiently achieving such adsorption, the metal concentration in the dispersion, solution or composition, or the metal ion concentration in the solution is preferably in the range of 0.001 to 50% by mass, and more preferably in the range of 0.005 to 30% by mass. The contacting time is preferably about 30 seconds to 24 hours, and more preferably about 1 minute to 1 hour.

Other Catalysts

In regard to the process (a3) described below, a zero-valent metal may be used as the catalyst used to directly perform electroplating the polymer layer without performing electroless plating. Examples of this zero-valent metal include Pd, Ag, Cu, Ni, Al, Fe, Co and the like. Among them, those capable of multidentate coordination are preferable. In particular, Pd, Ag and Cu are preferable from the viewpoints of the adsorbability (attachability) to the interactive group (cyano group) and the superiority of the catalytic ability.

Through the process (a2) discussed above, interaction between the interactive group (cyano group) in the polymer layer and the plating catalyst or a precursor thereof may be formed.

Process (a3)

In the process (a3), a plating film is formed by plating the polymer layer to which an electroless plating catalyst or a precursor thereof has been provided. The formed plating film may have excellent electroconductivity and adhesiveness.

Examples of the type of plating performed in this process include electroless plating and electroplating. In the process (a2), the type of the plating may be selected based on the function of the plating catalyst or a precursor thereof which has formed the interaction with the polymer layer.

That is, in this process, the polymer layer to which a plating catalyst or a precursor thereof has been provided can be subjected to electroplating or electroless plating.

Among them, according to the invention, it is preferable to perform electroless plating from the viewpoint of the formability of a hybrid structure generated in the polymer layer and the enhancement of adhesiveness. Further, in view of obtaining a plating layer with a desired thickness, it is more preferable to further perform electroplating after electroless plating.

Hereinafter, the mode of plating that can be suitably performed in this process will be described.

Electroless Plating

"Electroless plating" means an operation to precipitate a metal by a chemical reaction by using a solution in which the metal ion which is desired to be precipitated as plating have been dissolved.

The electroless plating in this process can be performed by, for example, washing the substrate having an electroless plating catalyst provided thereon with water to remove any excess electroless plating catalyst (metal), and then immersing the substrate in an electroless plating bath. Any generally known electroless plating baths may be used as the electroless plating bath to be used.

In the case of immersing a substrate having an electroless plating catalyst precursor provided thereon in the electroless plating bath while the electroless plating catalyst precursor is still adsorbed or impregnated in the polymer layer, this substrate can be washed with water to remove excess precursor (metal salt, or the like), and then is immersed into the electroless plating bath. In this case, both of reduction of the plating catalyst precursor and subsequent electroless plating are performed in the electroless plating bath. Similarly to the above, those generally known electroless plating baths may be also used as the electroless plating bath used herein.

Alternatively, in place of the exemplary embodiment of using an electroless plating liquid as described above, reduction of the electroless plating catalyst precursor may be performed in a process which is separately performed prior to the electroless plating with preparing a catalyst activating liquid (reducing liquid). The catalyst activating liquid is a liquid in which a reducing agent capable of reducing an electroless plating catalyst precursor (mainly a metal ion) to zero-valent metal is dissolved, and the concentration of the precursor based on the total amount of the liquid is generally in the range of 0.1% by mass to 50% by mass, and is preferably in the range of 1% to 30%. Examples of the reducing agent that may be used include boron reducing agents such as sodium borohydride or dimethylamineborane, and reducing agents such as formaldehyde or hypophosphorous acid.

The formulation of a general electroless plating bath contains, in addition to the solvent, (1) metal ions for plating, (2) a reducing agent, and (3) additives for enhancing the stability of the metal ions (stabilizer) as main components. The plating bath may further contain, in addition to these, known additives such as a stabilizer for the plating bath.

The solvent used in the plating bath preferably contains an organic solvent which has high affinity to the polymer layer with low water absorbability and high hydrophobicity (polymer layer satisfying all of the requirements (1) to (4)). Selection of the kind of the organic solvent, the content and the like may be adjusted in accordance with the properties of the polymer layer. Particularly, the larger the saturated water absorption coefficient in the requirement (1) in the polymer layer becomes, the better to make the content of the organic solvent be smaller. Specific examples of the adjusted condition are as follows.

That is, if the saturated water absorption coefficient according to the requirement (1) is 0.01 to 0.5% by mass, the content of the organic solvent in the entire solvent in the plating bath is preferably 20 to 80% by mass, and if the saturated water absorption coefficient is 0.5 to 5% by mass, the content of the organic solvent in the entire solvent in the plating bath is preferably 10 to 80% by mass. If the saturated water absorption coefficient is 5 to 10% by mass, the content of the organic solvent in the entire solvent in the plating bath is preferably 0 to 60% by mass, and if the saturated water absorption coefficient is 10 to 20% by mass, the content of the organic solvent in the entire solvent in the plating bath is preferably 0 to 45% by mass.

The organic solvent used in the plating bath needs to be a solvent miscible with water, and from that standpoint, ketones such as acetone, and alcohols such as methanol, ethanol or isopropanol are preferably used.

Examples of the kind of metal known and used in the electroless plating bath include copper, tin, lead, nickel, gold, palladium and rhodium, and among them, copper and gold are particularly preferable from the viewpoint of electrical conductivity.

There are reducing agents and additives that are optimal to the aforementioned metals. Examples of the reducing agents and additives which may be contained in an electroless plating bath for copper include $CuSO_4$ as a copper salt, HCOH as a reducing agent, and additives such as EDTA which is a stabilizer of copper ions, a chelating agent such as Rochelle salt, or trialkanolamine. The plating bath used for electroless plating of CoNiP may contain a metal salt such as cobalt sulfate or nickel sulfate, a reducing agent such as sodium hypophosphite, and a complexing agent such as sodium malonate, sodium malate or sodium succinate. The electroless plating bath for palladium may contain a metal ion such as $(Pd(NH_3)_4)Cl_2$ as, a reducing agent such as $NH_3$ or $H_2NNH_2$, and a stabilizer such as EDTA. These plating baths may further contain a component other than the above-described components.

The film thickness of the plating film thus formed by electroless plating may be regulated by the metal ion concentration of the plating bath, the immersion time in the plating bath, the temperature of the plating bath, and the like. From the viewpoint of electrical conductivity, the film thickness is preferably 0.5 μm or more, and more preferably 3 μm or more.

The immersion time in the plating bath is preferably from about 1 minute to 6 hours, and more preferably from about 1 minute to 3 hours.

Observation of cross-section of the plating film thus obtained by electroless plating with a scanning electron microscope (SEM) has shown that microparticles formed from the electroless plating catalyst or the plating metal are dispersed in the polymer layer at high density, and the plating metal is precipitated on the polymer layer. Since the interface between the substrate and the plating film is in the state of a hybrid of the polymer and the microparticles, the adhesiveness of the plating film to the substrate can be good even if the interface between the substrate (organic component) and the inorganic substance (catalyst metal or plating metal) is flat and smooth (for example, when the roughness of the interface in terms of difference between concaves and convexes therein is 500 nm or less).

Electroplating

When a plating catalyst or a precursor thereof provided during the process (a2) has a function as an electrode, the polymer layer to which the catalyst or a precursor thereof has been provided can be subjected to electroplating in this process.

Alternatively, the electroplating may be performed after the above-described electroless plating, by using the formed plating film as an electrode. Thereby, a metal film having an arbitrary thickness may be newly and easily formed with using, as a base, the electroless plating film having excellent adhesiveness to the substrate. The electroplating performed after electroless plating is suitable to be applied to various applications because a thickness of the metal film may be formed to be accorded with the purpose, which enables to apply the metal film of the invention for various purposes.

Any conventionally known methods may be used as the method for electroplating according to the invention. Examples of the metal used in the electroplating of this process include copper, chromium, lead, nickel, gold, silver, tin, and zinc. From the viewpoint of electrical conductivity, copper, gold and silver are preferable, while copper is more preferable.

The thickness of the metal film obtained by electroplating may vary with the purpose, and may be controlled by adjusting the concentration of a metal contained in the plating bath, current density or the like. In the case of being used in general electrical wiring or the like, the film thickness is preferably 0.5 μm or more, and more preferably 3 μm or more, from the viewpoint of electrical conductivity.

According to the invention, the metal or metal salt derived from the plating catalyst or a plating catalyst precursor, and/or the metal precipitated in the polymer layer by electroless plating forms a fractal-like microstructure in the layer, and thereby the adhesiveness between the metal film and the polymer layer can be further enhanced.

With respect to the amount of metal present in the polymer layer, even stronger adhesive force can be achieved when the proportion of metal occupying a region extending from the outermost surface of the polymer layer down to a depth of 0.5 μm in photographs of cross-section of the substrate taken with a metal microscope is 5 to 50% by area and when the arithmetic average roughness $R^a$ of the polymer layer and the metal interface measured according to ISO 4288 (1996) is 0.05 μm to 0.5 μm.

Metal Film-coated Material

The metal film-coated material of the invention may be obtained through the respective processes of the process for producing a metal film-coated material of the invention. In this regard, a metal film-coated material having a metal film formed on each of both sides thereof may be obtained when the third embodiment of the process for producing a metal film-coated material of the invention is applied.

The metal film-coated material obtained by the process for producing a metal film-coated material of the invention may achieve an effect of showing less fluctuation in the adhesive force of the metal film even under high temperature and high humidity. This metal film-coated material may be applied to various applications such as electromagnetic wave shielding films, coating films, two-layer CCL (copper clad laminate) materials, or materials for electrical wiring.

The process for producing a metallic pattern-bearing material of the invention includes a process of pattern-wise etching the plating film of the metal film-coated material of the invention obtained through the processes of (a1) to (a3).

This etching process (a4) will be described in the following.

Process (a4)

In the process (a4), the plating film (metal film) formed in the process (a3) is pattern-wise etched. That is, a desired metallic pattern may be formed in this process by removing, by etching, any unnecessary parts of the plating film which have been formed over the entire surface of the substrate.

Any technique may be used in the formation of this metallic pattern. Specific examples thereof include the generally known subtractive method and semi-additive method.

The subtractive method is a method of forming a metallic pattern by providing a dry film resist layer on the formed plating film, forming the same pattern as the metallic pattern part through pattern-wise exposure and development, and removing the plating film with an etching solution while using the dry film resist pattern as the mask. Any material may be used as the dry film resist, and examples thereof include a negative type material, a positive type material, a liquid-form material and a film-form material. Any of the methods that are being used in the production of printed wiring boards may be used and be arbitrarily selected as the etching method, and examples thereof include wet etching and dry etching. From the viewpoint of simplicity and convenience of apparatuses and the like used in operations, wet etching is preferable. Examples of the etching solution that may be used include an aqueous solution of cupric chloride or ferric chloride.

The semi-additive method is a method of forming a metallic pattern by providing a dry film resist layer on the formed plating film, forming the same pattern as the non-metallic pattern part through pattern-wise exposure and development, performing electroplating while using the dry film resist pattern as the mask, performing quick etching after removing the dry film resist pattern, and pattern-wise removing the plating film. The materials used for the dry film resist, etching solution and the like in the semi-additive method are similar to those used in the subtractive method. Further, the previously described techniques may be used as the electroplating technique.

A metallic pattern-bearing material having a desired metallic pattern can be produced through the processes (a1) to (a4) described above.

On the other hand, the metallic pattern-bearing material may be produced by forming the polymer layer obtained by the process (a1) or (a1') in a pattern-wise manner, and then subjecting the pattern-bearing polymer layer to the processes (a2) and (a3) (full additive technique).

The method for forming the polymer layer obtained by the process (a1) or (a1') in a pattern-wise manner can be specifically performed by imparting the energy upon formation of the polymer layer in a pattern-wise form, and, a pattern-bearing polymer layer may be formed by development for removing a part to which energy is not imparted.

The development can be performed by immersing the etched plating film in a solvent capable of dissolving the material used in the formation of a polymer layer such as the compound having a polymerizable group and an interactive group (cyano group). The time for the immersion is preferably in the range of 1 minute to 30 minutes.

Alternatively, the polymer layer formed by the (a1) or (a1') may be formed by directly patterning the polymer layer by a known coating method such as a gravure printing method, an inkjet method, or a spray coating method using a mask, subsequently imparting energy, and then developing the pattern.

The processes (a2) and (a3) for forming a plating film on the polymer layer with a pattern formed thereon are the same as those described above.

Metallic Pattern-bearing Material

The metallic pattern-bearing material of the invention can be a product obtained by the above-described process for producing a metallic pattern-bearing material of the invention.

Since the polymer layer which configures the resulting metallic pattern-bearing material has low water absorbability and high hydrophobicity as described above, an exposed part formed in the polymer layer (area where no metallic pattern resides) have excellent insulation reliability.

The metallic pattern-bearing material of the invention is preferably provided with a metal film (plating film) on the entire or local of the substrate surface having a roughness in terms of difference between concaves and convexes therein of 500 nm or less (more preferably, 100 nm or less). Further, it is preferable that an adhesiveness between the substrate and the metallic pattern is 0.2 kN/m or more. That is, the metallic pattern-bearing material of the invention may achieve excellent adhesiveness which works between the substrate and the metallic pattern while the substrate surface is flat and smooth.

Herein, the roughness difference in terms of difference between concaves and convexes in the surface of the substrate surface is a value measured by cutting the substrate perpendicularly to the substrate surface and observing the cross-section with SEM.

More specifically, it is preferable that Rz of the substrate surface measured according to ISO 4287 (1997), that is, the "difference between the average value of the Z data of the first to the fifth highest peaks and the average value of the first to the fifth deepest valley within a designated plane", is 500 nm or less.

The value of the adhesiveness between the substrate and the metal film is a value measured by: adhering a copper plate (thickness: 0.1 mm) onto the surface of the metal film (metallic pattern) with an epoxy adhesive (trade name: ARALDITE, manufactured by Ciba Geigy, Ltd.), drying the assembly for 4 hours at 140° C., and then performing the 90-degree peeling test based on JIS C 6481 (a known test method for copper-clad laminate sheet for printed wiring board in accordance with IEC 60249-1 (1982)); or directly peeling off an edge part of the metal film itself to perform the 90-degree peeling test based on JIS C 6481.

The metallic pattern-bearing material obtained by the process for producing a metallic pattern-bearing material of the invention may be applied to various applications such as semiconductor chips, various electrical wiring boards, FPC (flexible printed circuit), COF (chip on film), TAB (tape automated bonding), antennas, multilayer wiring boards, or motherboards.

Novel Polymer

The novel polymer provided as an aspect of the invention is a copolymer containing a unit represented by the following Formula (1) and a unit represented by the following Formula (2). This novel polymer is one of the suitable examples of the previously described cyano group-containing polymerizable polymer, which is used in the process for producing a metal film-coated material according to another aspect of the invention. Hereinafter, the novel polymer will be appropriately referred to as a "nitrile group-containing polymerizable polymer" and will be described in detail.

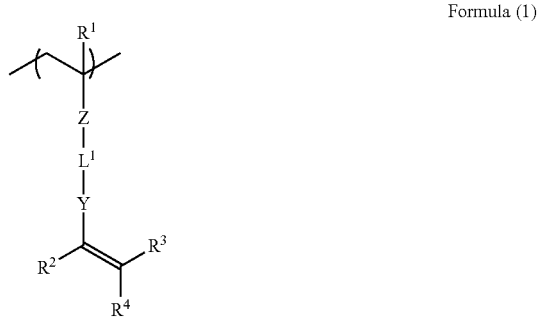

Formula (1)

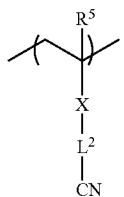

Formula (2)

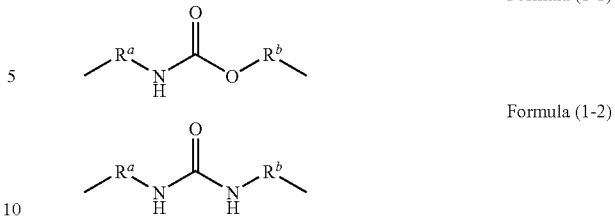

Formula (1-1)

Formula (1-2)

In Formula (1) and Formula (2), $R^1$ to $R^5$ each independently represent a hydrogen atom or a substituted or unsubstituted alkyl group; X, Y and Z each independently represent a single bond, a substituted or unsubstituted divalent organic group, an ester group, an amide group or an ether group; and $L^1$ and $L^2$ each independently represent a substituted or unsubstituted divalent organic group.

In the case where any one or more of $R^1$ to $R^5$ represents a substituted or unsubstituted alkyl group, examples of the unsubstituted alkyl group include a methyl group, an ethyl group, a propyl group and a butyl group, and examples of the substituted alkyl group include a methyl group, an ethyl group, a propyl group and a butyl group, each of which is substituted with a methoxy group, a hydroxyl group, a chlorine atom, a bromine atom, a fluorine atom or the like.

$R^1$ preferably represents a hydrogen atom, a methyl group, or a methyl group substituted with a hydroxyl group or a bromine atom.

$R^2$ preferably represents a hydrogen atom, a methyl group, or a methyl group substituted with a hydroxyl group or a bromine atom.

$R^3$ preferably represents a hydrogen atom.

$R^4$ preferably represents a hydrogen atom.

$R^5$ preferably represents a hydrogen atom, a methyl group, or a methyl group substituted with a hydroxyl group or a bromine atom.

In the case where any one or more of X, Y and Z represents a substituted or unsubstituted divalent organic group, examples of the divalent organic group include a substituted or unsubstituted aliphatic hydrocarbon group and a substituted or unsubstituted aromatic hydrocarbon group.

Preferable examples of the substituted or unsubstituted aliphatic hydrocarbon group include a methylene group, an ethylene group, a propylene group, a butylene group, and one of these groups which has been substituted with a methoxy group, a hydroxyl group, a chlorine atom, a bromine atom, a fluorine atom or the like.

Preferable examples of the substituted or unsubstituted aromatic hydrocarbon group include an unsubstituted phenyl group and a phenyl group substituted with a methoxy group, a hydroxyl group, a chlorine atom, a bromine atom, a fluorine atom, or the like.

Among them, —$(CH_2)_n$— (wherein n is an integer from 1 to 3) is preferable, and —$CH_2$— is more preferable.

$L^1$ is preferably a divalent organic group having a urethane bond or a urea bond, more preferably a divalent organic group having a urethane bond, and inter alia, one such group having 1 to 9 carbon atoms in total is preferable. Here, the number of carbon atoms in total of $L^1$ means the total number of carbon atoms contained in the substituted or unsubstituted divalent organic group represented by $L^1$.

More specifically, the structure of $L^1$ is preferably a structure represented by the following Formula (1-1) or Formula (1-2).

In Formula (1-1) and Formula (1-2), $R^a$ and $R^b$ each independently represent a divalent organic group formed with the use of two or more atoms selected from the group consisting of a carbon atom, a hydrogen atom and an oxygen atom, and preferable examples thereof include a methylene group, an ethylene group, a propylene group and a butylene group, all of which may be substituted or unsubstituted, an ethylene oxide group, a diethylene oxide group, a triethylene oxide group, a tetraethylene oxide group, a dipropylene oxide group, a tripropylene oxide group, and a tetrapropylene oxide group.

$L^2$ is preferably a linear, branched or cyclic alkylene group, an aromatic group, or a group resulting from a combination of any of these groups. The group formed by combining the alkylene group and the aromatic group may have an ether group, an ester group, an amide group, a urethane group or a urea group through which the alkylene group and the aromatic group are combined in the group. Among them, $L^2$ is preferably a group having 1 to 15 carbon atoms in total, and is particularly preferably an unsubstituted group. Here, the number of carbon atoms in total of $L^2$ means the total number of carbon atoms contained in the substituted or unsubstituted divalent organic group represented by $L^2$.

Specific examples thereof include a methylene group, an ethylene group, a propylene group, a butylene group, a phenylene group, these groups which have been substituted with a methoxy group, a hydroxyl group, a chlorine atom, a bromine atom, a fluorine atom or the like, and groups formed by combining any of these.

Preferable example of the nitrile group-containing polymerizable polymer of the invention include a polymer in which the unit represented by Formula (1) is a unit represented by the following Formula (3).

Formula (3)

In Formula (3), $R^1$ and $R^2$ each independently represent a hydrogen atom or a substituted or unsubstituted alkyl group; Z represents a single bond, a substituted or unsubstituted divalent organic group, an ester group, an amide group, or an ether group; W represents an oxygen atom or NR in which R represents a hydrogen atom or an alkyl group, and preferably represents a hydrogen atom or an unsubstituted alkyl group having 1 to 5 carbon atoms; and $L^1$ represents a substituted or unsubstituted divalent organic group.

$R^1$ and $R^2$ in Formula (3) have the same definitions as $R^1$ and $R^2$ in Formula (1), and the same applies to the preferable examples thereof.

Z in Formula (3) has the same definition as Z in Formula (1), and the same applies to the preferable examples thereof.

$L^1$ in Formula (3) also has the same definition as $L^1$ in Formula (1), and the same applies to the preferable examples thereof.

With respect to the nitrile group-containing polymerizable polymer of the invention, the unit represented by Formula (3) is preferably a unit represented by the following Formula (4).

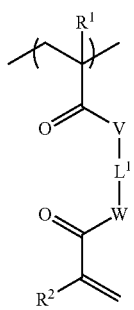

Formula (4)

In Formula (4), $R^1$ and $R^2$ each independently represent a hydrogen atom, or a substituted or unsubstituted alkyl group; V and W each independently represent an oxygen atom, or NR; R represents a hydrogen atom or an alkyl group, and preferably represents a hydrogen atom or an unsubstituted alkyl group having 1 to 5 carbon atoms; and $L^1$ represents a substituted or unsubstituted divalent organic group.

$R^1$ and $R^2$ in Formula (4) have the same definitions as $R^1$ and $R^2$ in Formula (1), and the same applies to the preferable examples thereof.

$L^1$ in Formula (4) has the same definition as $L^1$ in Formula (1), and the same applies to the preferable examples thereof.

In Formula (3) and Formula (4), W is preferably an oxygen atom.

In Formula (3) and Formula (4), $L^1$ is preferably an unsubstituted alkylene group, or a divalent organic group having a urethane bond or a urea bond, more preferably a divalent organic group having a urethane bond, and among these, one such group having 0.1 to 9 carbon atoms in total is particularly preferable.

With respect to the nitrile group-containing polymerizable polymer of the invention, the unit represented by Formula (2) is preferably a unit represented by the following Formula (5).

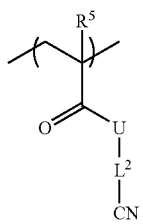

Formula (5)

In Formula (5), $R^5$ represents a hydrogen atom, or a substituted or unsubstituted alkyl group; U represents an oxygen atom, or NR'; R' represents a hydrogen atom or an alkyl group, and preferably represents a hydrogen atom or an unsubstituted alkyl group having 1 to 5 carbon atoms; and $L^2$ represents a substituted or unsubstituted divalent organic group.

$R^5$ in Formula (5) has the same definition as $R^1$ and $R^2$ in Formula (1), and is preferably a hydrogen atom.

$L^2$ in Formula (5) has the same definition as $L^2$ in Formula (1), and is preferably a linear, branched or cyclic alkylene group, an aromatic group, or a group resulting from a combination of any of these groups.

In embodiments, the unit represented by Formula (5) can be a structure in which the linkage site to the cyano group in $L^2$ is a divalent organic group having a linear, branched or cyclic alkylene group, and among them, a structure in which the divalent organic group has 1 to 10 carbon atoms in total is more preferable.

In other preferable embodiments, the unit represented by Formula (5) can be a structure in which the linkage site to the cyano group in $L^2$ is a divalent organic group having an aromatic group, and among them, a structure in which the divalent organic group has 6 to 15 carbon atoms in total is more preferable.

The nitrile group-containing polymerizable polymer of the invention is formed by containing the unit represented by any one of Formula (1) to Formula (5), and is a polymer having a polymerizable group and a nitrile group in its side chain(s).

The nitrile group-containing polymerizable polymer may be synthesized, for example, as follows.

Examples of the type of the polymerization reaction usable for the synthesis of the nitrile group-containing polymerizable polymer of the invention include radical polymerization, cationic polymerization and anionic polymerization. From the viewpoint of regulation of the reaction, radical polymerization or cationic polymerization can be preferably employed.

The synthesis method of the nitrile group-containing polymerizable polymer of the invention is varied to be: 1) a method employed in the case where the mode of polymerization for forming the polymer main chain is different from the mode to polymerize the polymerizable group to be introduced into the side chain, and 2) a method employed in the case where the mode of polymerization for forming the polymer main chain is identical to the mode to polymerize the polymerizable group to be introduced into the side chain.

1) Embodiment in which Mode of Polymerization for Forming Polymer Main Chain is Different from Mode to Polymerize Polymerizable Group to be Introduced into Side Chain Embodiments in which the mode of polymerization for forming the polymer main chain is different from the mode to polymerize the polymerizable group to be introduced into the side chain includes: 1-1) an occasion in which formation of the polymer main chain is performed by cationic polymerization, and the mode to polymerize the polymerizable group to be introduced into the side chain is radical polymerization; and 1-2) an occasion in which formulation of the polymer main chain is performed by radical polymerization, and the mode to polymerize the polymerizable group to be introduced into the side chain is cationic polymerization.

1-1) Occasion in which formation of polymer main chain is performed by cationic polymerization, and mode to polymerize polymerizable group to be introduced into side chain is radical polymerization In the invention, examples of the monomer which may be used in the occasion in which formation of the polymer main chain is performed by cationic polymerization and the mode to polymerize the polymerizable group to be introduced into the side chain is radical polymerization include the following compounds.

Monomer Used in Formation of Polymerizable Group-containing Unit

Examples of the monomer which may be used in the formation of the polymerizable group-containing unit used in the embodiment include vinyl (meth)acrylate, allyl (meth)acrylate, 4-(meth)acryloylbutane vinyl ether, 2-(meth)acryloylethane vinyl ether, 3-(meth)acryloylpropane vinyl ether, (meth)acryloyloxydiethylene glycol vinyl ether, (meth)acryloyloxytriethylene glycol vinyl ether, (meth)acryloyl 1st terpineol, 1 (meth)acryloyloxy-2-methyl-2-propene, 1-(meth)acryloyloxy-3-methyl-3-butene, 3-methylene-2-(meth)acryloyloxy-norbornane, 4,4'-ethylidenediphenol di(meth)acrylate, methacrolein di(meth)acryloylacetal, p-((meth)acryloylmethyl)styrene, allyl (meth)acrylate, vinyl 2-(bromomethyl)acrylate, allyl 2-(hydroxymethyl)acrylate, and the like.

Monomer Used in Formation of Nitrile Group-containing Unit

Examples of the monomer which may be used in the formation of the nitrile group-containing unit used in the embodiment include 2-cyanoethyl vinyl ether, cyanomethyl vinyl ether, 3-cyanopropyl vinyl ether, 4-cyanobutyl vinyl ether, 1-(p-cyanophenoxy)-2-vinyloxy-ethane, 1-(o-cyanophenoxy)-2-vinyloxy-ethane, 1-(m-cyanophenoxy)-2-vinyloxy-ethane, 1-(p-cyanophenoxy)-3-vinyloxy-propane, 1-(p-cyanophenoxy)-4-vinyloxy-butane, o-cyanobenzyl vinyl ether, m-cyanobenzyl vinyl ether, p-cyanobenzyl vinyl ether, allyl cyanide, allylcyanoacetic acid, and the following compounds.

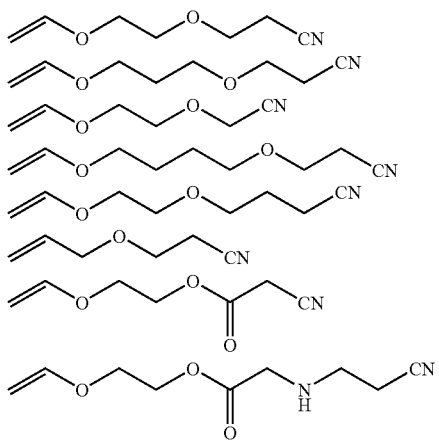

As for the polymerization method, the methods described in Lectures on Experimental Chemistry, "Polymer Chemistry," Chapter 2-4 (p. 74), or the general cationic polymerization methods described in "Experimental Methods in Polymer Synthesis," written by Takayuki Otsu, Chapter 7 (p. 195), may be used. In addition, examples of the initiator that may be used in the cationic polymerization include protonic acids, metal halides, organometallic compounds, organic salts, metal oxides, solid acids and halogens. Among these, metal halides and organometallic compounds are preferable since they are initiators which are highly active and are capable of synthesizing high molecular weight polymers.

Specific examples include boron trifluoride, boron trichloride, aluminum chloride, aluminum bromide, titanium tetrachloride, tin tetrachloride, tin bromide, phosphorus pentafluoride, antimony chloride, molybdenum chloride, tungsten chloride, iron chloride, dichloroethylaluminum, chlorodiethylaluminum, dichloromethylaluminum, chlorodimethylaluminum, trimethylaluminum, trimethylzinc, and methyl Grignard reagents.

1-2) Occasion in which Formulation of Polymer Main Chain is Performed by Radical Polymerization, and Mode to Polymerize Polymerizable Group to be Introduced into Side Chain is Cationic Polymerization In the invention, examples of the monomer which may be used in the occasion in which formation of the polymer main chain is performed by radical polymerization and the mode to polymerize the polymerizable group to be introduced into the side chain is cationic polymerization include the following compounds.

Monomer Used in Formation of Polymerizable Group-containing Unit

The same monomers as the monomers used in the formation of the polymerizable group-containing unit which have been mentioned for the occasion 1-1) may be used herein.

Monomers Used in Formation of Nitrile Group-containing Unit

Examples of the monomer used in the formation of the nitrile group-containing unit used in the embodiment include cyanomethyl (meth)acrylate, 2-cyanoethyl (meth)acrylate, 3-cyanopropyl (meth)acrylate, 2-cyanopropyl (meth)acrylate, 1-cyanoethyl (meth)acrylate, 4-cyanobutyl (meth)acrylate, 5-cyanopentyl (meth)acrylate, 6-cyanohexyl (meth)acrylate, 7-cyanohexyl (meth)acrylate, 8-cyanohexyl (meth)acrylate, 2-cyanoethyl (3-(bromomethyl)acrylate), 2-cyanoethyl (3-(hydroxymethyl)acrylate), p-cyanophenyl (meth)acrylate, o-cyanophenyl (meth)acrylate, m-cyanophenyl (meth)acrylate, 5-(meth)acryloyl-2-carbonitrilo-norbornene, 6-(meth)acryloyl-2-carbonitrilo-norbornene, 1-cyano-1-(meth)acryloyl-cyclohexane, 1,1-dimethyl-1-cyano-(meth)acrylate, 1-dimethyl-1-ethyl-1-cyano-(meth)acrylate, o-cyanobenzyl (meth)acrylate, m-cyanobenzyl (meth)acrylate, p-cyanobenzyl (meth)acrylate, 1-cyanocycloheptyl acrylate, 2-cyanophenyl acrylate, 3-cyanophenyl acrylate, vinyl cyanoacetate, vinyl 1-cyano-1-cyclopropanecarboxylate, allyl cyanoacetate, allyl 1-cyano-1-cyclopropanecarboxylate, N,N-dicyanomethyl (meth)acrylamide, N-cyanophenyl (meth)acrylamide, allyl cyanomethyl ether, allyl-o-cyanoethyl ether, allyl-m-cyanobenzyl ether, allyl-p-cyanobenzyl ether, and the like.

Further, the monomers having a structure in which a part of hydrogen atoms of the above-mentioned monomers have been substituted with a hydroxyl group, an alkoxy group, halogen, a cyano group or the like may also be used.

As for the polymerization method, the methods described in Lectures on Experimental Chemistry, "Polymer Chemistry," Chapter 2-2 (p. 34), or the general radical polymerization methods described in "Experimental Methods in Polymer Synthesis," written by Takayuki Otsu, Chapter 5 (p. 125), may be used. In addition, high temperature initiators which require heating to 100° C. or higher, normal initiators which initiate by heating at 40 to 100° C., redox initiators which initiate at very low temperature, and the like are known as for the initiator for radical polymerization. From the viewpoints of the stability of the initiator and easiness in handling property of the polymerization reaction, normal initiators can be preferable.

Examples of the normal initiators include benzoyl peroxide, lauroyl peroxide, peroxodisulfate, azobisisobutyronitrile, and azobis-2,4-dimethylvaleronitrile.

2) Occasion in which Mode of Polymerization for Forming Polymer Main Chain is Identical to Mode to Polymerize Polymerizable Group to be Introduced into Side Chain The occasion in which the mode of polymerization for forming the polymer main chain is identical to the mode to polymerize the polymerizable group to be introduced into the side chain, includes: 2-1) an occasion in which both modes are cationic polymerization; and 2-2) an occasion in which both modes are radical polymerization.

2-1) Occasion in which Both Modes are Cationic Polymerization

In the occasion in which both modes are cationic polymerization, the same monomers as the monomers used for forming the nitrile group-containing unit mentioned in the above-described occasion 1-1) may be used as the monomer having a nitrile group.

From the viewpoint of preventing gelation during the polymerization, it is preferable to use a method including synthesizing a polymer having a nitrile group in advance and then reacting the polymer with a compound having a polymerizable group which is capable of cationic polymerization (hereinafter, appropriately referred to as "reactive compound") to introduce the polymerizable group which is capable of cationic polymerization into the side chain.

It is preferable that, in view of the reaction with the reactive compound, the polymer having a nitrile group has a reactive group such as those shown below.

It is also preferable that the polymer having a nitrile group and the reactive compound is appropriately selected so as to provide the combination of functional groups such as shown below.

Specific examples of the combination, which is shown in the form of "(reactive group of polymer, functional group of reactive compound)", include: (carboxyl group, carboxyl group), (carboxyl group, epoxy group), (carboxyl group, isocyanate group), (carboxyl group, benzyl halide), (hydroxyl group, carboxyl group), (hydroxyl group, epoxy group), (hydroxyl group, isocyanate group), (hydroxyl group, benzyl halide), (isocyanate group, hydroxyl group), (isocyanate group, carboxyl group), and the like.

Here, specific examples of the reactive compound include allyl alcohol, 4-hydroxybutane vinyl ether, 2-hydroxyethane vinyl ether, 3-hydroxypropane vinyl ether, hydroxytriethylene glycol vinyl ether, 1st terpineol, 2-methyl-2-propenol, 3-methyl-3-butenol, 3-methylene-2-hydroxynorbornane, and p-(chloromethyl)styrene.

2-2) Occasion in which Both Modes are Radical Polymerization

In the occasion in which both modes are cationic polymerization, the synthesis method can be: i) a method of copolymerizing a monomer having a nitrile group and a monomer having a polymerizable group; ii) a method of copolymerizing a monomer having a nitrile group and a monomer having a double bond precursor, and then introducing a double bond by treatment with a base or the like; and iii) a method of reacting a polymer having a nitrile group with a monomer having a polymerizable group to introduce a double bond (introducing a polymerizable group). Preferable from the viewpoint of synthesis suitability are: ii) a method of copolymerizing a monomer having a nitrile group and a monomer having a double bond precursor, and then introducing a double bond by treatment with a base or the like; and iii) a method of reacting a polymer having a nitrile group with a monomer having a polymerizable group to introduce a polymerizable group.

Examples of the monomer having a polymerizable group that is used in the synthesis method i) include allyl (meth) acrylate and the following compounds.

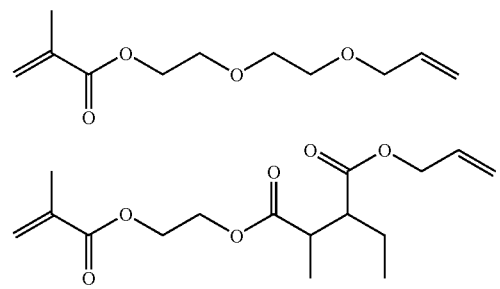

Examples of the monomer having a double bond precursor that is used in the synthesis method ii) include compounds represented by the following Formula (a).

Formula (a)

In Formula (a), A is an organic group having a polymerizable group; $R^1$ to $R^3$ each independently represent a hydrogen atom or a monovalent organic group; and B and C each represent a leaving group which is removed by an elimination reaction, while the elimination reaction as used herein means that C is pulled out under the action of a base and B is eliminated. It is preferable that B is eliminated as an anion and C is eliminated as a cation.

Specific examples of the compound represented by Formula (a) include the following compounds.

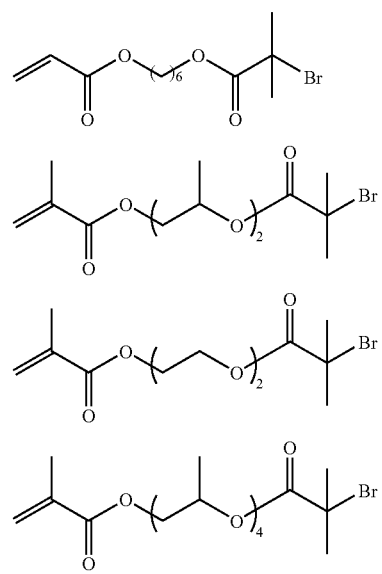

-continued

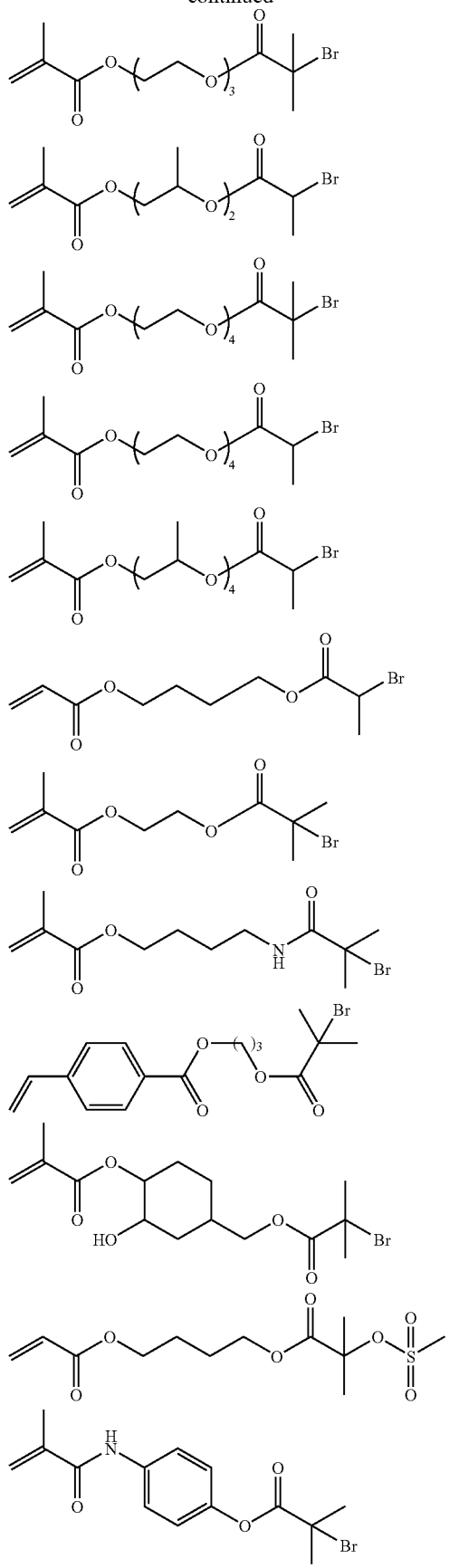

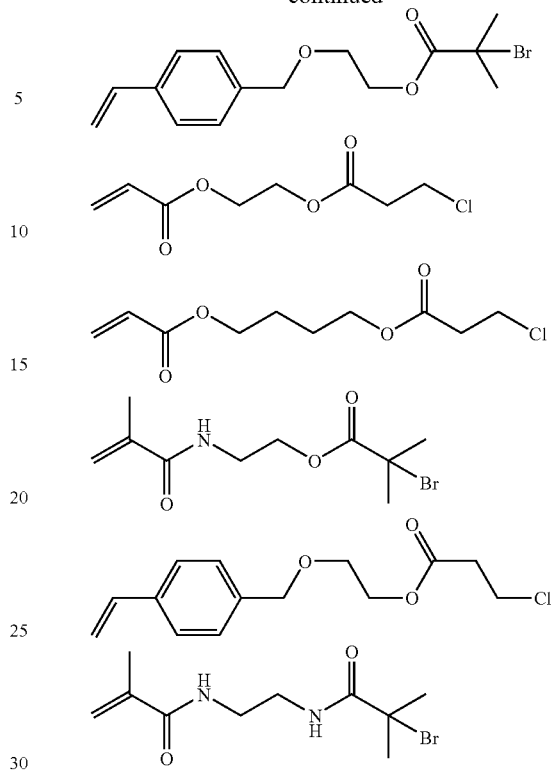

Further, in the synthesis method of ii) above, in order to convert a double bond precursor to a double bond, a method of removing the leaving groups represented by B and C through an elimination reaction, that is, a method of pulling out C under the action of a base so that B is eliminated, is used.

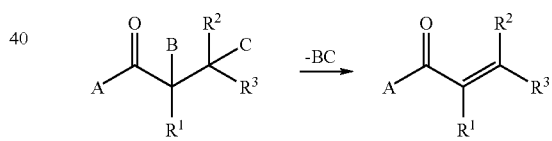

Preferable examples of the base used in the elimination reaction include hydrides, hydroxides or carbonates of alkali metals, organic amine compounds, and metal alkoxide compounds. Preferable examples of the hydrides, hydroxides or carbonates of alkali metals include sodium hydride, calcium hydride, potassium hydride, sodium hydroxide, potassium hydroxide, calcium hydroxide, potassium carbonate, sodium carbonate, potassium hydrogen carbonate, sodium hydrogen carbonate, and the like. Preferable examples of the organic amine compounds include trimethylamine, triethylamine, diethylmethylamine, tributylamine, triisobutylamine, trihexylamine, trioctylamine, N,N-dimethylcyclohexylamine, N,N-diethylcyclohexylamine, N-methyldicyclohexylamine, N-ethyldicyclohexylamine, pyrrolidine, 1-methylpyrrolidine, 2,5-dimethylpyrrolidine, piperidine, 1-methylpiperidine, 2,2,6,6-tetramethylpiperidine, piperazine, 1,4-dimethylpiperazine, quinuclidine, 1,4-diazabicyclo[2,2,2]-octane, hexamethylenetetramine, morpholine, 4-methylmorpholine, pyridine, picoline, 4-dimethylaminopyridine, lutidine, 1,8-diazabicyclo[5,4,0]-7-undecene (DBU), N,N'-dicyclohexylcarbodiimide (DCC), diisopropylethylamine, Schiff bases, and the like. Preferable examples of the metal alkoxide compound include sodium methoxide, sodium ethoxide, potassium t-butoxide, and the like. These bases may be used alone, or as a mixture of two or more species thereof.

Examples of the solvent that is used in the elimination reaction when a base is provided (added) include ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethylformamide, N,N-dimethylacetamide, dimethylsulfoxide, toluene, ethyl acetate, methyl lactate, ethyl lactate, water, and the like. These solvents may be used alone or as a mixture two or more species thereof.

The amount of the base used may be an equivalent or less, or may also be an equivalent or more, relative to the amount of a particularly functional group in the compound (leaving groups represented by B or C). Further, in the case of using excessive base, it is also preferable to add an acid or the like for the purpose of removing excessive base after the elimination reaction.

The polymer having a nitrile group, which is used in the synthesis method of iii) above, can be synthesized by radical polymerizing a monomer mentioned in the exemplary embodiment of 1-2) as that used in the formation of the nitrile group-containing unit and a monomer having a reactive group for introducing a double bond.

Examples of the monomer having a reactive group for introducing a double bond include a monomer having a carboxyl group, a hydroxyl group, an epoxy group or an isocyanate group as the reactive group.

Examples of the carboxyl group-containing monomer include (meth)acrylic acid, itaconic acid, vinyl benzoate; ARONIX M-5300, M-5400 and M-5600 (all trade names) manufactured by Toagosei Co., Ltd.; ACRYLESTER PA and HH (all trade names) manufactured by Mitsubishi Rayon Co., Ltd.; LIGHT ACRYLATE HOA-HH (all trade names) manufactured by Kyoeisha Chemical Co., Ltd.; NK ESTER SA and A-SA (all trade names) manufactured by Nakamura Chemical Co., Ltd.; and the like.

Examples of the hydroxyl group-containing monomer include 2-hydroxyethyl (meth)acrylate, 4-hydroxybutyl (meth)acrylate, 2-hydroxypropyl (meth)acrylate, 2-hydroxybutyl (meth)acrylate, 1-(meth)acryloyl-3-hydroxy-adamantane, hydroxymethyl(meth)acrylamide, 2-(hydroxymethyl)-(meth)acrylate, methyl ester of 2-(hydroxymethyl)-(meth)acrylate, 3-chloro-2-hydroxypropyl (meth)acrylate, 3,5-dihydroxypentyl (meth)acrylate, 1-hydroxymethyl-4-(meth)acryloylmethyl-cyclohexane, 2-hydroxy-3-phenoxypropyl (meth)acrylate, 1-methyl-2-acryloyloxypropylphthalic acid, 2-acryloyloxyethyl-2-hydroxyethylphthalic acid, 1-methyl-2-acryloyloxyethyl-2-hydroxypropylphthalic acid, 2-acryloyloxyethyl-2-hydroxy-3-chloropropylphthalic acid; ARONIX M-554, M-154, M-555, M-155, M-158 (all trade names) manufactured by Toagosei Co., Ltd.; BLENMER PE-200, PE-350, PP-500, PP-800, PP-1000, 70PEP-350B, 55PET800 (all trade names) manufactured by Nippon Oil & Fats Co., Ltd.; and lactone-modified acrylates having the following structure.

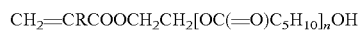

(wherein R is H or a methyl group, and n is 1 to 5)

Examples of the monomer having an epoxy group include glycidyl (meth)acrylate, CYCLOMER A and M (all trade names) manufactured by Daicel Chemical Industries, Ltd., and the like.

Examples of the monomer having an isocyanate group include KARENZ AOI and MOI (all trade names) manufactured by Showa Denko Kabushiki Kaisha.

The polymer having a nitrile group, which is used in the synthesis method of iii), may further contain a third copolymerizable component.

In the synthesis method of iii), the monomer having a polymerizable group which is reacted with the polymer having a nitrile group varies with the kind of the reactive group in the polymer having a nitrile group.

Monomers having the following combinations of functional groups may be used.

Namely, examples of the combination, which is shown in a form of "(reactive group of polymer, functional group of monomer)", include (carboxyl group, carboxyl group), (carboxyl group, epoxy group), (carboxyl group, isocyanate group), (carboxyl group, benzyl halide), (hydroxyl group, carboxyl group), (hydroxyl group, epoxy group), (hydroxyl group, isocyanate group), (hydroxyl group, benzyl halide), (isocyanate group, hydroxyl group), (isocyanate group, carboxyl group), (epoxy group, carboxyl group), and the like may be mentioned.

Specific examples include the following monomers.

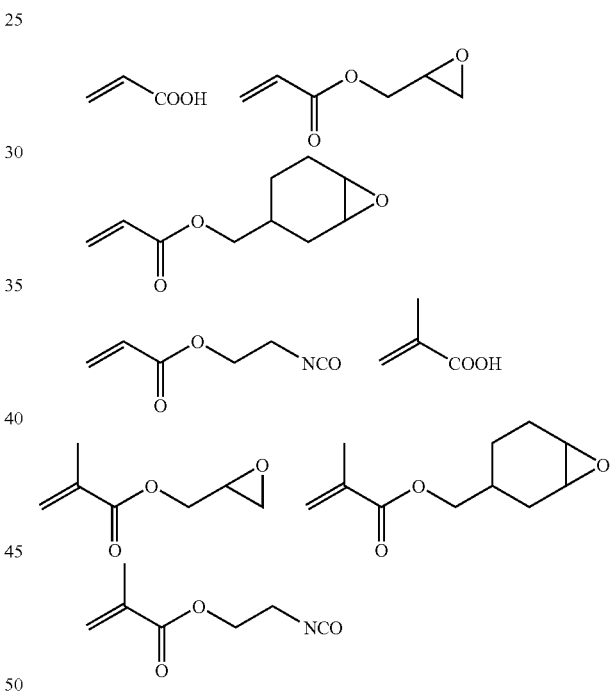

When $L^1$ in Formula (1), Formula (3) or Formula (4) in the nitrile group-containing polymerizable polymer of the invention has a structure of a divalent organic group having a urethane bond, it is preferable to synthesize the polymer by the synthesis method shown below (method of synthesizing the polymer of the invention).

The method of synthesizing the polymer of the invention can be characterized by having at least forming, in a solvent, a urethane bond in $L^1$ by adding an isocyanate group to an hydroxyl group, employing a polymer having the hydroxyl group in a side chain and a compound having the isocyanate group and a polymerizable group.

Here, preferable examples of the polymer having a hydroxyl group in a side chain, which is used in the method of synthesizing the polymer of the invention, include the copolymers formed from the monomers used in the formation of the nitrile group-containing unit mentioned in the embodiment 1-2) above, and the hydroxyl group-containing (meth)acrylate exemplified below.

Examples of the hydroxyl group-containing (meth)acrylate include 2-hydroxyethyl (meth)acrylate, 4-hydroxybutyl (meth)acrylate, 2-hydroxypropyl (meth)acrylate, 2-hydroxybutyl (meth)acrylate, 1-(meth)acryloyl-3-hydroxy-adamantane, hydroxymethyl(meth)acrylamide, 2-(hydroxymethyl)-(meth)acrylate, methyl ester of 2-(hydroxymethyl)-(meth) acrylate, 3-chloro-2-hydroxypropyl (meth)acrylate, 3,5-dihydroxypentyl (meth)acrylate, 1-hydroxymethyl-4-(meth) acryloylmethyl-cyclohexane, 2-hydroxy-3-phenoxypropyl (meth)acrylate, 1-methyl-2-acryloyloxypropylphthalic acid, 2-acryloyloxyethyl-2-hydroxyethylphthalic acid, 1-methyl-2-acryloyloxyethyl-2-hydroxypropylphthalic acid, 2-acryloyloxyethyl-2-hydroxy-3-chloropropylphthalic acid; ARONIX M-554, M-154, M-555, M-155, M-158 (all trade names) manufactured by Toagosei Co., Ltd.; BLENMER PE-200, PE-350, PP-500, PP-800, PP-1000, 70PEP-350B, 55PET800 (all trade names) manufactured by Nippon Oil & Fats Co., Ltd.; and lactone-modified acrylates having the following structure.

$CH_2=CRCOOCH_2CH_2[OC(=O)C_5H_{10}]_nOH$ (wherein R is H or a methyl group, and n is 1 to 5)

The polymer having a hydroxyl group in a side chain, which is used in the method synthesizing the polymer of the invention, may further contain a third copolymerizable component.

Among the polymers having a hydroxyl group in a side chain described above, from the viewpoint of synthesizing a polymer having a high molecular weight, it is preferable to use a polymer synthesized by using a raw material from which a bifunctional acrylate, which is byproduced during the synthesis of hydroxyl group-containing (meth)acrylate, has been removed. A method employed for the purification can be preferably distillation or column purification. More preferably, the polymer having a hydroxyl group in a side chain thereof is synthesized using a hydroxyl group-containing (meth)acrylate obtained by sequentially performing the following processes (1) to (4):

(1) dissolving, in water, a mixture containing the hydroxyl group-containing (meth)acrylate and a bifunctional acrylate which is byproduced upon synthesis of the hydroxyl group-containing (meth)acrylate;

(2) adding, to the obtained aqueous solution, a first organic solvent which is separable from water, and then separating a phase containing the first organic solvent and the bifunctional acrylate from the aqueous phase;

(3) dissolving, in the aqueous phase, a compound having higher water-solubility than that of the hydroxyl group-containing (meth)acrylate; and (4) adding a second organic solvent to the aqueous phase, extracting the hydroxyl group-containing (meth)acrylate, and then concentrating the extract.

The mixture used in the process of (1) contains a hydroxyl group-containing (meth)acrylate and the bifunctional acrylate which is an impurity byproduced during the synthesis of the hydroxyl group-containing (meth)acrylate, and corresponds to a general commercially available product of hydroxyl group-containing (meth)acrylate.

In the process of (1), this commercially available product (mixture) can be dissolved in water, and an aqueous solution is obtained.

In the process of (2), a first organic solvent which is separable from water is added to the aqueous solution obtained in the process of (1). Examples of the first organic solvent used herein include ethyl acetate, diethyl ether, benzene, toluene and the like.

Thereafter, the layer containing this first organic solvent and the bifunctional acrylate (oily phase) is separated from the aqueous solution (aqueous phase).

In the process of (3), a compound having higher water-solubility than the hydroxyl group-containing (meth)acrylate is dissolved in the aqueous phase separated from the oily phase in the process of (2).

Examples of the compound having higher water-solubility than the hydroxyl group-containing (meth)acrylate as used herein include inorganic salts such as: alkali metal salts such as sodium chloride or potassium chloride; or alkaline earth metal salts such as magnesium sulfate or calcium sulfate.

In the process of (4), a second organic solvent is added to the aqueous phase to extract the hydroxyl group-containing (meth)acrylate, and then the extract is concentrated.

Examples of the second organic solvent used herein include ethyl acetate, diethyl ether, benzene, toluene and the like. This second organic solvent may be the same as the first organic solvent, or may be different therefrom.

The concentrating in the process of (4) can be performed by utilizing drying by anhydrous magnesium sulfate, distillation off under reduced pressure, or the like.

The isolated product containing the hydroxyl group-containing (meth)acrylate, which is obtained by sequentially performing the processes (1) to (4), preferably contains the bifunctional acrylate in an amount of 0.10% by mass or less with respect to the total mass of the isolated product. That is, by performing the processes of (1) to (4), the bifunctional acrylate which is an impurity is removed from the mixture, and thus the hydroxyl group-containing (meth)acrylate is purified.

The content of the bifunctional acrylate is more preferably in an amount of 0.05% by mass or less with respect to the total mass of the isolated product, and a smaller content is better.

When the hydroxyl group-containing (meth)acrylate thus purified is used, an influence to the polymerization reaction, which is caused by the impurity bifunctional acrylate, may tend to be hardly exered, and thus the nitrile group-containing polymerizable polymer may be synthesized to have a weight average molecular weight of 20,000 or more.

As for the hydroxyl group-containing (meth)acrylate used in the process of (1), those previously mentioned as the hydroxyl group-containing (meth)acrylate used during the synthesis of the polymer having a hydroxyl group in a side chain, which is used in the method of synthesizing the polymer of the invention, may be used. Among them, from the viewpoint of the reactivity with isocyanate, a monomer having a primary hydroxyl group is preferable, and further, from the viewpoint of increasing the ratio of polymerizable group per unit weight of the polymer, a hydroxyl group-containing (meth)acrylate having a molecular weight of 100 to 250 is preferable.

Examples of the compound having an isocyanate group and a polymerizable group which is used in the method of synthesizing the polymer of the invention include 2-acryloyloxyethyl-isocyanate (trade name: KARENZ AOI, manufactured by Showa Denko Kabushiki Kaisha) and 2-methacryloxyisocyanate (trade name: KARENZ MOI, manufactured by Showa Denko Kabushiki Kaisha).

Further, a solvent having an SP value (calculated by the Okitsu method) of 20 to 23 $MPa^{1/2}$ is preferable as the solvent used in the method of synthesizing the polymer of the invention. Specific examples thereof include ethylene glycol diacetate, diethylene glycol diacetate, propylene glycol diacetate, methyl acetoacetate, ethyl acetoacetate, 1,2,3-triacetoxy-propane, cyclohexanone, 2-(1-cyclohexenyl)cyclohexanone, propionitrile, N-methylpyrrolidone, dimethylacetamide, acetylacetone, acetophenone, triacetin, 1,4-dioxane, and dimethyl carbonate.

Among them, from the viewpoint of synthesizing a high molecular weight polymer, the solvent is more preferably an ester solvent, and in particular, a diacetate solvent such as ethylene glycol diacetate or diethylene glycol diacetate, or dimethyl carbonate, is more preferable.

The SP value of the solvent referred herein is a value calculated by the Okitsu method (see "Journal of the Adhesion Society of Japan" 29(3) (1993) by Toshinao Okitsu). Specifically, the SP value is calculated by the following formula. Here, ΔF is a value disclosed in the literature.

SP value (δ)=ΣΔF (molar attraction constants)/V (molar volume)

The ranges of the contents of the polymerizable group-containing unit and the nitrile group-containing unit with respect to the total amount of copolymerizable components of the nitrile group-containing polymerizable polymer of the invention thus synthesized are preferably as follows.

That is, an amount of the polymerizable group-containing unit is preferably in the range from 5 to 50 mol %, and more preferably from 5 to 40 mol %, with respect to the total amount of the copolymerizable components. If the amount is 5 mol % or less, reactivity (curability and polymerizability) can be deteriorated, while if the amount is 50 mol % or more, the polymer is likely to gelate during the synthesis so as to make the synthesis be difficult.

From the viewpoint of the adsorbability to a plating catalyst or the like, an amount of the nitrile group-containing unit is preferably contained in an amount in the range of from 5 to 95 mol %, and more preferably in the range of from 10 to 95 mol %, with respect to the total amount of the copolymerizable components.

In addition to the nitrile group-containing unit and the polymerizable group-containing unit, the nitrile group-containing polymerizable polymer of the invention may further contain another unit. Any monomer may be used as the monomer used in the formation of this another unit as long as it does not impair the effects of the invention.

In the case of introducing a polymerizable group into the polymer as described above, when it is difficult to introduce all of the polymerizable group, a small amount of the reactive part remains, and there is a possibility that this portion may serve as the third unit.

In the case of forming the polymer main chain by radical polymerization, specific examples of the monomer used in the formation of the unit other than the nitrile group-containing unit and the polymerizable group-containing unit include unsubstituted (meth)acrylic acid esters such as ethyl (meth)acrylate, butyl (meth)acrylate, hexyl (meth)acrylate, 2-ethylhexyl (meth)acrylate, cyclohexyl (meth)acrylate, benzyl (meth)acrylate and stearyl (meth)acrylate; halogen-substituted (meth)acrylic acid esters such as 2,2,2-trifluoroethyl (meth)acrylate, 3,3,3-trifluoropropyl (meth)acrylate and 2-chloroethyl (meth)acrylate; ammonium group-substituted (meth)acrylic acid esters such as 2-(meth)acryloyloxyethyltrimethylammonium chloride; (meth)acrylamides such as butyl(meth)acrylamide, isopropyl(meth)acrylamide, octyl (meth)acrylamide and dimethyl(meth)acrylamide; styrenes such as styrene, vinylbenzoic acid and p-vinylbenzylammonium chloride; vinyl compounds such as N-vinylcarbazole, vinyl acetate, N-vinylacetamide and N-vinylcaprolactam; and also, dimethylaminoethyl (meth)acrylate, diethylaminoethyl (meth)acrylate, 2-ethylthio-ethyl (meth)acrylate, (meth)acrylic acid, 2-hydroxyethyl (meth)acrylate, and the like.

The macromonomers obtained by using the monomers described above may also be used.

In the case of forming the polymer main chain by cationic polymerization, specific examples of the monomer used in the formation of the unit other than the nitrile group-containing unit and the polymerizable group-containing unit include vinyl ethers such as ethyl vinyl ether, butyl vinyl ether, isobutyl vinyl ether, cyclohexyl vinyl ether, ethylene glycol vinyl ether, di(ethylene glycol) vinyl ether, 1,4-butanediol vinyl ether, 2-chloroethyl vinyl ether, 2-ethylhexyl vinyl ether, vinyl acetate, 2-vinyloxytetrahydropyran, vinyl benzoate and vinyl butyrate; styrenes such as styrene, p-chlorostyrene and p-methoxystyrene; terminal ethylenes such as allyl alcohol and 4-hydroxy-1-butene.

The weight average molecular weight of the nitrile group-containing polymerizable polymer of the invention is preferably 1,000 or more and 700,000 or less, and more preferably 2,000 or more and 200,000 or less. Particularly, from the viewpoint of the polymerization sensitivity, the weight average molecular weight of the nitrile group-containing polymerizable polymer of the invention is preferably 20,000 or more.

With respect to the degree of polymerization of the nitrile group-containing polymerizable polymer of the invention, it is preferable to use the polymer of 10-mers or more, and more preferable to use the polymer of 20-mers or more. Further, the polymer is preferably 7000-mers or less, more preferably 3000-mers or less, even more preferably 2000-mers or less, and particularly preferably 1000-mers or less.

Specific examples of the nitrile group-containing polymerizable polymer of the invention will be shown below, while the invention is not limited thereby.

The weight average molecular weights of these specific examples are all in the range of 3,000 to 100,000.

Polymers obtained by the embodiment 1-1)

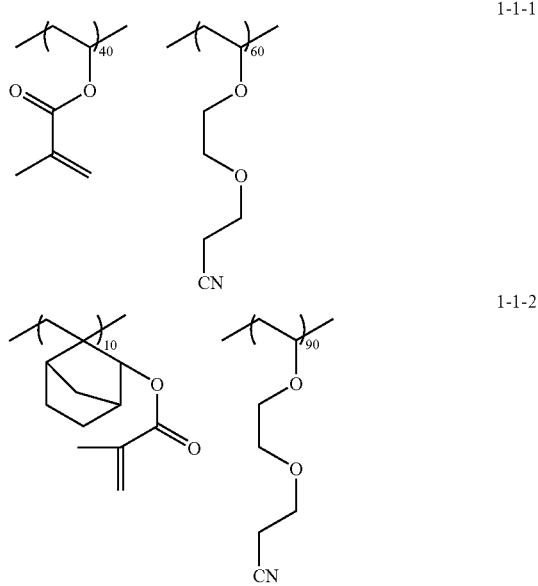

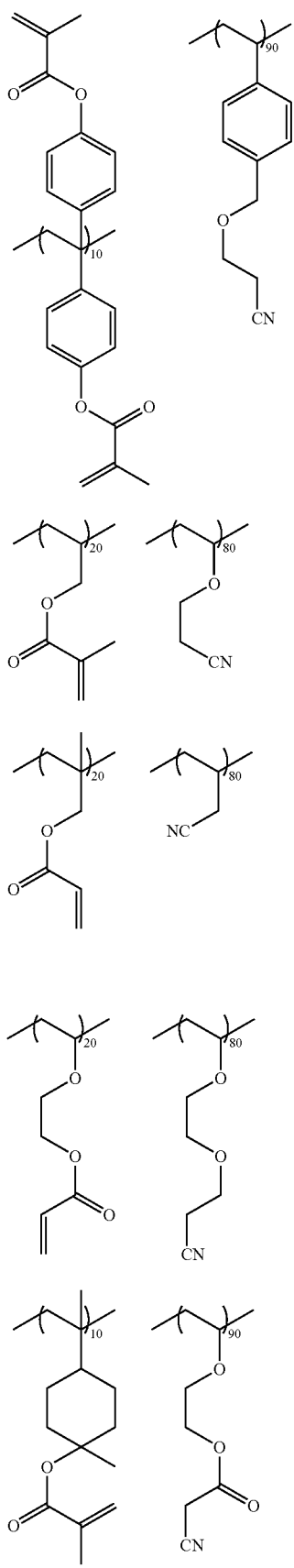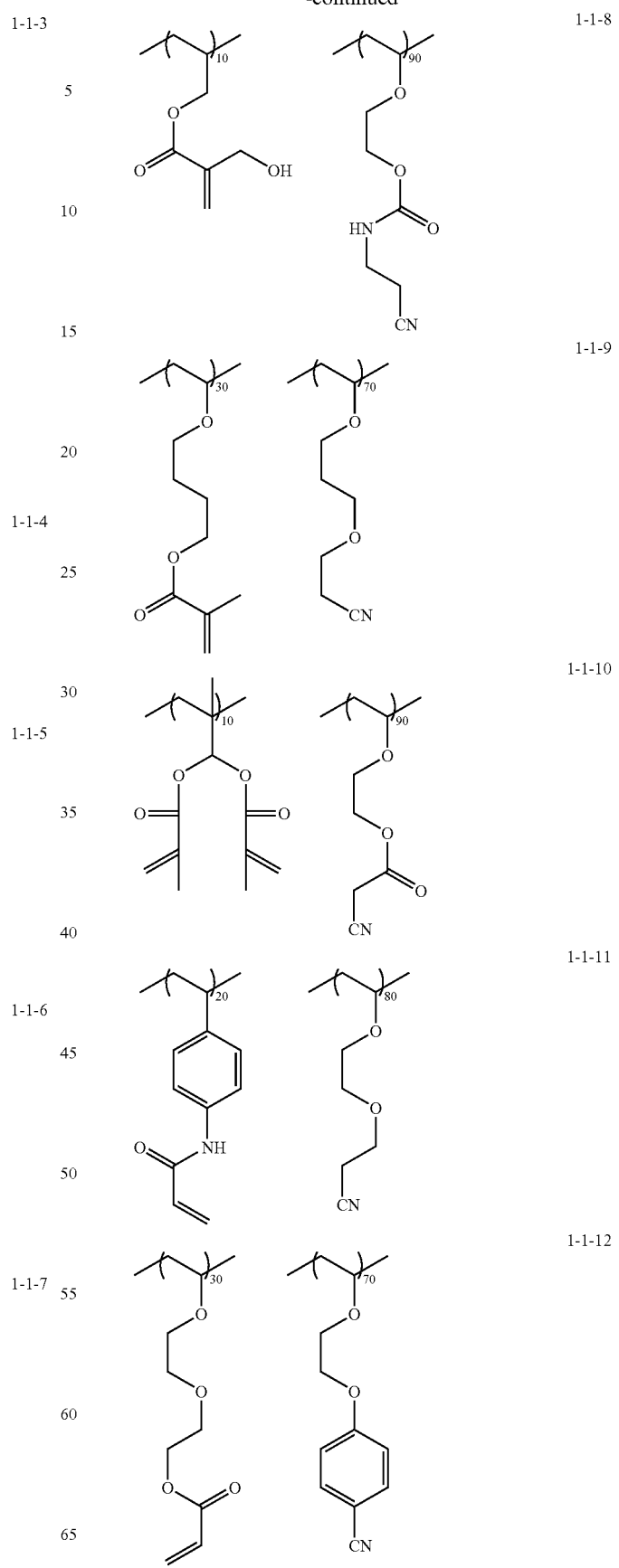

-continued
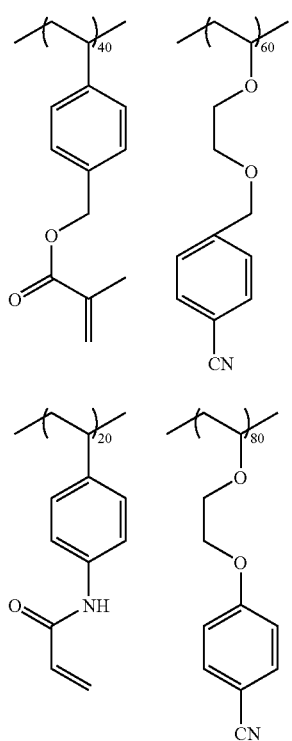
Polymers obtained by the embodiment 1-2)
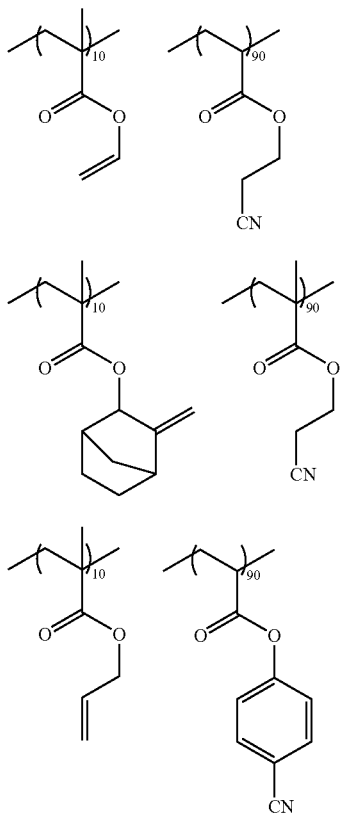
1-1-13
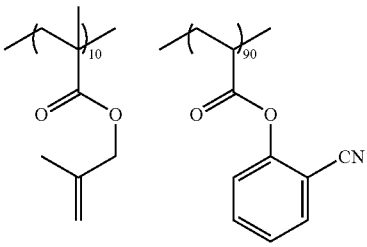
1-1-14
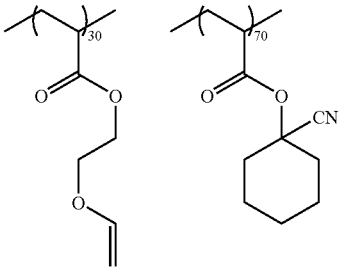
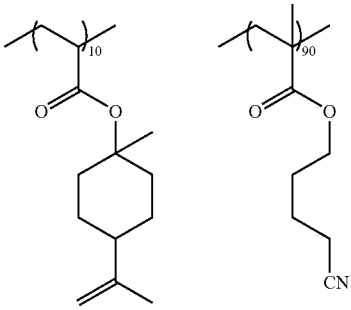
1-2-1
1-2-2
1-2-3
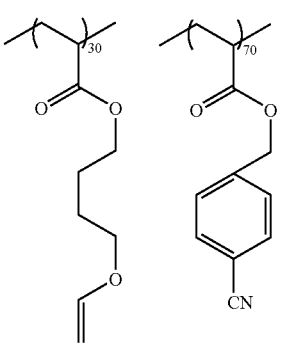
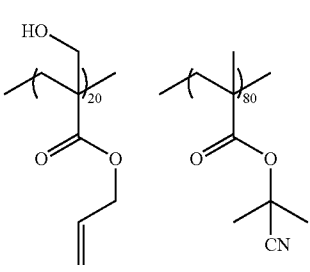
1-2-4
1-2-5
1-2-6
1-2-7
1-2-8

1-2-9
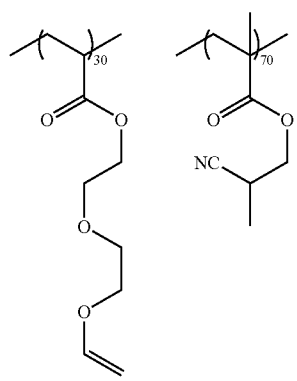
1-2-10
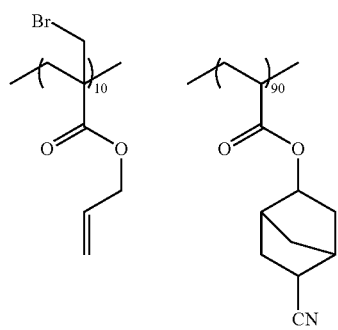
1-2-11
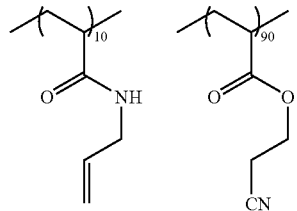
Polymers obtained by the embodiment 2-1)
2-1-1
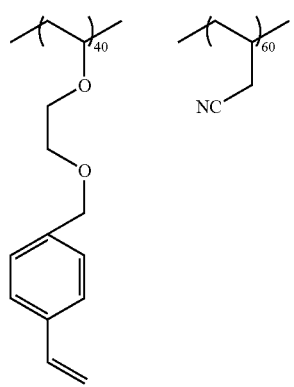
2-1-2
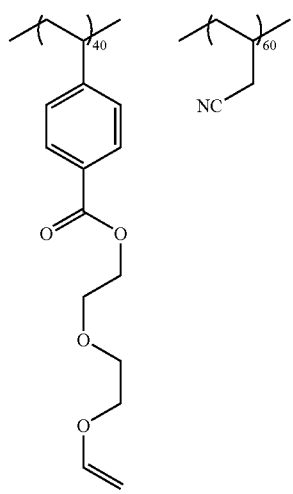
2-1-3
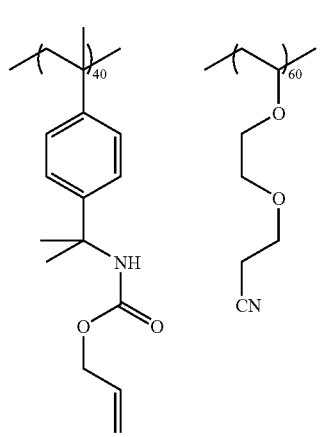
2-1-4
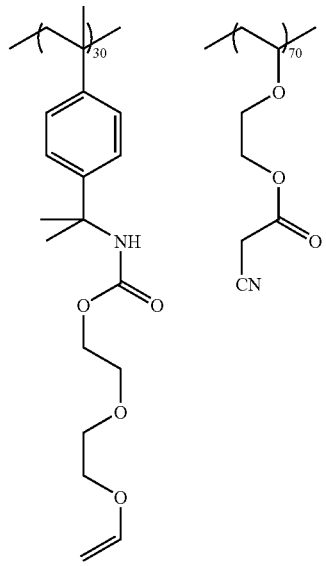

-continued
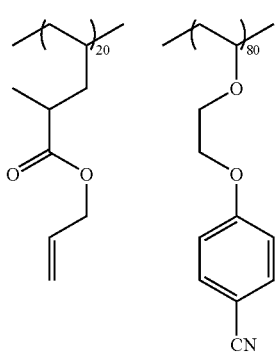
2-1-5
Polymers obtained by the embodiment 2-2)
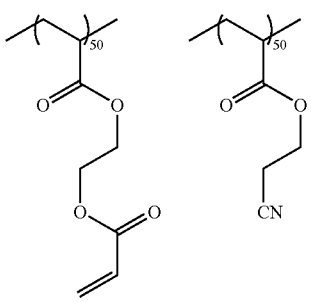
2-2-1
2-2-2
2-2-3
-continued
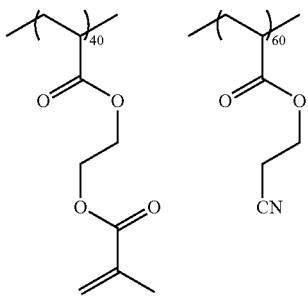
2-2-4
2-2-5
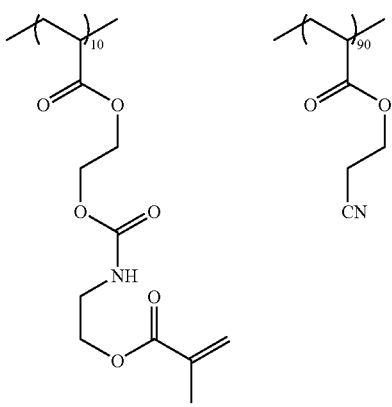
2-2-6
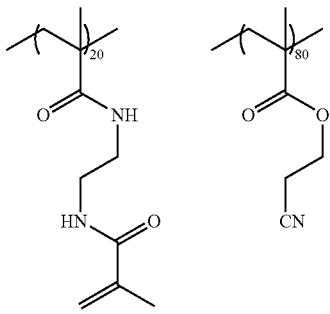
2-2-7
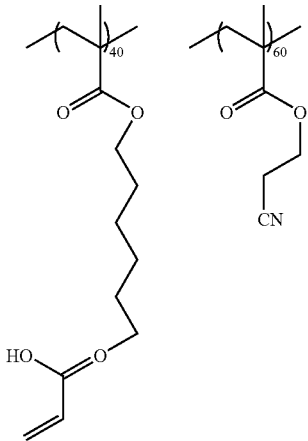

2-2-8
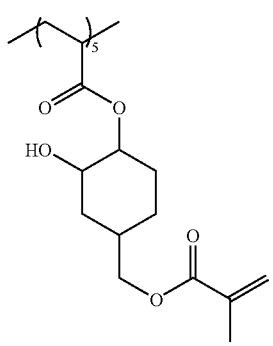 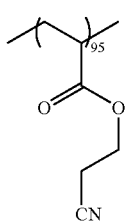
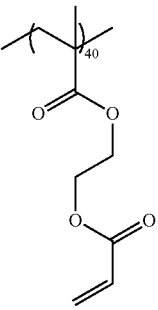 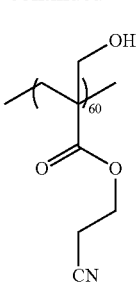
2-2-12
Polymers obtained by the embodiment 2-2)
2-2-9
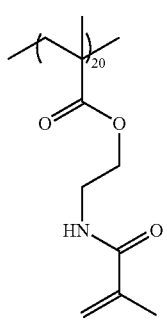 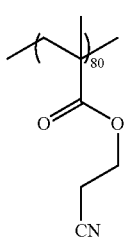
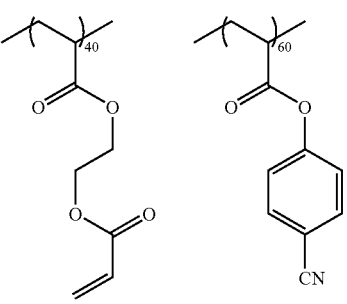
2-2-13
2-2-10
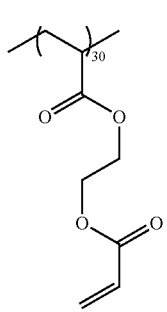 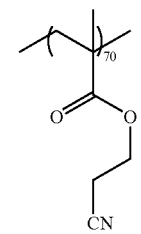
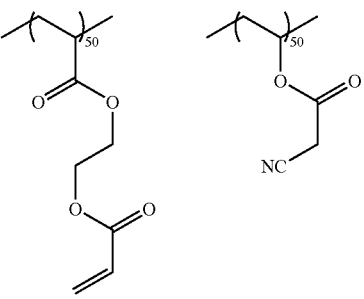
2-2-14
2-2-11
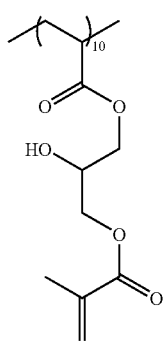 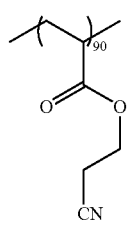
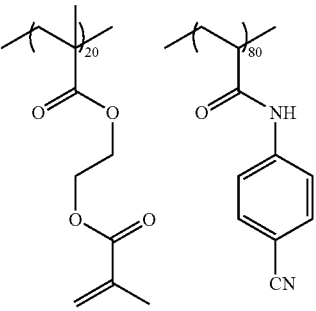
2-2-15

-continued
2-2-16
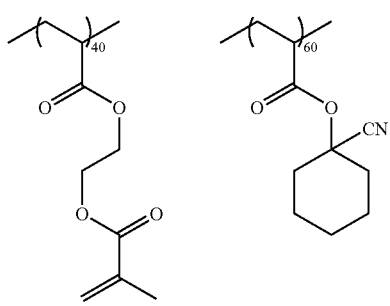
2-2-17
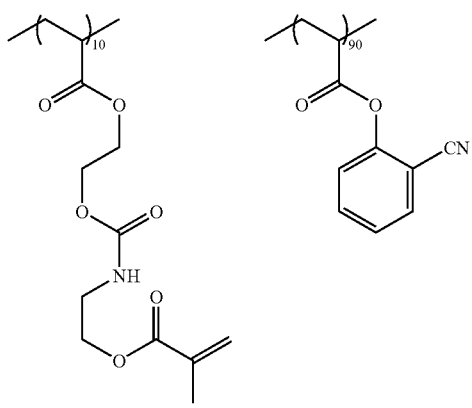
2-2-18
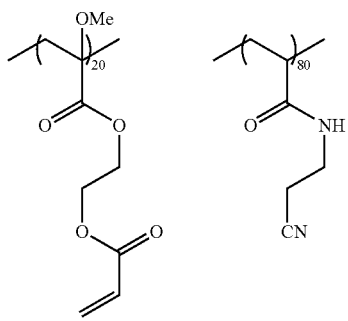
2-2-19
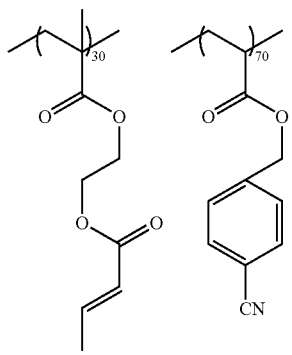
-continued
2-2-20
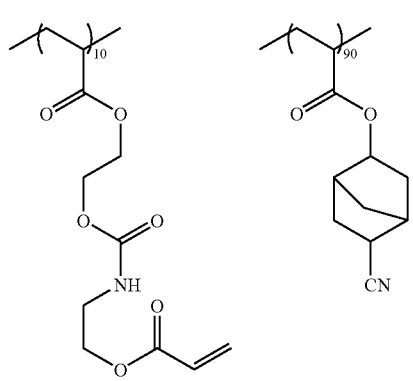
2-2-21
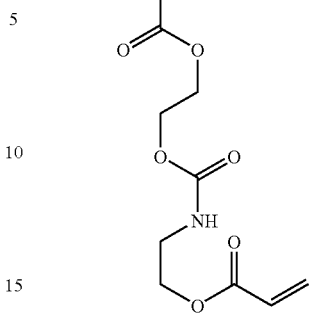
2-2-22
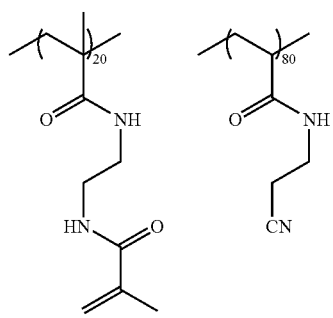
2-2-23
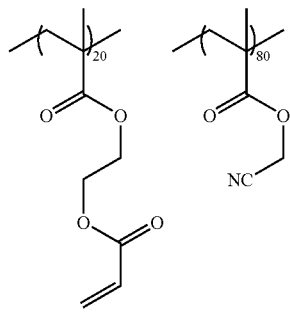

2-2-24 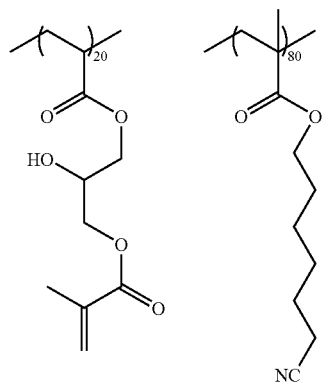
Polymers obtained by the embodiment 2-2)
2-2-25 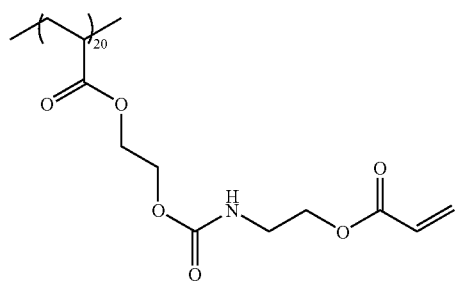
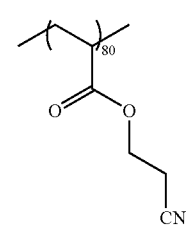
2-2-26 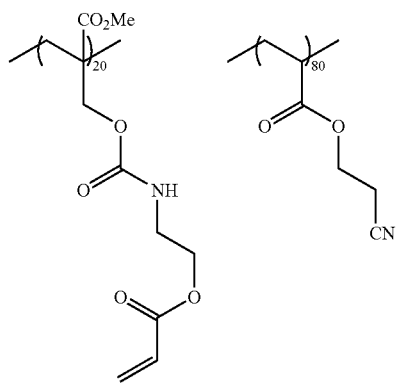
2-2-27 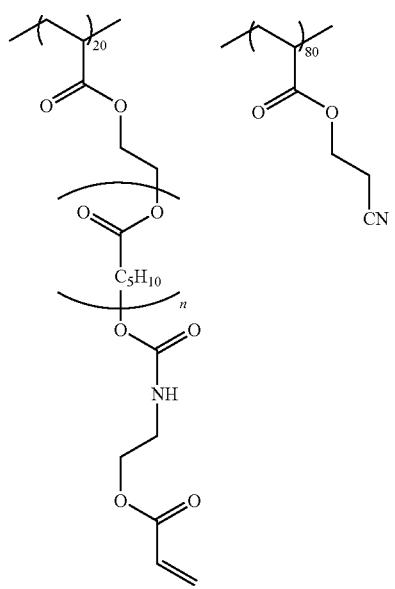
n = 1 ~ 5
2-2-28 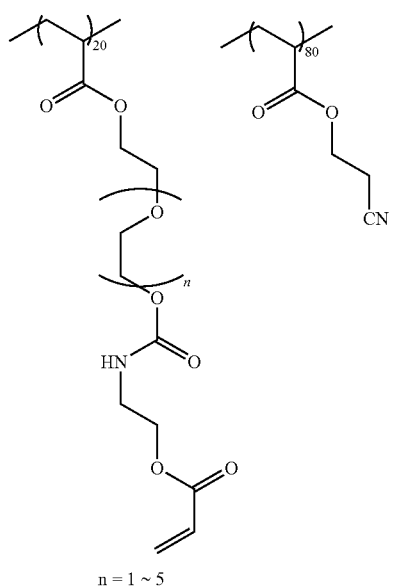
n = 1 ~ 5

-continued

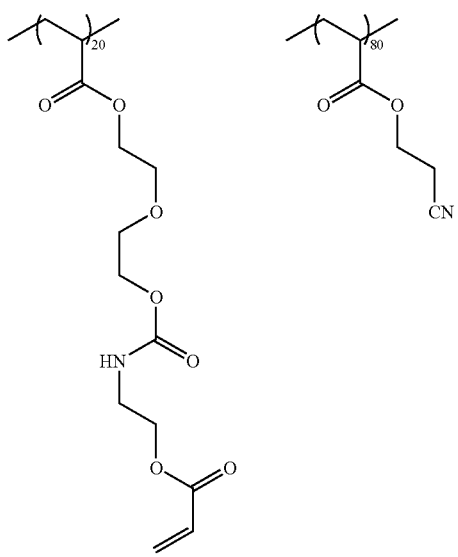

Polymers obtained by the embodiment 2-2)

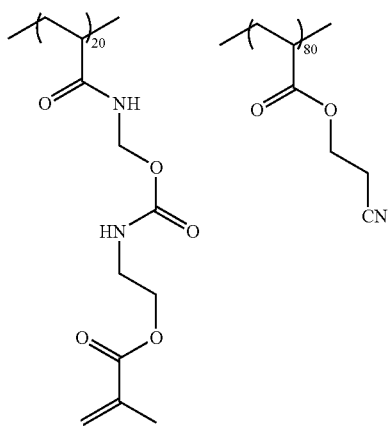

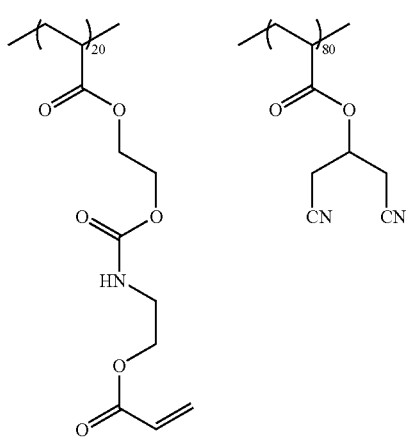

-continued

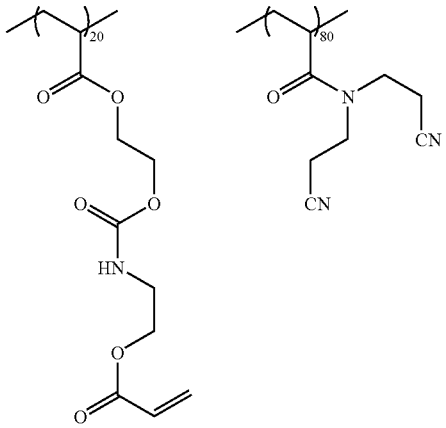

Compound 2-2-11 shown in the specific examples may be synthesized by, for example, dissolving acrylic acid and 2-cyanoethyl acrylate in, for example, N-methylpyrrolidone, performing radical polymerization by using, for example, azoisobutyronitrile (AIBN) as a polymerization initiator, and then subjecting the resultant to an addition reaction with glycidyl methacrylate by using a catalyst such as benzyltriethylammonium chloride, while a polymerization inhibitor such as tertiary-butylhydroquinone is added.

Further, compound 2-2-19 shown in the specific examples may be synthesized by, for example, dissolving the following monomer and p-cyanobenzyl acrylate in a solvent such as N,N-dimethylacrylamide, performing radical polymerization by using a polymerization initiator such as dimethyl azoisobutyrate, and then performing dehydrochlorination by using a base such as triethylamine.

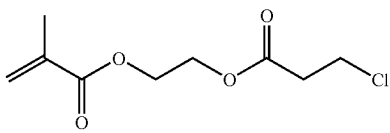

When the ratio of the number of the polymerizable group site decomposed is 50% or less with respect to the total number thereof when the polymer is added into an alkaline solution with a condition, for example, at pH 12 and stirred for 1 hour, the nitrile group-containing polymerizable polymer may be subjected to washing with a highly alkaline solution.

Uses of Novel Polymer of the Invention

Since the nitrile group-containing polymerizable polymer of the invention is a copolymer of a unit having a nitrile group and a unit having a polymerizable group, the adsorbability thereof to the metal of a plating catalyst or the like and the polymerizability (reactivity) thereof may be regulated by altering the ratio of the units.

Such nitrile group-containing polymerizable polymer of the invention may be used in photocurable resin compositions as well as in a molding material, coating material, surface modifying material or a material for substrate to be applied for the electronic field, mechanical field, food field, construction field or automobile field.

Among the various applications, the nitrile group-containing polymer of the invention can be preferably used as a surface treatment material for forming a plating film due to its excellent adsorbability to a plating catalyst and polymerizability despite of its hydrophobicity.

For example, when the nitrile group-containing polymerizable polymer of the invention is directly chemically bonded to a desired substrate by using the surface graft polymerization method or the like, a polymer layer having high adhesiveness to the base material, excellent adsorbability to a plating catalyst, and low water absorbability, may be formed. A plating film formed by providing a plating catalyst onto the polymer layer and then performing a plating treatment may have an effect of providing excellent adhesiveness to the polymer layer, as well as an effect that the polymer layer does show the temperature/humidity dependency or changes in the morphology, because the polymer layer hardly maintains moisture or ions.

Particularly, when a base material having the plating film formed thereon is used in the production of electrical wiring or the like, an effect of providing excellent inter-wiring insulation reliability can be also obtained.

It is preferable to use a resin base material containing an epoxy resin, a polyimide resin or a PET resin as the base material having the plating film formed thereon.

The nitrile group-containing polymerizable polymer of the invention may be mixed with other components (for example, a solvent) and used as a composition. In that case, the content of the nitrile group-containing polymerizable polymer of the invention is preferably in the range of 2% by mass to 50% by mass, and more preferably in the range of 5% by mass to 30% by mass, with respect to the total amount of the composition.

The solvent used in the composition containing the nitrile group-containing polymerizable polymer of the invention is not particularly limited as long as the polymer is dissoluble therein. Further, a surfactant may also be added to the solvent.

Specific examples of the solvent that may be used are the same as the specific examples of the solvent that may be used in the composition of the compound having a polymerizable group and an interactive group (for example, a cyano group-containing polymerizable polymer), and suitable specific examples thereof are also the same. Various conditions employed in the case of applying the composition containing the nitrile group-containing polymerizable polymer of the invention to coating applications (for example, temperature of the composition, concentrations of various components, conditions for additives and the like) are also the same as the various conditions employed in the case of applying the composition containing the cyano group-containing polymerizable polymer.

The base material used in the formation of a laminate using the composition containing the nitrile group-containing polymerizable polymer of the invention is preferably a dimensionally stable plate-shaped object, and any material may be used as long as it satisfies the required flexibility, strength, durability or the like, and may be appropriately selected according to the purpose of use.

Specific examples thereof include: a product obtained by molding a polyimide resin, a bismaleimide resin, a polyphenylene oxide resin, an epoxy resin, a liquid crystalline polymer, a polytetrafluoroethylene resin or the like; a silicon substrate; paper; a paper laminated with a plastic; a metal plate (for example, aluminum zinc, copper or the like); a paper or plastic film laminated or deposited with a metal such as mentioned above; and the like.

In the case where a plating film is formed using the nitrile group-containing polymerizable polymer on a base material as described above and this plating film is applied to the production of a printed wiring board, it is preferable to use a base material formed from an insulating resin.

EXAMPLES

Hereinafter, the invention will be described in detail by way of examples, while the invention is not intended to be limited to these. The terms "%" and "part" are on the mass basis unless otherwise indicated.

Example 1-1

Preparation of Substrate

On a glass epoxy substrate, an epoxy insulating film (trade name: GX-13, manufactured by Ajinomoto Fine-Techno Co., Inc., film thickness: 45 µm) was adhered by heating and pressing with a vacuum laminator at a pressure of 0.2 MPa under the conditions of 100° C. to 110° C., as an electrically insulating layer, and thus a base material was obtained.

Subsequently, an insulative composition containing a polymerization initiator, which had the following formulation, was applied on the base material by a spin coating method so that a thickness of the coated film became 3 micrometers, left to stand for 1 hour at 30° C. to remove the solvent, and dried at 140° C. for 30 minutes, to form a polymerization initiation layer (insulative polymerization initiation layer).

Insulative Composition Containing Polymerization Initiator 20 parts by mass of a bisphenol A epoxy resin (trade name: EPIKOTE 828, manufactured by Yuka Shell Epoxy Co., Ltd., epoxy equivalent: 185), 45 parts by mass of a cresol novolac epoxy resin (trade name: EPICLON N-673, manufactured by Dainippon Ink & Chemicals, Inc., epoxy equivalent: 215), and 30 parts by mass of a phenol novolac resin (trade name: PHENOLITE, manufactured by Dainippon Ink & Chemicals, Inc., phenolic hydroxyl group equivalent: 105) were dissolved in 20 parts of ethyl diglycol acetate and 20 parts of solvent naphtha under heating, while the mixture was stirred. The solution was cooled to room temperature, and then 30 parts by mass of a cyclohexanone varnish of phenoxy resin formed from the EPIKOTE 828 and bisphenol S (trade name: YL6747H30, manufactured by Yuka Shell Epoxy Co., Ltd., non-volatile fraction: 30% by mass, weight average molecular weight: 47,000), 0.8 parts by mass of 2-phenyl-4,5-bis(hydroxymethyl)imidazole, 2 parts by mass of finely pulverized silica, and 0.5 parts by mass of a silicone defoaming agent were added to the solution. Then, 10 parts of a polymerization initiating polymer P synthesized by the following method was further added to this mixture to result in an insulative composition containing a polymerization initiator.

Synthesis of Polymerization Initiating Polymer P 30 g of propylene glycol monomethyl ether (MFG) was added to a 300-ml three-necked flask, and was heated to 75° C. To this, a solution of 8.1 g formed of [2-(Acryloyloxy)ethyl](4-benzoylbenzyl)dimethyl ammonium bromide, 9.9 g of 2-hydroxyethyl methacrylate, 13.5 g of isopropyl methacrylate, 0.43 g of dimethyl-2,2'-azobis(2-methylpropionate), and 30 g of MFG, was added dropwise over 2.5 hours. Subsequently, the reaction temperature was raised to 80° C., and the mixture was allowed to react further for 2 hours, to obtain the polymer P having a polymerization initiating group.

After the polymerization initiation layer was formed, a curing treatment was performed at 180° C. for 30 minutes. Thereby, a substrate A1 was obtained. The surface roughness (Rz) of the substrate A1 was 0.2 µm.

Formation of Polymer layer
Synthesis of Polymer A having Polymerizable Group and Interactive Group First, a polymer A having a polymerizable group and an interactive group was synthesized as follows.

35 g of N,N-dimethylacetamide was placed in a 1000-ml three-necked flask, and was heated to 75° C. under a nitrogen gas stream. To this, a solution of 6.60 g of 2-hydroxyethyl acrylate (commercially available product, manufactured by Tokyo Chemical Industry Co., Ltd.), 28.4 g of 2-cyanoethyl acrylate, and 0.65 g of methyl azobisisobutyrate (trade name: V-601, manufactured by Wako Pure Chemical Industries, Ltd.) in 35 g of N,N-dimethylacetamide was added dropwise over 2.5 hours. After completion of the dropwise addition, the mixture was heated to 80° C., and was further stirred for 3 hours. Thereafter, the reaction solution was cooled to room temperature.

To this reaction solution, 0.29 g of di-tertiary-butylhydroquinone, 0.29 g of dibutyltin dilaurate, 18.56 g of KARENZ AOI (trade name, manufactured by Showa Denko Kabushiki Kaisha), and 19 g of N,N-dimethylacetamide were added, and the mixture was allowed to react at 55° C. for 4 hours. Subsequently, 3.6 g of methanol was added to the reaction liquid, and the mixture was allowed to react further for 1.5 hours. After completion of the reaction, reprecipitation was performed using a liquid containing ethyl acetate and hexane in a ratio of 1:1, and a resulted solid product was collected to obtain 32 g of the polymer A having a polymerizable group and an interactive group (weight average molecular weight: 15,000).

Preparation of Coating Solution 10.5 parts by mass of the polymer A having a polymerizable group and an interactive group, 73.3 parts by mass of acetone, 33.9 parts by mass of methanol, and 4.8 parts by mass of N,N-dimethylacetamide were mixed and stirred to prepare a coating solution.

Production of Graft Polymer

The prepared coating solution was applied on the polymerization initiation layer of the substrate A1, by a spin coating method so that a thickness of the coated film became 1 μm. This film was dried at 80° C. for 30 minutes, and then was irradiated for 660 seconds by using a UV exposure unit (trade name: UVF-502S, manufactured by San-Ei Electric Co., Ltd., lamp: UXM-501MD) at an irradiation power of 1.5 mW/cm$^2$ (measured by an ultraviolet integration actinometer (trade name: UIT150, manufactured by Ushio Denki Co., Ltd.) and a photoreceptive sensor (trade name: UVD-S254, manufactured by Ushio Denki Co., Ltd.)) to produce a graft polymer over the entire surface of the polymerization initiation layer of the substrate A1. Here, the integrated amount of exposure was 990 mJ.

Subsequently, the substrate having the graft polymer produced thereon was immersed for 5 minutes in acetone, which was being stirred, and subsequently, the substrate was washed with distilled water.

Thereby, a substrate A2 having a polymer layer was obtained.

Measurement of Physical Properties of Polymer Layer

The physical properties of the obtained polymer layer were measured by the methods described above. The results are as follows.

Saturated water absorption coefficient in an environment of temperature of 25° C. and relative humidity of 50%: 1.2% by mass Saturated water absorption coefficient in an environment of temperature of 25° C. and relative humidity of 95%: 3.4% by mass Water absorption coefficient after 1 hour immersion in boiling water at 100° C.: 7.5% by mass Surface contact angle after dropwise addition of 5 μL of distilled water and leaving to stand for 15 seconds in an environment of temperature of 25° C. and relative humidity of 50%: 70.3°

Imparting of Plating Catalyst

The substrate A2 having a polymer layer was immersed in a 1% acetone solution of palladium nitrate for 30 minutes, and was then washed by being immersed in acetone.

Subsequently, a mixed solution of 1% dimethylborane-water/methanol (water/methanol=1/3) was used as a catalyst activating liquid (reducing liquid), and the substrate A2 having a polymer layer was immersed in this solution for 15 minutes, and then washed by being immersed in acetone.

Electroless Plating

The substrate A2 having a polymer layer, which was provided with a plating catalyst as described above, was subjected to electroless plating by using an electroless plating bath having the following formulation, at 60° C. for 5 minutes. The obtained electroless copper plating film had a thickness of 0.3 μm.

| Formulation of Electroless plating bath | |
|---|---|
| Distilled water | 859 g |
| Methanol | 850 g |
| Copper sulfate | 18.1 g |
| Ethylenediaminetetraacetic acid•disodium salt | 54.0 g |
| Polyoxyethylene glycol (molecular weight: 1000) | 0.18 g |
| 2,2'-Bipyridyl | 1.8 mg |
| 10% Aqueous solution of ethylenediamine | 7.1 g |
| 37% Aqueous solution of formaldehyde | 9.8 g |

The pH value of the plating bath having the above formulation was adjusted to 12.5 (60° C.) with sodium hydroxide and sulfuric acid.

Electroplating

Subsequently, electroplating was performed for 20 minutes by using the electroless copper plating film as a power supply layer and using a copper electroplating bath having the following formulation under the condition of 3 A/dm$^2$. The obtained copper electroplating film had a thickness of 18 μm.

| Formulation of Electroplating bath | |
|---|---|
| Copper sulfate | 38 g |
| Sulfuric acid | 95 g |
| Hydrochloric acid | 1 mL |
| COPPER GLEAM PCM | 3 mL |
| (trade name, manufactured by Meltex, Inc.) | |
| Water | 500 g |

Evaluation of Adhesiveness

A 5 mm-width portion of the thus-obtained plating film was subjected to a measurement of the 90° peel strength using a tensile tester (trade name: RTM-100, manufactured by A&D Co., Ltd.) at a tensile strength of 10 mm/min, and the strength was turn out to be 0.7 kN/mm.

Formation of Metallic Pattern and Insulation Reliability Test

On the surface of the obtained plating film, an etching resist was formed on the areas which should be remained as metallic pattern (wiring pattern), and the plating film in the areas where the resist was not formed was removed with an etching solution containing FeCl$_3$/HCl. Subsequently, the etching resist was removed with an alkali peeling solution containing a 3% NaOH solution, and comb-shaped wiring (metallic pattern-bearing material) with line-and-space of 100 μm/100 μm for measuring the inter-wiring insulation reliability was formed.

This comb-shaped wiring was left to stand for 200 hours in a HAST tester (trade name: AMI-150S-25, manufactured by ESPEC Corp.), in an environment of temperature of 125° C. and relative humidity of 85% (unsaturated) and at an applied voltage of 10 V under a pressure of 2 atmospheres, while no defect in the inter-wiring insulation was observed.

Example 1-2

A metal film-coated material was produced as follows using the substrate A1, which has a polymerization initiation layer formed thereon and was produced in Example 1-1.

Formation of Polymer Layer

Synthesis of Polymer B having Polymerizable Group and Interactive Group

First, a polymer B having a polymerizable group and an interactive group was synthesized as follows.

42 g of N,N-dimethylacetamide was placed in a 1000-ml three-necked flask, and was heated to 75° C. under a nitrogen gas stream. To this, a solution of 5.6 g of 2-hydroxyethyl acrylate (commercially available product, manufactured by Tokyo Chemical Industry Co., Ltd.), 36.1 g of 2-(2-ethoxy-ethoxy)ethyl acrylate, and 0.55 g of V-601 (described above) in 42 g of N,N-dimethylacetamide was added dropwise over 2.5 hours. After completion of the dropwise addition, the mixture was heated to 80° C., and was further stirred for 3 hours. Thereafter, the reaction solution was cooled to room temperature.

To this reaction solution, 0.24 g of di-tertiary-butylhydroquinone, 0.30 g of dibutyltin dilaurate, 15.5 g of KARENZ AOI (trade name, manufactured by Showa Denko Kabushiki Kaisha), and 16 g of N,N-dimethylacetamide were added, and the mixture was allowed to react at 55° C. for 4 hours. Subsequently, 3.1 g of methanol was added to the reaction liquid, and the mixture was allowed to react further for 1.5 hours. After completion of the reaction, reprecipitation was performed with distilled water, and a resulted solid product was collected to obtain 30 g of the polymer B having a polymerizable group and an interactive group (weight average molecular weight: 17,000).

Preparation of Coating Solution 7.9 parts by mass of the polymer B having a polymerizable group and an interactive group, 73.3 parts by mass of isopropanol, 33.9 parts by mass of methanol, and 4.8 parts by mass of N,N-dimethylacetamide were mixed and stirred to prepare a coating solution.

Production of Graft Polymer

The thus-prepared coating solution was applied on the polymerization initiation layer of the substrate A1 by a spin coating method so that a thickness of the coated film became 1 μm. This film was dried at 80° C. for 30 minutes, and then was irradiated for 660 seconds by using a UV exposure unit (trade name: UVF-502S, manufactured by San-Ei Electric Co., Ltd., lamp: UXM-501MD) at an irradiation power of 1.5 mW/cm² (measured by an ultraviolet integration actinometer (trade name: UIT150, manufactured by Ushio Denki Co., Ltd.) and a photoreceptive sensor (trade name: UVD-S254, manufactured by Ushio Denki Co., Ltd.)) to produce a graft polymer over the entire surface of the polymerization initiation layer of the substrate A1. Here, the integrated amount of exposure was 990 mJ.

Thereafter, the substrate having a graft polymer produced thereon was immersed for 5 minutes in methanol, which was being stirred, and subsequently, the substrate was washed with distilled water.

Thereby, a substrate A3 having a polymer layer was obtained.

Measurement of Physical Properties of Polymer Layer

The physical properties of the obtained polymer layer were measured by the methods described above. The results are as follows.

Saturated water absorption coefficient in an environment of temperature of 25° C. and relative humidity of 50%: 0.8% by mass Saturated water absorption coefficient in a an environment of temperature of 25° C. and relative humidity of 95%: 3.0% by mass Water absorption coefficient after 1 hour immersion in boiling water at 100° C.: 5.5% by mass Surface contact angle after dropwise addition of 5 μL of distilled water and leaving to stand for 15 seconds in an environment of temperature of 25° C. and relative humidity of 50%: 83.9°

Subsequently, the substrate A3 having a polymer layer was subjected to imparting of a plating catalyst, electroless plating, and electroplating in similar manners as in Example 1-1.

Evaluation of Adhesiveness

A 5 mm-width portion of the thus-obtained plating film was subjected to a measurement of the 90° peel strength using a tensile tester (trade name: RTM-100, manufactured by A&D Co., Ltd.) at a tensile strength of 10 mm/min, and the strength was turn out to be 0.67 kN/mm.

Formation of Metallic Pattern and Insulation Reliability Test

On the surface of the obtained plating film, an etching resist was formed on the areas which should be remained as metallic pattern (wiring pattern), and the plating film in the areas where the resist was not formed was removed with an etching solution containing $FeCl_3$/HCl. Subsequently, the etching resist was removed with an alkali peeling solution containing a 3% NaOH solution, and comb-shaped wiring (metallic pattern-bearing material) with line-and-space of 100 μm/100 μm for measuring the inter-wiring insulation reliability was formed.

This comb-shaped wiring was left to stand for 200 hours in a HAST tester (trade name: AMI-150S-25, manufactured by ESPEC Corp.) in an environment of temperature of 125° C. and relative humidity of 85% (unsaturated) and at an applied voltage of 10 V under a pressure of 2 atmospheres, while no defect in the inter-wiring insulation was observed.

Example 1-3

Preparation of Substrate

On a base material formed from a polyimide film (trade name: Kapton 500H, manufactured by Toray DuPont Co., Ltd.), a polymerization initiation layer coating solution as described below was applied using a rod bar No. 18, and the film was subjected to drying and crosslinking reaction at 11° C. for 10 minutes. The film thickness of the obtained polymerization initiation layer was 9.3 μm. The substrate thus obtained was designated as substrate B1. The surface roughness (Rz) of the resulting substrate B1 was 0.3 μm.

| Polymerization initiation layer coating solution | |
| --- | --- |
| Polymerization initiating polymer P described above | 0.4 g |
| TDI (tolylene-2,4-diisocyanate) | 0.16 g |
| Methyl ethyl ketone (MEK) | 1.6 g |

Formation of Polymer Layer

Preparation of Coating Solution 10.5 parts by mass of the polymer A having a polymerizable group and an interactive group, 73.3 parts by mass of methyl ethyl ketone (MEK), 33.9 parts by mass of methanol, and 4.8 parts by mass of N,N-dimethylacetamide were mixed and stirred to prepare a coating solution.

Production of Graft Polymer

The prepared coating solution was applied on the polymerization initiation layer of the substrate B1 by spin coating in the same manner as in Example 1-1, and then the film was dried. This film was irradiated for 800 seconds by using a UV exposure unit (trade name: UVF-502S, manufactured by San-Ei Electric Co., Ltd., lamp: UXM-501MD) at an irradiation power of 1.5 mW/cm$^2$ (measured by an ultraviolet integration actinometer (trade name: UIT150, manufactured by Ushio Denki Co., Ltd.) and a photoreceptive sensor (trade name: UVD-S254, manufactured by Ushio Denki Co., Ltd.)) to produce a graft polymer over the entire surface of the polymerization initiation layer of the substrate B1. Here, the integrated amount of exposure was 1200 mJ.

Thereafter, the substrate having a graft polymer produced thereon was immersed for 5 minutes in acetone, which was being stirred, and subsequently, the substrate was washed with distilled water.

Thereby, a substrate B2 having a polymer layer was obtained.

Measurement of Physical Properties of Polymer Layer

The physical properties of the obtained polymer layer were measured by the methods described above. The results are as follows.

Saturated water absorption coefficient in an environment of temperature of 25° C. and relative humidity of 50%: 1.4% by mass Saturated water absorption coefficient in an environment of temperature of 25° C. and relative humidity of 95%: 3.9% by mass Water absorption coefficient after 1 hour immersion in boiling water at 100° C.: 7.8% by mass Surface contact angle after dropwise addition of 5 µL of distilled water and leaving to stand for 15 seconds in an environment of temperature of 25° C. and relative humidity of 50%: 72.6°

Subsequently, this substrate B2 having a polymer layer was subjected to imparting of a plating catalyst, electroless plating, and electroplating in the same manner as in Example 1-1.

Evaluation of Adhesiveness

The adhesiveness of the thus-obtained plating film was evaluated in the similar manner as in Example 1-1, and the 90° peel strength was turn out to be 0.68 kN/mm.

Formation of Metallic Pattern and Insulation Reliability Test

On the substrate having a plating film obtained as described above, comb-shaped wiring (metallic pattern-bearing material) was formed by the same technique as in Example 1-1, and an insulation reliability test was performed. No defect in the inter-wiring insulation was observed.

Example 1-4

Preparation of Substrate

KAPTON EN (trade name, manufactured by Toray DuPont Co., Ltd.) having a thickness of 25 µm was used as a base material. The saturated water absorption coefficient of this base material at temperature of 25° C. and relative humidity of 50% 1.0% by mass.

On both sides of this base material (resin film), an insulating resin composition having polymerization initiation ability and having the following formulation was applied by using a dipping method, and the film was dried at 100° C. for 5 minutes, and then heated at 250° C. for 30 minutes, to form polymerization initiation layers (insulative polymerization initiation layers). The saturated water absorption coefficient of the polymerization initiation layers at temperature of 25° C. and relative humidity of 50% was 1.2% by mass.

The obtained substrate was designated as substrate C1. The surface roughness (Ra) of this substrate C1 was measured by using SURFCOM 3000A (trade name, manufactured by Tokyo Seimitsu Co., Ltd.) based on the Ra of ISO 4288 (1996) and turned out to be 0.1 µm.

Insulative Composition having Polymerization Initiation Ability Synthesis of Polyimide Precursor (Polyamic Acid)

In a nitrogen environment, 4,4'-diaminophenyl ether (5.75 g: 28.7 mmol) was dissolved in N-methylpyrrolidone (30 ml), and the solution was stirred for about 30 minutes at room temperature. To this solution, 3,3',4,4"-benzophenonetetracarboxylic acid dianhydride (9.25 g: 28.7 mmol) was added at 0° C., and the mixture was stirred for 5 hours. The reaction liquid was subjected to reprecipitation, and thus a polyimide precursor (polyamic acid) having polymerization initiation ability was obtained. The molecular weight (Mw) obtained by GPC (Gel Permeation Chromatography) was 28,000. The structure was further confirmed by $^1$H-NMR and FT-IR.

The obtained polyimide precursor was dissolved in N,N-dimethylacetamide (DMAc, manufactured by Wako Pure Chemical Industry, Ltd.) to obtain a solution of 10% by mass.

Formation of Polymer Layer

Preparation of Coating Solution 10.5 parts by mass of the polymer A having a polymerizable group and an interactive group, 73.3 parts by mass of methyl ethyl ketone (MEK), 33.9 parts by mass of methanol, and 4.8 parts by mass of N,N-dimethylacetamide were mixed and stirred to prepare a coating solution.

Production of Graft Polymer

The prepared coating solution was applied on the polymerization initiation layers on both sides of the substrate C1 by a dipping method to provide films respectively having a thickness of 1 µm, and then the films were dried at 80° C. for 30 minutes. Then, these films were irradiated for 660 seconds by using a UV exposure unit (trade name: UVF-502S, lamp: UXM-501MD) at an irradiation power of 1.5 mW/cm$^2$ (measured by an ultraviolet integration actinometer (trade name: UIT150, manufactured by Ushio Denki Co., Ltd.) and a photoreceptive sensor (trade name: UVD-S254, manufactured by Ushio Denki Co., Ltd.)) to produce a graft polymer over the entire surface of the polymerization initiation layers of the substrate C1. Here, the integrated amount of exposure was 990 mJ.

Thereafter, the substrate having a graft polymer produced thereon was immersed for 5 minutes in acetone, which was being stirred, and subsequently, the substrate was washed with distilled water.

Thereby, a substrate C2 having, on both sides, polymer layers, each of which having a thickness of 0.8 μm, was obtained.

Measurement of Physical Properties of Polymer Layer

The physical properties of the obtained polymer layer were measured by the methods described above. The results are as follows.

Saturated water absorption coefficient in an environment of temperature of 25° C. and relative humidity of 50%: 1.2% by mass Saturated water absorption coefficient in an environment of temperature of 25° C. and relative humidity of 95%: 3.4% by mass Water absorption coefficient after 1 hour immersion in boiling water at 100° C.: 7.5% by mass Surface contact angle after dropwise addition of 5 μL of distilled water and leaving to stand for 15 seconds in an environment of temperature of 25° C. and relative humidity of 50%: 70.3°

Imparting of Plating Catalyst

The substrate C2 having a polymer layer was immersed in a 1% acetone solution of palladium nitrate for 30 minutes, and was then washed by being immersed in acetone.

Subsequently, the substrate B2 having a polymer layer was immersed in a 1% dimethylborane-water/methanol (water/methanol=1/3) mixed solution for 15 minutes, and was then washed by immersing in acetone.

Electroless Plating

The substrate C2 having a polymer layer provided with a plating catalyst as described above was subjected to electroless plating by using the same electroless plating bath as that used in Example 1-1 at 60° C. for 5 minutes. Both of the resulting electroless copper plating films on both sides respectively had a thickness of 0.3 μm.

Electroplating

Subsequently, electroplating was performed for 20 minutes by using the electroless copper plating films as power supply layers, and using a copper electroplating bath having the same composition as that used in Example 1-1, under the condition of 3 A/dm$^2$. Both of the obtained copper electroplating films on both sides respectively had a thickness of 18 μm.

Evaluation of Adhesiveness

A 5 mm-width portion of the thus-obtained plating films was subjected to a measurement of the 90° peel strength in the same manner as in Example 1-1 at a tensile strength of 10 mm/min, and the strength was turn out to be 0.68 kN/mm.

Formation of Metallic Pattern and Insulation Reliability Test

On the substrate having plating films obtained as described above, comb-shaped wiring (metallic pattern) was formed by using the same method as that used in Example 1-1.

Subsequently, an insulation reliability test was performed using this comb-shaped wiring by the same method as that used in Example 1-1, while no defect in the inter-wiring insulation was observed.

Example 1-5

A polymer layer was formed in the same manner as in Example 1-1, except that the polymer A having a polymerizable group and an interactive group used upon the formation of a polymer layer in Example 1-1 was replaced with a polymer C having a polymerizable group and an interactive group which was synthesized by the method described below, and the exposure conditions were changed to irradiation for 100 seconds at an irradiation power of 10 mW/cm$^2$. Here, the integrated amount of exposure was 1000 mJ.

Thereby, a substrate A4 having a polymer layer was obtained.

It was found that a similar polymer layer can be formed even if the exposure is performed with an integrated amount of exposure of 500 mJ upon formation of the polymer layer.

Synthesis of Polymer C having Polymerizable Group and Interactive Group 200 mL of a commercially available product of hydroxyethyl acrylate (manufactured by Tokyo Chemical Industry Co., Ltd.) was dissolved in 600 mL of water. 400 mL of ethyl acetate was added to the obtained aqueous solution to separate an oily phase therefrom. Subsequently, 100 g of sodium chloride (manufactured by Wako Pure Chemical Industries, Ltd.) was dissolved in the aqueous phase, and then extraction was performed twice using 200 mL of ethyl acetate. Subsequently, the extract was dried over anhydrous magnesium sulfate, and 0.04 g of p-methoxyhydroquinone was added, and ethyl acetate was appropriately distilled off under reduced pressure. After the distillation under reduced pressure, it was confirmed by NMR that 6.5% by mass of ethyl acetate remained.

Further, the content of bifunctional acrylate in the commercially available product of hydroxyethyl acrylate was measured by liquid chromatography (HPLC), and was found to be 0.28% by mass. However, when the content of the bifunctional acrylate in the product purified as described above was measured, the content thereof was below the detection limit To a 500-mL three-necked flask, 20 mL of N-methylpyrrolidone, 2.32 g of hydroxyethyl acrylate purified by the above-described method, and 10.01 g of cyanoethyl acrylate were added, and the mixture was heated to 75° C. Then, a mixture liquid of 0.23 g of V-601 (described above) and 5 mL of N-methylpyrrolidone was added dropwise to the mixture over 1 hour. When 1 hour lapsed after completion of the dropwise addition, the mixture was heated to 80° C. and was allowed to react for 1 hour.

To the reaction solution, 0.29 g of di-tertiary-butylhydroquinone, 0.29 g of dibutyltin dilaurate, 18.56 g of KARENZ AOI (trade name, manufactured by Showa Denko Kabushiki Kaisha), and 19 g of N-methylpyrrolidone (SP value: 22.94 MPa$^{1/2}$) were added, and the mixture was allowed to react for 6 hours at 55° C. Subsequently, 3.6 g of methanol was added to the reaction liquid, and the resulting mixture was allowed to react further for 1.5 hours. After completion of the reaction, reprecipitation was performed with water, and a resulted solid product was collected to obtain 25 g of the polymer C having a polymerizable group and an interactive group.

Identification of Structure

The synthesized polymer C having a polymerizable group and an interactive group was dissolved in deuterated DMSO (dimethylsulfoxide), and the solution was measured by 300 MHz NMR (trade name: AV-300, manufactured by Bruker Corp.). Peaks corresponding to the cyano group-containing unit were observed over a broad range including 4.3-4.05 ppm (2H fraction), 2.9-2.8 ppm (2H fraction) and 2.5-1.3 ppm (3H fraction), and broad peaks corresponding to the polymerizable group-containing unit were observed over ranges including 7.2-7.3 ppm (1H fraction), 6.4-6.3 ppm (1H fraction), 6.2-6.1 ppm (1H fraction), 6.0-5.9 ppm (1H fraction), 4.3-4.05 ppm (6H fraction), 3.3-3.2 ppm (2H fraction) and 2.5-1.3 ppm (3H fraction). Thus, it was found that the ratio of polymerizable group-containing unit:cyano group-containing unit was 20:80 (molar ratio).

Measurement of Molecular Weight

The synthesized polymer C having a polymerizable group and an interactive group was dissolved in tetrahydrofuran (THF), and the molecular weight was measured by using high performance GPC (trade name: HLC-8220GPC, manufactured by Tosoh Corp.). As a result, a peak appeared at 23.75 minutes, and it was found that the Mw was 22000 (Mw/Mn=2.1) in terms of polystyrene standards.

Measurement of Physical Properties of Polymer Layer

The physical properties of the obtained polymer layer were measured by the methods described above. The results are as follows.

Saturated water absorption coefficient in an environment of temperature of 25° C. and relative humidity of 50%: 1.3% by mass Saturated water absorption coefficient in an environment of temperature of 25° C. and relative humidity of 95%: 3.5% by mass Water absorption coefficient after 1 hour immersion in boiling water at 100° C.: 8.3% by mass Surface contact angle after dropwise addition of 5 μL of distilled water and leaving to stand for 15 seconds in an environment of temperature of 25° C. and relative humidity of 50%; 71.6°

Subsequently, the substrate A4 having a polymer layer was subjected to imparting of a plating catalyst, electroless plating, and electroplating in similar manners as in Example 1-1. Further, post-heating was performed at 170° C. for 30 minutes.

Evaluation of Adhesiveness

The adhesiveness of the thus-obtained plating film was evaluated in the similar manner as in Example 1-1, and the 90° peel strength was turn out to be 0.75 kN/mm.

Formation of Metallic Pattern and Insulation Reliability Test

On the substrate having a plating film obtained as described above, comb-shaped wiring (metallic pattern-bearing material) was formed by the same technique as in Example 1-1, and an insulation reliability test was performed. No defect in the inter-wiring insulation was observed.

Example 1-6

A polymer layer was formed in the same manner as in Example 1-1, except that the polymer A having a polymerizable group and an interactive group used upon the formation of a polymer layer in Example 1-1 was replaced with a polymer D having a polymerizable group and an interactive group which was synthesized by the method described below, and the exposure conditions were changed to irradiation for 100 seconds at an irradiation power of 10 mW/cm$^2$. Here, the integrated amount of exposure was 1000 mJ.

Thereby, a substrate A5 having a polymer layer was obtained.

It was found that a similar polymer layer can be formed even if the exposure is performed with an integrated amount of exposure of 500 mJ upon formation of the polymer layer.

Synthesis of Polymer D having Polymerizable Group and Interactive Group 11 mL of ethylene glycol diacetate was placed in a 500-mL three-necked flask, and was heated to 75° C. A mixture liquid of 1.39 g of hydroxyethyl acrylate purified by the method described in Example 1-5, 6.00 g of cyanoethyl acrylate, 0.1382 g of V-601 (described above) and 11 mL of ethylene glycol diacetate was added dropwise to the flask over 2.5 hours. After completion of the dropwise addition, the mixture was heated to 80° C. and was allowed to react for 3 hours.

To this reaction solution, 0.06 g of di-tertiary-butylhydroquinone, 0.13 g of inorganic bismuth urethanization crosslinking catalyst (trade name: NEOSTAN U-600, manufactured by Nitto Chemical Industry Co., Ltd.), 3.84 g of KARENZ AOI (trade name, manufactured by Showa Denko Kabushiki Kaisha), and 3.8 g of ethylene glycol diacetate (SP value: 20.79 MPa$^{1/2}$) were added, and the mixture was allowed to react for 6 hours at 55° C.

Subsequently, 3.6 g of methanol was added to the reaction liquid, and the mixture was allowed to react further for 1.5 hours. After completion of the reaction, reprecipitation was performed with water, and a resulted solid product was collected to obtain 3 g of the polymer D having a polymerizable group and an interactive group.

Identification of Structure

The synthesized polymer D having a polymerizable group and an interactive group was dissolved in deuterated DMSO (dimethylsulfoxide), and the solution was measured by 300 MHz NMR (trade name: AV-300, manufactured by Bruker Corp.). Broad peaks corresponding to the nitrile group-containing unit were observed over ranges including 4.3-4.05 ppm (2H fraction), 2.9-2.8 ppm (2H fraction) and 2.5-1.3 ppm (3H fraction), and broad peaks corresponding to the polymerizable group-containing unit were observed over ranges including 7.2-7.3 ppm (1H fraction), 6.4-6.3 ppm (1H fraction), 6.2-6.1 ppm (1H fraction), 6.0-5.9 ppm (1H fraction), 4.3-4.05 ppm (6H fraction), 3.3-3.2 ppm (2H fraction) and 2.5-1.3 ppm (3H fraction). Thus, it was found that the ratio of polymerizable group-containing unit:nitrile group-containing unit was 21:79 (molar ratio).

Measurement of Molecular Weight

The synthesized polymer D having a polymerizable group and an interactive group was dissolved in THF, and the molecular weight was measured by using high performance GPC (trade name: HLC-8220GPC, manufactured by Tosoh Corp.). As a result, a peak appeared at 23.75 minutes, and it was found that the Mw was 84000 (Mw/Mn=2.9) in terms of polystyrene standards.

Measurement of Physical Properties of Polymer Layer

The physical properties of the obtained polymer layer were measured by the methods described above. The results are as follows.

Saturated water absorption coefficient in an environment of temperature of 25° C. and relative humidity of 50%: 1.2% by mass Saturated water absorption coefficient in an environment of temperature of 25° C. and relative humidity of 95%: 3.6% by mass Water absorption coefficient after 1 hour immersion in boiling water at 100° C.: 7.7% by mass Surface contact angle after dropwise addition of 5 μL of distilled water and leaving to stand for 15 seconds in an environment of temperature of 25° C. and relative humidity of 50%: 70.8°

Subsequently, the substrate A5 having a polymer layer was subjected to imparting of a plating catalyst, electroless plating, and electroplating in similar manners as in Example 1-1. Further, post-heating was performed at 170° C. for 30 minutes.

Evaluation of Adhesiveness

The adhesiveness of the thus-obtained plating film was evaluated in the similar manner as in Example 1-1, and the 90° peel strength was turn out to be 0.76 kN/mm.

Formation of Metallic Pattern and Insulation Reliability Test

On the substrate having a plating film obtained as described above, comb-shaped wiring (metallic pattern-bearing material) was formed by the same technique as in Example 1-1, and an insulation reliability test was performed. No defect in the inter-wiring insulation was observed.

Example 1-7

A polymer layer was formed in the same manner as in Example 1-1, except that the polymer A having a polymerizable group and an interactive group used upon the formation of a polymer layer in Example 1-1 was replaced with a polymer E having a polymerizable group and an interactive group which was synthesized by the method described below, and the exposure conditions were changed to irradiation for 100 seconds at an irradiation power of 10 mW/cm$^2$. Here, the integrated amount of exposure was 1000 mJ.

Thereby, a substrate A6 having a polymer layer was obtained.

It was found that a similar polymer layer can be formed even if the exposure is performed with an integrated amount of exposure of 500 mJ upon formation of the polymer layer.

Synthesis of Polymer E having Polymerizable Group and Interactive Group 10 mL of ethylene glycol diacetate was placed in a 500-mL three-necked flask, and was heated to 80° C. A mixture liquid of 3.72 g of hydroxyethyl acrylate purified by the method described in Example 1-5, 16.01 g of cyanoethyl acrylate, 0.3684 g of V-601 (described above) and 10 mL of ethylene glycol diacetate was added dropwise to the flask over 4 hours. After completion of the dropwise addition, the mixture was allowed to react further for 3 hours.

To this reaction solution, 0.16 g of di-tertiary-butylhydroquinone, 0.32 g of NEOSTAN U-600 (described above), 9.6 g of KARENZ AOI (trade name, manufactured by Showa Denko Kabushiki Kaisha), and 9.6 g of ethylene glycol diacetate (SP value: 20.79 MPa$^{1/2}$) were added, and the mixture was allowed to react for 6 hours at 55° C. Subsequently, 3.6 g of methanol was added to the reaction liquid, and the mixture was allowed to react further for 1.5 hours. After completion of the reaction, reprecipitation was performed with water, and a resulted solid product was collected to obtain 18 g of the polymer E having a polymerizable group and an interactive group.

Identification of Structure

The synthesized polymer E having a polymerizable group and an interactive group was subjected to NMR measurement in the same manner as in Example 1-2, and it was found that the ratio of polymerizable group-containing unit:nitrile group-containing unit was 23:77 (molar ratio).

Measurement of Molecular Weight

The synthesized polymer E having a polymerizable group and an interactive group was dissolved in THF, and the molecular weight was measured by using high performance GPC (trade name: HLC-8220GPC, manufactured by Tosoh Corp.). As a result, a peak appeared at 23.75 minutes, and it was found that the Mw was 66000 (Mw/Mn=2.8) in terms of polystyrene standards.

Measurement of Physical properties of Polymer layer The physical properties of the obtained polymer layer were measured by the methods described above. The results are as follows.

Saturated water absorption coefficient in an environment of temperature of 25° C. and relative humidity of 50%: 1.2% by mass Saturated water absorption coefficient in an environment of temperature of 25° C. and relative humidity of 95%: 3.4% by mass Water absorption coefficient after 1 hour immersion in boiling water at 100° C.: 8.1% by mass Surface contact angle after dropwise addition of 5 μL of distilled water and leaving to stand for 15 seconds in an environment of temperature of 25° C. and relative humidity of 50%: 70.0°

Subsequently, the substrate A6 having a polymer layer was subjected to imparting of a plating catalyst, electroless plating, and electroplating in similar manners as in Example 1-1. Further, post-heating was performed at 170° C. for 30 minutes.

Evaluation of Adhesiveness

The adhesiveness of the thus-obtained plating film was evaluated in the similar manner as in Example 1-1, and the 90° peel strength was turn out to be 0.76 kN/mm.

Formation of Metallic Pattern and Insulation Reliability Test

On the substrate having a plating film obtained as described above, comb-shaped wiring (metallic pattern-bearing material) was formed by the same technique as in Example 1-1, and an insulation reliability test was performed. No defect in the inter-wiring insulation was observed.

Example 1-8

A metallic pattern-bearing material was produced as follows using the substrate A1, which has a polymerization initiation layer formed thereon and was produced in Example 1-1.

Formation of Polymer Layer

A coating solution utilizing the polymer A having a polymerizable group and an interactive group was produced in the same manner as in Example 1-1.

Formation of Pattern of Graft Polymer

The prepared coating solution was applied on the polymerization initiation layer of the substrate A1 by a spin coating method so that a thickness of the coated film became 1 μm. This film was dried at 80° C. for 5 minutes, and then was irradiated for 100 seconds by using a UV exposure unit (trade name: UVF-502S, manufactured by San-Ei Electric Co., Ltd., lamp: UXM-501MD) at an irradiation power of 10 mW/cm$^2$ (measured by an ultraviolet integration actinometer (trade name: UIT150, manufactured by Ushio Denki Co., Ltd.) and a photoreceptive sensor (trade name: UVD-S254, manufactured by Ushio Denki Co., Ltd.)). At that time, a graft polymer was produced in a pattern-wise manner on the polymerization initiation layer of the substrate A1 by exposing the substrate A1, on which the coating solution was applied and dried, in the presence of a mask A in which patterns having a width of 5 mm and a length of 50 mm were disposed in parallel at an interval of 0.1 mm or a mask B having a pattern of a comb-shaped wiring with line-and-space of 100 μm/100 μm. Here, the integrated amount of exposure was 1000 mJ.

Subsequently, the substrate having a graft polymer produced thereon was immersed for 5 minutes in acetonitrile, which was being stirred, and subsequently, the substrate was washed with distilled water.

Thereby, there were obtained a substrate A7 (obtained with the use of mask A) and a substrate A8 (obtained with the use of mask B), both having a polymer layer having a pattern shape with a width of 5 mm and a length of 50 mm and having a thickness of 0.5 μm.

Measurement of Physical Properties of Polymer Layer

The respective properties of the obtained polymer layers were similar to those obtained in Example 1-1.

Imparting of Plating Catalyst

The substrate A7 having a polymer layer was immersed in a 0.1 wt % acetone solution of palladium nitrate for 30 minutes, and was then washed by being immersed in acetone.

Electroless Plating

The substrate A7 having a polymer layer, which was provided with a plating catalyst as described above, was subjected to electroless plating at 60° C. for 15 minutes by using an electroless plating bath having the following formulation. The obtained electroless copper plating film had a thickness of 0.50 µm.

| Formulation of Electroless plating bath | |
|---|---|
| Distilled water | 1700 g |
| Copper sulfate | 18.1 g |
| Ethylenediaminetetraacetic acid/disodium salt | 54.0 g |
| Polyoxyethylene glycol (molecular weight: 1000) | 0.18 g |
| 2,2'-Bipyridyl | 1.8 mg |
| 10% Aqueous solution of ethylenediamine | 7.1 g |
| 37% Aqueous solution of formaldehyde | 9.8 g |

The pH value of the plating bath having the above formulation was adjusted to 12.5 (60° C.) with sodium hydroxide and sulfuric acid.

Electroplating

Subsequently, electroplating was performed by the same method as that used in Example 1-1 by using the electroless copper plating film as a power supply layer, such that the substrate A7 was provided with a copper electroplating film having a thickness of 18 µm, and the substrate A8 was provided with a copper electroplating film having a thickness of 10 µm.

After completion of the electroplating, baking was performed at 100° C. for 30 minutes and at 170° C. for 1 hour.

Evaluation of Adhesiveness

The adhesiveness of the thus-obtained plating film of the metallic pattern-bearing plating film of the substrate A7 was subjected to a measurement of the 90° peel strength using a tensile, tester (trade name: RTM-100, manufactured by A&D Co., Ltd.) at a tensile strength of 10 mm/min, and the strength was turn out to be 0.65 kN/mm.

Insulation Reliability Test

The insulation reliability of the metallic pattern of the thus-obtained substrate A8 was subjected to an insulation reliability test in a similar manner as in Example 1-1. No defect in the inter-wiring (between metallic patterns) insulation was observed.

Example 2-1

Synthesis Example

Synthesis of Nitrile Group-containing Polymerizable Polymer A of the Invention 35 g of N-methylpyrrolidone was placed in a 1000-mL three-necked flask, and was heated to 75° C. under a nitrogen gas stream. To this, a solution of 6.60 g of 2-hydroxyethyl acrylate (commercially available product, manufactured by Tokyo Chemical Industry Co., Ltd.), 28.4 g of 2-cyanoethyl acrylate, and 0.65 g of V-601 (described above) in 35 g of N-methylpyrrolidone was added dropwise over 2.5 hours.

After completion of the dropwise addition, the mixture was heated to 80° C., and was further stirred for 3 hours. Thereafter, the reaction solution was cooled to room temperature.

To this reaction solution, 0.29 g of di-tertiary-butylhydroquinone, 0.29 g of dibutyltin dilaurate, 18.56 g of KARENZ AOI (trade name, manufactured by Showa Denko Kabushiki Kaisha), and 19 g of N-methylpyrrolidone were added, and the mixture was allowed to react at 55° C. for 6 hours. Subsequently, 3.6 g of methanol was added to the reaction liquid, and the mixture was allowed to react further for 1.5 hours. After completion of the reaction, reprecipitation was performed with water, and a resulted solid product was collected to obtain 25 g of the nitrile group-containing polymerizable polymer A of the invention.

Identification of Structure

The synthesized nitrile group-containing polymerizable polymer A was dissolved in deuterated DMSO, and the solution was measured by 300 MHz NMR (trade name: AV-300, manufactured by Bruker Corp.). Broad peaks corresponding to the nitrile group-containing unit were observed over ranges including 4.3-4.05 ppm (2H fraction), 2.9-2.8 ppm (2H fraction) and 2.5-1.3 ppm (3H fraction), and broad peaks corresponding to the polymerizable group-containing unit were observed over ranges including 7.2-7.3 ppm (1H fraction), 6.4-6.3 ppm (1H fraction), 6.2-6.1 ppm (1H fraction), 6.0-5.9 ppm (1H fraction), 4.3-4.05 ppm (6H fraction), 3.3-3.2 ppm (2H fraction) and 2.5-1.3 ppm (3H fraction). Thus, it was found that the ratio of polymerizable group-containing unit: nitrile group-containing unit was 23:77 (molar ratio).

Measurement of Molecular Weight

The synthesized nitrile group-containing polymerizable polymer A was dissolved in THF, and the molecular weight was measured by using high performance GPC (trade name: HLC-8220GPC, manufactured by Tosoh Corp.). As a result, a peak appeared at 23.75 minutes, and it was found that the Mw was 5300 (Mw/Mn=1.54) in terms of polystyrene standards.

Examplary Embodiment of Use of Nitrile Group-containing Polymerizable Polymer A

On a glass epoxy substrate, an epoxy insulating film (trade name: GX-13, manufactured by Ajinomoto Fine-Techno Co., Inc., film thickness: 45 µm) was adhered by heating and pressing with a vacuum laminator at a pressure of 0.2 MPa under the conditions of 100° C. to 110° C., as an electrically insulating layer, and thus a base material A was obtained.

Subsequently, an insulative composition containing a polymerization initiator, which had the following formulation, was applied on the base material A by a spin coating method so that a thickness of the coated film became 3 micrometers, and the system was left to stand for 1 hour at 30° C. to remove the solvent, and dried at 140° C. for 30 minutes, to form a polymerization initiation layer (insulative polymerization initiation layer).

Insulative Composition Containing Polymerization Initiator 5 g of a liquid bisphenol A epoxy resin (trade name: EPIKOTE 825, manufactured by Japan Epoxy Resin Co., Ltd., epoxy equivalent: 176), 2 g of an MEK varnish of a triazine structure-containing phenol novolac resin (trade name: PHENOLITE LA-7052, manufactured by Dainippon Ink & Chemicals, Inc., non-volatile content: 62%, phenolic hydroxyl group equivalent of non-volatile content: 120), 10.7 g of an MEK varnish of a phenoxy resin (trade name: YP-50EK35, manufactured by Toto Chemical Corp., non-volatile content: 35%), 2.3 g of 2-hydroxy-4'-(2-hydroxyethoxy)-2-methylpropiophenone as a polymerization initiator, 5.3 g of MEK, and 0.053 g of 2-ethyl-4-methylimidazole were mixed and stirred to completely dissolve, and thus an insulative composition containing a polymerization initiator was obtained.

After the polymerization initiation layer was formed, a curing treatment was performed at 180° C. for 30 minutes. Thereby, a substrate A1 was obtained. The surface roughness (Rz) of the substrate A1 was 0.2 μm.

Preparation of Coating Solution 10.5 parts by mass of the nitrile group-containing polymerizable polymer A of the invention obtained by the above-described Synthesis example, 73.3 parts by mass of acetone, 33.9 parts by mass of methanol, and 4.8 parts by mass of N,N-dimethylacetamide were mixed and stirred to prepare a coating solution.

Exposure

The prepared coating solution was applied on the polymerization initiation layer of the substrate A1 by a spin coating method so that a thickness of the coated film became 1 μm. The film was dried at 80° C. for 30 minutes, and then was irradiated for 660 seconds by using a UV exposure unit (trade name: UVF-502S, manufactured by San-Ei Electric Co., Ltd., lamp: UXM-501MD) at an irradiation power of 1.5 mW/cm² (measured by an ultraviolet integration actinometer (trade name: UIT150, manufactured by Ushio Denki Co., Ltd.) and a photoreceptive sensor (trade name: UVD-S254, manufactured by Ushio Denki Co., Ltd.)) to allow the nitrile group-containing polymerizable polymer A to react over the entire surface of the polymerization initiation layer of the substrate A1.

Subsequently, the substrate having a photocurable layer formed thereon was immersed for 5 minutes in acetone, which was being stirred, and subsequently, the substrate was washed with distilled water.

Thereby, a substrate A2 having a polymer layer was obtained.

Imparting of Plating Catalyst

The substrate A2 having a polymer layer was immersed in an acetone solution containing 1% of Pd for 30 minutes, and was then washed by being immersed in acetone.

Subsequently, a mixed solution of 1% dimethylborane-water/methanol (water/methanol=1/3) was used as a catalyst activating liquid (reducing liquid), and the substrate A2 having a polymer layer was immersed in this solution for 15 minutes, and then washed by being immersed in acetone.

Electroless Plating

The substrate A2 having a polymer layer, which was provided with a plating catalyst as described above, was subjected to electroless plating at 60° C. for 5 minutes by using an electroless plating bath having the following formulation. The obtained electroless copper plating film had a thickness of 0.3 μm.

| Formulation of Electroless plating bath | |
|---|---|
| Distilled water | 859 g |
| Methanol | 850 g |
| Copper sulfate | 18.1 g |
| Ethylenediaminetetraacetic acid/disodium salt | 54.0 g |
| Polyoxyethylene glycol (molecular weight: 1000) | 0.18 g |
| 2,2'-Bipyridyl | 1.8 mg |
| 10% Aqueous solution of ethylenediamine | 7.1 g |
| 37% Aqueous solution of formaldehyde | 9.8 g |

The pH value of the plating bath having the above formulation was adjusted to 12.5 (60° C.) with sodium hydroxide and sulfuric acid.

Electroplating

Subsequently, electroplating was performed for 20 minutes by using the electroless copper plating film as a power supply layer, and using a copper electroplating bath having the following formulation, under the condition of 3 A/dm². Subsequently, a baking treatment was performed at 120° C. for 1 hour. The obtained copper electroplating film had a thickness of 18 μm.

| Formulation of Electroplating bath | |
|---|---|
| Copper sulfate | 38 g |
| Sulfuric acid | 95 g |
| Hydrochloric acid | 1 mL |
| COPPER GLEAM PCM (trade name, manufactured by Meltex, Inc.) | 3 mL |
| Water | 500 g |

Formation of Metallic Pattern and Insulation Reliability Test

On the surface of the obtained plating film, an etching resist was formed on the areas which should be remained as metallic pattern (wiring pattern), and the plating film in the areas where the resist was not formed was removed with an etching solution containing $FeCl_3$/HCl. Subsequently, the etching resist was removed with an alkali peeling solution containing a 3% NaOH solution, the surface was covered with solder resist, and comb-shaped wiring (metallic pattern-bearing material) with line-and-space of 100 μm/100 μm for measuring the inter-wiring insulation reliability was formed.

This comb-shaped wiring was left to stand for 200 hours in a HAST tester (trade name: AMI-150S-25, manufactured by ESPEC Corp.) in an environment of temperature of 125° C. and relative humidity of 85% (unsaturated) and at an applied voltage of 10 V under a pressure of 2 atmospheres, while no defect in the inter-wiring insulation was observed.

Example 2-2

Synthesis Example

Synthesis of Nitrile Group-containing Polymerizable Polymer B of the Invention 200 mL of hydroxyethyl acrylate (commercially available product, manufactured by Tokyo Chemical Industry Co., Ltd.) was dissolved in 600 mL of water. 400 mL of ethyl acetate was added to the obtained aqueous solution to separate an oily phase therefrom. Subsequently, 100 g of sodium chloride (manufactured by Wako Pure Chemical Industries, Ltd.) was dissolved in the aqueous phase, and then extraction was performed twice using 200 mL of ethyl acetate. Subsequently, the extract was dried over anhydrous magnesium sulfate, and 0.04 g of p-methoxyhydroquinone was added, and ethyl acetate was appropriately distilled off under reduced pressure. After the distillation under reduced pressure, it was confirmed by NMR that 6.5% by mass of ethyl acetate remained.

Further, the content of bifunctional acrylate in the commercially available product of hydroxyethyl acrylate was measured by gas chromatography (GC), and was found to be 0.28% by mass. However, when the content of the bifunctional acrylate in the product purified as described above was measured, the content thereof was below the detection limit.

To a 500-mL three-necked flask, 20 mL of N-methylpyrrolidone, 2.32 g of hydroxyethyl acrylate purified by the above-described method, and 10.01 g of cyanoethyl acrylate were added, and the mixture was heated to 75° C. Then, a mixture liquid of 0.23 g of V-601 (described above) and 5 mL of N-methylpyrrolidone was added dropwise to the mixture over 1 hour. When 1 hour lapsed after completion of the dropwise addition, the mixture was heated to 80° C. and was allowed to react for 1 hour.

To the reaction solution, 0.29 g of di-tertiary-butylhydroquinone, 0.29 g of dibutyltin dilaurate, 18.56 g of KARENZ AOI (trade name, manufactured by Showa Denko Kabushiki Kaisha), and 19 g of N-methylpyrrolidone were added, and the mixture was allowed to react for 6 hours at 55° C. Subsequently, 3.6 g of methanol was added to the reaction liquid, and the resulting mixture was allowed to react further for 1.5 hours. After completion of the reaction, reprecipitation was performed with water, and a resulted solid product was collected to obtain 25 g of the nitrile group-containing polymerizable polymer B of the invention.

Identification of Structure

The synthesized nitrile group-containing polymerizable polymer B was dissolved in deuterated DMSO (dimethylsulfoxide), and the solution was measured by 300 MHz NMR (trade name: AV-300, manufactured by Bruker Corp.). Broad peaks corresponding to the nitrile group-containing unit were observed over ranges including 4.3-4.05 ppm (2H fraction), 2.9-2.8 ppm (2H fraction) and 2.5-1.3 ppm (3H fraction), and broad peaks corresponding to the polymerizable group-containing unit were observed over ranges including 7.2-7.3 ppm (1H fraction), 6.4-6.3 ppm (1H fraction), 6.2-6.1 ppm (1H fraction), 6.0-5.9 ppm (1H fraction), 4.3-4.05 ppm (6H fraction), 3.3-3.2 ppm (2H fraction) and 2.5-1.3 ppm (3H fraction). Thus, it was found that the ratio of polymerizable group-containing unit:nitrile group-containing unit was 20:80 (molar ratio).

Measurement of Molecular Weight

The synthesized nitrile group-containing polymerizable polymer B was dissolved in THF, and the molecular weight was measured by using high performance GPC (trade name: HLC-8220GPC, manufactured by Tosoh Corp.). As a result, a peak appeared at 23.75 minutes, and it was found that the Mw was 22000 (Mw/Mn=2.1) in terms of polystyrene standards.

Examplary Embodiment of Use of Nitrile Group-containing Polymerizable Polymer B

A composition was prepared in the same manner as in Example 2-1, except that the nitrile group-containing polymerizable polymer B synthesized as described above was used. This composition was used to form a laminate to prepare a comb-shaped wiring (metallic pattern-bearing material).

The resulting comb-shaped wiring was subjected to the same experiment as in Example 2-1, and no defect in the inter-wiring insulation was observed.

Example 2-3

Synthesis Example

Synthesis of Nitrile Group-containing Polymerizable Polymer C of the Invention 11 mL of ethylene glycol diacetate was placed in a 500-mL three-necked flask, and was heated to 75° C. A mixture liquid of 1.39 g of hydroxyethyl acrylate purified by the method described in Example 2-2, 6.00 g of cyanoethyl acrylate, 0.1382 g of V-601 (described above) and 11 mL of ethylene glycol diacetate was added dropwise to the flask over 2.5 hours. After completion of the dropwise addition, the mixture was heated to 80° C. and was allowed to react for 3 hours.

To this reaction solution, 0.06 g of di-tertiary-butylhydroquinone, 0.13 g of NEOSTAN U-600 (described above), 3.84 g of KARENZ AOI (trade name, manufactured by Showa Denko Kabushiki Kaisha), and 3.8 g of ethylene glycol diacetate (SP value: 20.79 $MPa^{1/2}$) were added, and the mixture was allowed to react for 6 hours at 55° C.

Subsequently, 3.6 g of methanol was added to the reaction liquid, and the resulting mixture was allowed to react further for 1.5 hours. After completion of the reaction, reprecipitation was performed with water, and a resulted solid product was collected to obtain 3 g of the nitrile group-containing polymerizable polymer C of the invention.

Identification of Structure

The synthesized nitrile group-containing polymerizable polymer C was dissolved in deuterated DMSO (dimethylsulfoxide), and the solution was measured by 300 MHz NMR (trade name: AV-300, manufactured by Bruker Corp.). Broad peaks corresponding to the nitrile group-containing unit were observed over ranges including 4.3-4.05 ppm (2H fraction), 2.9-2.8 ppm (2H fraction) and 2.5-1.3 ppm (3H fraction), and broad peaks corresponding to the polymerizable group-containing unit were observed over ranges including 7.2-7.3 ppm (1H fraction), 6.4-6.3 ppm (1H fraction), 6.2-6.1 ppm (1H fraction), 6.0-5.9 ppm (1H fraction), 4.3-4.05 ppm (6H fraction), 3.3-3.2 ppm (2H fraction) and 2.5-1.3 ppm (3H fraction). Thus, it was found that the ratio of polymerizable group-containing unit:nitrile group-containing unit was 21:79 (molar ratio).

Measurement of Molecular Weight

The synthesized nitrile group-containing polymerizable polymer C was dissolved in THF, and the molecular weight was measured by using high performance GPC (trade name: HLC-8220GPC, manufactured by Tosoh Corp.). As a result, a peak appeared at 23.75 minutes, and it was found that the Mw was 84000 (Mw/Mn=2.9) in terms of polystyrene standards.

Examplary Embodiment of Use of Nitrile Group-containing Polymerizable Polymer C

A composition was prepared in the same manner as in Example 2-1, except that the nitrile group-containing polymerizable polymer C synthesized as described above was used. The composition was used to form a laminate to prepare a comb-shaped wiring (metallic pattern-bearing material).

The resulting comb-shaped wiring was subjected to the same experiment as in Example 2-1, and no defect in the inter-wiring insulation was observed.

Example 2-4

Synthesis Example

Synthesis of Nitrile Group-containing Polymerizable Polymer D of the Invention 30 mL of diethylene glycol diacetate was placed in a 500-mL three-necked flask, and was heated to 75° C. A mixture liquid of 3.72 g of hydroxyethyl acrylate purified by the method described in Example 2-2, 16.01 g of cyanoethyl acrylate, 0.0737 g of V-601 (described above) and 30 mL of diethylene glycol diacetate was added dropwise to the flask over 2.5 hours. After completion of the dropwise addition, the mixture was heated to 80° C. and was allowed to react for 3 hours.

To this reaction solution, 0.16 g of di-tertiary-butylhydroquinone, 0.32 g of NEOSTAN U-600 (described above), 9.6 g of KARENZ AOI (trade name, manufactured by Showa Denko Kabushiki Kaisha), and 9.6 g of diethylene glycol diacetate (SP value: 20.75 $MPa^{1/2}$) were added, and the mixture was allowed to react for 6 hours at 55° C. Subsequently, 3.6 g of methanol was added to the reaction liquid, and the resulting mixture was allowed to react further for 1.5 hours. After completion of the reaction, reprecipitation was performed with water, and a resulted solid product was collected to obtain 18 g of the nitrile group-containing polymerizable polymer D of the invention.

Identification of Structure

The synthesized nitrile group-containing polymerizable polymer D was subjected to NMR measurement in the same manner as in Example 2-2, and it was found that the ratio of polymerizable group-containing unit:nitrile group-containing unit was 23:77 (molar ratio).

Measurement of Molecular Weight

The synthesized nitrile group-containing polymerizable polymer D was dissolved in THF, and the molecular weight was measured by using high performance GPC (trade name: HLC-8220GPC, manufactured by Tosoh Corp.). As a result, a peak appeared at 23.75 minutes, and it was found that the Mw was 93000 (Mw/Mn=3.2) in terms of polystyrene standards.

Examplary Embodiment of Use of Nitrile Group-containing Polymerizable Polymer D

A composition was prepared in the same manner as in Example 2-1, except that the nitrile group-containing polymerizable polymer D synthesized as described above was used. The composition was used to form a laminate to prepare a comb-shaped wiring (metallic pattern-bearing material).

The resulting comb-shaped wiring was subjected to the same experiment as in Example 2-1, and no defect in the inter-wiring insulation was observed.

Examples 2-5 to 2-13

As Examples 2-5 to 2-13, nitrile group-containing polymerizable polymers E to M of the invention were synthesized via the Synthesis examples shown below.

Synthesis Example

Synthesis of Nitrile Group-containing Polymerizable Polymer E of the Invention 29 g of diethylene glycol diacetate was placed in a 300-ml three-necked flask, and was heated to 75° C. under a nitrogen gas stream. A solution of 3.72 g of 2-hydroxyethyl acrylate purified by the method described in Example 2-2, 16.01 g of 2-cyanoethyl acrylate and 0.1842 g of V-601 (described above) in 30 g of diethylene glycol diacetate was added dropwise to the flask over 2.5 hours. After completion of the dropwise addition, the mixture was heated to 80° C. and was allowed to react for 3 hours. Subsequently, the reaction solution was cooled to room temperature.

To this reaction solution, 0.16 g of di-tertiary-butylhydroquinone, 0.31 g of NEOSTAN U-600 (described above), 10.28 g of KARENZ AOI (trade name, manufactured by Showa Denko Kabushiki Kaisha), and 10.28 g of diethylene glycol diacetate (SP value: 20.75 MPa$^{1/2}$) were dissolved, and the mixture was allowed to react for 6 hours at 55° C. Subsequently, 2.05 g of methanol was added to the reaction liquid, and the resulting mixture was allowed to react further for 1.5 hours. After completion of the reaction, reprecipitation was performed with water, and a resulted solid product was collected to obtain 18 g of the nitrile group-containing polymerizable polymer E of the invention.

Identification of Structure

The synthesized nitrile group-containing polymerizable polymer E was dissolved in deuterated DMSO, and the solution was measured by 300 MHz NMR (trade name: AV-300, manufactured by Bruker Corp.). Broad peaks corresponding to the nitrile group-containing unit were observed over ranges including 4.3-4.0 ppm (2H fraction), 2.9-2.75 ppm (2H fraction) and 2.5-1.3 ppm (3H fraction), and broad peaks corresponding to the polymerizable group-containing unit were observed over ranges including 7.4-7.0 ppm (1H fraction), 6.1-6.0 ppm (1H fraction), 5.7-5.6 ppm (1H fraction), 4.3-4.0 ppm (6H fraction), 3.4-3.2 ppm (2H fraction), 2.5-1.3 ppm (3H fraction) and 1.9-1.8 ppm (3H fraction). Thus, it was found that the ratio of polymerizable group-containing unit:nitrile group-containing unit was 22:78 (molar ratio).

Measurement of Molecular Weight

The synthesized nitrile group-containing polymerizable polymer E was dissolved in THF, and the molecular weight was measured by using high performance GPC (trade name: HLC-8220GPC, manufactured by Tosoh Corp.). As a result, a peak appeared at 20.11 minutes, and it was found that the Mw was 78000 (Mw/Mn=3.11) in terms of polystyrene standards.

Synthesis Example

Synthesis of Nitrile Group-containing Polymerizable Polymer F of the Invention 35 g of N,N-dimethylacetamide was placed in a 1000-mL three-necked flask, and was heated to 75° C. under a nitrogen gas stream. To this, a solution of 10.25 g of a monomer having the structure shown below, 24.82 g of 2-cyanoethyl acrylate, and 0.5710 g of V-601 (described above) in 35 g of N,N-dimethylacetamide was added dropwise over 2.5 hours. After completion of the dropwise addition, the mixture was heated to 80° C., and was further stirred for 3 hours. Thereafter, the reaction solution was cooled to room temperature.

To this reaction solution, 0.427 g of 4-hydroxy-TEMPO, 12.54 g of triethylamine, and 315.6 g of N,N-dimethylacetamide were added under ice cooling, and the mixture was allowed to react at room temperature for 4 hours. After completion of the reaction, reprecipitation was performed with isopropyl alcohol:hexane=1:3, and a resulted solid product was collected to obtain 24 g of the nitrile group-containing polymerizable polymer F of the invention.

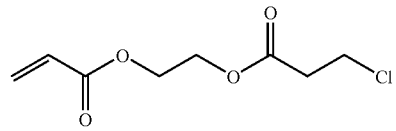

Identification of Structure

The synthesized nitrile group-containing polymerizable polymer F was dissolved in deuterated DMSO, and the solution was measured by 300 MHz NMR (trade name: AV-300, manufactured by Bruker Corp.). Broad peaks corresponding to the nitrile group-containing unit were observed over ranges including 4.3-4.05 ppm (2H fraction), 2.9-2.8 ppm (2H fraction) and 2.5-1.3 ppm (3H fraction), and broad peaks corresponding to the polymerizable group-containing unit were observed over ranges including 7.2-7.3 ppm (1H fraction), 6.4-6.3 ppm (1H fraction), 6.2-6.1 ppm (1H fraction), 6.0-5.9 ppm (1H fraction), 4.4-4.05 ppm (4H fraction), and 2.5-1.3 ppm (3H fraction). Thus, it was found that the ratio of polymerizable group-containing unit:nitrile group-containing unit was 23:77 (molar ratio).

Measurement of Molecular Weight

The synthesized nitrile group-containing polymerizable polymer F was dissolved in THF, and the molecular weight was measured by using high performance GPC (trade name: HLC-8220GPC, manufactured by Tosoh Corp.). As a result, a peak appeared at 22.47 minutes, and it was found that the Mw was 12000 (Mw/Mn=1.78) in terms of polystyrene standards.

Synthesis Example

Synthesis of Nitrile Group-containing Polymerizable Polymer G of the Invention 40 g of N,N-dimethylacetamide was placed in a 500-ml three-necked flask, and was heated to 75° C. under a nitrogen gas stream. A solution of 5.04 g of acrylic acid, 35.03 g of 2-cyanoethyl acrylate and 0.8059 g of V-601 (described above) in 40 g of N,N-dimethylacetamide was added dropwise to the flask over 2.5 hours. After completion of the dropwise addition, the mixture was heated to 80° C. and was allowed to react further for 3 hours. Subsequently, the reaction solution was cooled to room temperature.

To this reaction solution, 0.04 g of di-tertiary-butylhydroquinone, 3.19 g of triethylbenzylammonium chloride, and 25.52 g of CYCLOMER A (as described above) were added, and the mixture was allowed to react for 5 hours at 100° C. After completion of the reaction, reprecipitation was performed with ethyl acetate:hexane=2:3, and a resulted solid product was collected to obtain 30 g of the nitrile group-containing polymerizable polymer G of the invention.

Identification of Structure

The synthesized nitrile group-containing polymerizable polymer G was dissolved in deuterated DMSO, and the solution was measured by 300 MHz NMR (trade name: AV-300, manufactured by Bruker Corp.). Broad peaks corresponding to the nitrile group-containing unit were observed over ranges including 4.4-4.2 ppm (2H fraction), 3.0-2.8 ppm (2H fraction) and 2.6-1.3 ppm (3H fraction), and broad peaks corresponding to the polymerizable group-containing unit were observed over ranges including 7.6-7.5 ppm (1H fraction), 6.5-6.3 ppm (1H fraction), 6.3-6.1 ppm (1H fraction), 6.0-5.8 ppm (1H fraction), 4.9-4.7 ppm (1H fraction), 4.2-4.0 (2H fraction), 4.0-3.7 (1H fraction), and 2.7-1.3 ppm (10H fraction). Thus, it was found that the ratio of polymerizable group-containing unit:nitrile group-containing unit was 35:65 (molar ratio).

Measurement of Molecular Weight

The synthesized nitrile group-containing polymerizable polymer G was dissolved in THF, and the molecular weight was measured by using high performance GPC (trade name: HLC-8220GPC, manufactured by Tosoh Corp.). As a result, a peak appeared at 22.23 minutes, and it was found that the Mw was 23000 (Mw/Mn=2.17) in terms of polystyrene standards.

Synthesis Example

Synthesis of Nitrile Group-containing Polymerizable Polymer H of the Invention 21 g of diethylene glycol diacetate was placed in a 300-ml three-necked flask, and was heated to 75° C. under a nitrogen gas stream. A solution of 2.69 g of 2-hydroxyethyl acrylate purified by the technique as described in Example 2-2, 17.37 g of p-cyanobenzyl acrylate and 0.0534 g of V-601 (described above) in 20 g of diethylene glycol diacetate was added dropwise to the flask over 2.5 hours. After completion of the dropwise addition, the mixture was stirred for 2 hours, heated to 80° C., and then stirred further for 2 hours. Subsequently, the reaction solution was cooled to room temperature.

To this reaction solution, 0.12 g of di-tertiary-butylhydroquinone, 0.23 g of NEOSTAN U-600 (described above), 7.09 g of KARENZ AOI (trade name, manufactured by Showa Denko Kabushiki Kaisha), and 27.09 g of diethylene glycol diacetate (SP value: 20.75 $MPa^{1/2}$) were added, and the mixture was allowed to react for 6 hours at 55° C. Subsequently, 1.48 g of methanol was added to the reaction liquid, and the resulting mixture was allowed to react further for 1.5 hours. After completion of the reaction, reprecipitation was performed with water, and a resulted solid product was collected to obtain 21 g of the nitrile group-containing polymerizable polymer H of the invention.

Identification of Structure

The synthesized nitrile group-containing polymerizable polymer H was dissolved in deuterated DMSO, and the solution was measured by 300 MHz NMR (trade name: AV-300, manufactured by Bruker Corp.). Broad peaks corresponding to the nitrile group-containing unit were observed over ranges including 7.8-7.65 ppm (2H fraction), 7.5-7.3 ppm (2H fraction), 5.2-4.9 ppm (2H fraction) and 2.5-1.3 ppm (3H fraction), and broad peaks corresponding to the polymerizable group-containing unit were observed over ranges including 7.4-7.0 ppm (1H fraction), 6.4-6.2 ppm (1H fraction), 6.2-6.0 ppm (1H fraction), 6.0-5.8 ppm (1H fraction), 4.2-3.9 ppm (6H fraction), 3.4-3.2 ppm (2H fraction), and 2.5-1.3 ppm (3H fraction). Thus, it was found that the ratio of polymerizable group-containing unit:nitrile group-containing unit was 23:77 (molar ratio).

Measurement of Molecular Weight

The synthesized nitrile group-containing polymerizable polymer H was dissolved in THF, and the molecular weight was measured by using high performance GPC (trade name: HLC-8220GPC, manufactured by Tosoh Corp.). As a result, a peak appeared at 19.85 minutes, and it was found that the Mw was 149,000 (Mw/Mn=4.46) in terms of polystyrene standards.

Synthesis Example

Synthesis of Nitrile Group-containing Polymerizable Polymer I of the Invention 20 g of diethylene glycol diacetate was placed in a 300-ml three-necked flask, and was heated to 75° C. under a nitrogen gas stream. A solution of 3.77 g of 2-hydroxyethyl methacrylate purified by the technique as described in Example 2-2, 16.15 g of 2-cyanoethyl methacrylate and 0.0668 g of V-601 (described above) in 20 g of diethylene glycol diacetate was added dropwise to the flask over 2.5 hours. After completion of the dropwise addition, the mixture was heated to 80° C., and then was stirred further for 3 hours. Subsequently, the reaction solution was cooled to room temperature.

To this reaction solution, 0.15 g of di-tertiary-butylhydroquinone, 0.29 g of NEOSTAN U-600 (described above), 8.82 g of KARENZ AOI (trade name, manufactured by Showa Denko Kabushiki Kaisha), and 27.82 g of diethylene glycol diacetate (SP value: 20.75 $MPa^{1/2}$) were added, and the mixture was allowed to react for 6 hours at 55° C. Subsequently, 1.86 g of methanol was added to the reaction liquid, and the resulting mixture was allowed to react further for 1.5 hours. After completion of the reaction, reprecipitation was performed with water, and a resulted solid product was collected to obtain 10 g of the nitrile group-containing polymerizable polymer I of the invention.

Identification of Structure

The synthesized nitrile group-containing polymerizable polymer I was dissolved in deuterated DMSO, and the solution was measured by 300 MHz NMR (trade name: AV-300, manufactured by Bruker Corp.). Broad peaks corresponding to the nitrile group-containing unit were observed over ranges including 4.25-4.0 ppm (2H fraction), 2.95-2.8 ppm (2H fraction), and 2.1-0.5 ppm (5H fraction), and broad peaks corresponding to the polymerizable group-containing unit were observed over ranges including 7.4-7.0 ppm (1H fraction), 6.5-6.3 ppm (1H fraction), 6.3-6.0 ppm (1H fraction), 6.0-5.8 ppm (1H fraction), 4.2-3.9 ppm (6H fraction), 3.5-3.3 ppm (2H fraction), and 2.1-0.5 ppm (5H fraction). Thus, it was found that the ratio of polymerizable group-containing unit: nitrile group-containing unit was 24:76 (molar ratio).

Measurement of Molecular Weight

The synthesized nitrile group-containing polymerizable polymer I was dissolved in THF, and the molecular weight was measured by using high performance GPC (trade name: HLC-8220GPC, manufactured by Tosoh Corp.). As a result, a peak appeared at 18.52 minutes, and it was found that the Mw was 238,000 (Mw/Mn=2.56) in terms of polystyrene standards.

Synthesis Example

Synthesis of Nitrile Group-containing Polymerizable Polymer J of the Invention 33 g of diethylene glycol diacetate was placed in a 300-ml three-necked flask, and was heated to 75° C. under a nitrogen gas stream. A solution of 4.16 g of 2-hydroxyethyl methacrylate purified by the technique as described in Example 2-2, 17.80 g of 2-cyanoethyl methacrylate and 0.1842 g of V-601 (described above) in 33 g of diethylene glycol diacetate was added dropwise to the flask over 2.5 hours. After completion of the dropwise addition, the mixture was heated to 80° C., and then was stirred further for 3 hours. Subsequently, the reaction solution was cooled to room temperature.

To this reaction solution, 0.16 g of di-tertiary-butylhydroquinone, 0.32 g of NEOSTAN U-600 (described above), 10.66 g of KARENZ MOI (trade name, manufactured by Showa Denko Kabushiki Kaisha), and 10.66 g of diethylene glycol diacetate (SP value: 20.75 MPa$^{1/2}$) were added, and the mixture was allowed to react for 6 hours at 55° C. Subsequently, 2.05 g of methanol was added to the reaction liquid, and the resulting mixture was allowed to react further for 1.5 hours. After completion of the reaction, reprecipitation was performed with water, and a resulted solid product was collected to obtain 20 g of the nitrile group-containing polymerizable polymer J of the invention.

Identification of Structure

The synthesized nitrile group-containing polymerizable polymer J was dissolved in deuterated DMSO, and the solution was measured by 300 MHz NMR (trade name: AV-300, manufactured by Bruker Corp.). Broad peaks corresponding to the nitrile group-containing unit were observed over ranges including 4.2-3.95 ppm (2H fraction), 2.9-2.75 ppm (2H fraction), and 2.1-0.6 ppm (5H fraction), and broad peaks corresponding to the polymerizable group-containing unit were observed over ranges including 7.4-7.0 ppm (1H fraction), 6.1-6.0 ppm (1H fraction), 5.7-5.6 ppm (1H fraction), 4.2-3.95 ppm (6H fraction), 3.35-3.2 ppm (2H fraction), and 2.1-0.6 ppm (8H fraction). Thus, it was found that the ratio of polymerizable group-containing unit:nitrile group-containing unit was 24:76 (molar ratio).

Measurement of Molecular Weight

The synthesized nitrile group-containing polymerizable polymer J was dissolved in THF, and the molecular weight was measured by using high performance GPC (trade name: HLC-8220GPC, manufactured by Tosoh Corp.). As a result, a peak appeared at 19.90 minutes, and it was found that the Mw was 90,000 (Mw/Mn=2.45) in terms of polystyrene standards.

Synthesis Example

Synthesis of Nitrile Group-containing Polymerizable Polymer K of the Invention 5 g of N-methyl-2-pyrrolidone was placed in a 300-ml three-necked flask, and was heated to 75° C. under a nitrogen gas stream. A solution of 0.53 g of 2-hydroxyethyl acrylate purified by the technique as described in Example 2-2, 3.85 g of 2,2-diethyl-4-cyano-ethyl acrylate and 0.0530 g of V-601 (described above) in 4 g of N-methyl-2-pyrrolidone was added dropwise to the flask over 2.5 hours. After completion of the dropwise addition, the mixture was heated to 80° C., and then was stirred further for 3 hours. Subsequently, the reaction solution was cooled to room temperature.

To this reaction solution, 0.02 g of di-tertiary-butylhydroquinone, 0.05 g of NEOSTAN U-600 (described above), 1.53 g of KARENZ AOI (trade name, manufactured by Showa Denko Kabushiki Kaisha), and 1.53 g of N-methyl-2-pyrrolidone (SP value: 22.94 MPa$^{1/2}$) were added, and the mixture was allowed to react for 6 hours at 55° C. Subsequently, 0.29 g of methanol was added to the reaction liquid, and the resulting mixture was allowed to react further for 1.5 hours. After completion of the reaction, reprecipitation was performed with water, and a resulted solid product was collected to obtain 1 g of the nitrile group-containing polymerizable polymer K of the invention.

Identification of Structure

The synthesized nitrile group-containing polymerizable polymer K was dissolved in deuterated DMSO, and the solution was measured by 300 MHz NMR (trade name: AV-300, manufactured by Bruker Corp.). Broad peaks corresponding to the nitrile group-containing unit were observed over ranges including 3.9-3.65 ppm (2H fraction), 2.5-2.3 ppm (2H fraction), 1.7-1.4 ppm (2H fraction), 1.4-1.1 ppm (4H fraction), 0.9-0.6 ppm (6H fraction), and 2.5-1.3 ppm (3H fraction), and broad peaks corresponding to the polymerizable group-containing unit were observed over ranges including 7.4-7.0 ppm (1H fraction), 6.4-6.3 ppm (1H fraction), 6.3-6.1 ppm (1H fraction), 6.0-5.9 ppm (1H fraction), 4.2-4.0 ppm (6H fraction), 3.4-3.2 ppm (2H fraction), and 2.0-1.3 ppm (3H fraction). Thus, it was found that the ratio of polymerizable group-containing unit:nitrile group-containing unit was 25:75 (molar ratio).

Measurement of Molecular Weight

The synthesized nitrile group-containing polymerizable polymer K was dissolved in THF, and the molecular weight was measured by using high performance GPC (trade name: HLC-8220GPC, manufactured by Tosoh Corp.). As a result, a peak appeared at 23.07 minutes, and it was found that the Mw was 6900 (Mw/Mn=1.45) in terms of polystyrene standards.

Synthesis Example

Synthesis of Nitrile Group-containing Polymerizable Polymer L of the Invention 25 g of N-methyl-2-pyrrolidone was placed in a 300-ml three-necked flask, and was heated to 75° C. under a nitrogen gas stream. A solution of 3.17 g of 2-hydroxyethyl acrylate purified by the technique as described in Example 2-2, 15.37 g of 2-cyanoethyl acrylate, 6.52 g of acrylonitrile and 0.6286 g of V-601 (described above) in 25 g of N-methyl-2-pyrrolidone was added dropwise to the flask over 2.5 hours. After completion of the dropwise addition, the mixture was heated to 80° C., and then was stirred further for 3 hours. Subsequently, the reaction solution was cooled to room temperature.

To this reaction solution, 0.14 g of di-tertiary-butylhydroquinone, 0.28 g of NEOSTAN U-600 (described above), 8.54 g of KARENZ AOI (trade name, manufactured by Showa Denko Kabushiki Kaisha), and 8.54 g of N-methyl-2-pyrrolidone (SP value: 22.94 $MPa^{1/2}$) were added, and the mixture was allowed to react for 6 hours at 55° C. Subsequently, 1.75 g of methanol was added to the reaction liquid, and the resulting mixture was allowed to react further for 1.5 hours. After completion of the reaction, reprecipitation was performed with water, and a resulted solid product was collected to obtain 18 g of the nitrile group-containing polymerizable polymer L of the invention.

Identification of Structure

The synthesized nitrile group-containing polymerizable polymer L was dissolved in deuterated DMSO, and the solution was measured by 300 MHz NMR (trade name: AV-300, manufactured by Bruker Corp.). Broad peaks corresponding to the cyanoethyl acrylate unit were observed over ranges including 4.3-4.0 ppm (2H fraction), 3.0-2.8 ppm (2H fraction) and 2.7-1.4 ppm (3H fraction), broad peaks corresponding to the acrylonitrile unit were observed over a range of 2.7-1.4 ppm (3H fraction), and broad peaks corresponding to the polymerizable group-containing unit were observed over ranges including 7.4-7.0 ppm (1H fraction), 6.4-6.3 ppm (1H fraction), 6.3-6.1 ppm (1H fraction), 6.0-5.9 ppm (1H fraction), 4.2-4.0 ppm (6H fraction), 3.3-3.2 ppm (2H fraction), and 2.7-1.4 ppm (3H fraction). Thus, it was found that the ratio of polymerizable group-containing unit:cyanoethyl acrylate unit:acrylonitrile unit=12:47:41 (molar ratio).

Measurement of Molecular Weight

The synthesized nitrile group-containing polymerizable polymer L was dissolved in THF, and the molecular weight was measured by using high performance GPC (trade name: HLC-8220GPC, manufactured by Tosoh Corp.). As a result, a peak appeared at 24.18 minutes, and it was found that the Mw was 4700 (Mw/Mn=1.69) in terms of polystyrene standards.

Synthesis Example

Synthesis of Nitrile Group-containing Polymerizable Polymer M of the Invention 10 mL of dimethyl carbonate was placed in a 500-ml three-necked flask, and was heated to 65° C. A mixture liquid of 3.72 g of hydroxyethyl acrylate purified by the method as described in Example 2-2, 16.01 g of cyanoethyl acrylate, 0.3974 g of V-65, and 10 mL of dimethyl carbonate was added dropwise to the flask over 2.5 hours. After completion of the dropwise addition, 25 mL of dimethyl carbonate was added thereto, and the mixture was allowed to react further for 3 hours at 65° C. After completion of the reaction, 14 mL of dimethyl carbonate was added.

To this reaction solution, 0.15 g of di-tertiary-butylhydroquinone, 0.38 g of NEOSTAN U-600 (described above), 11.6 g of KARENZ AOI (trade name, manufactured by Showa Denko Kabushiki Kaisha), and 11.6 g of dimethyl carbonate (SP value: 22.9 $MPa^{1/2}$) were added, and the mixture was allowed to react for 6 hours at 55° C. Subsequently, 1.9 g of methanol was added to the reaction liquid, and the resulting mixture was allowed to react further for 1.5 hours. After completion of the reaction, reprecipitation was performed with water, and a resulted solid product was collected to obtain 12 g of the nitrile group-containing polymerizable polymer M of the invention.

Identification of Structure

The synthesized nitrile group-containing polymerizable polymer M was dissolved in deuterated DMSO (dimethylsulfoxide), and the solution was measured by 300 MHz NMR (trade name: AV-300, manufactured by Bruker Corp.). Broad peaks corresponding to the nitrile group-containing unit were observed over ranges including 4.3-4.05 ppm (2H fraction), 2.9-2.8 ppm (2H fraction), and 2.5-1.3 ppm (3H fraction), and broad peaks corresponding to the polymerizable group-containing unit were observed over ranges including 7.2-7.3 ppm (1H fraction), 6.4-6.3 ppm (1H fraction), 6.2-6.1 ppm (1H fraction), 6.0-5.9 ppm (1H fraction), 4.3-4.05 ppm (6H fraction), 3.3-3.2 ppm (2H fraction), and 2.5-1.3 ppm (3H fraction). Thus, it was found that the ratio of polymerizable group-containing unit:nitrile group-containing unit was 25:75 (molar ratio).

Measurement of Molecular Weight

The synthesized nitrile group-containing polymerizable polymer M was dissolved in THF, and the molecular weight was measured by using high performance GPC (trade name: HLC-8220GPC, manufactured by Tosoh Corp.). As a result, a peak appeared at 20.40 minutes, and it was found that the Mw was 83,000 (Mw/Mn=2.6) in terms of polystyrene standards.

The invention claimed is:

1. A polymer comprising a unit represented by the following Formula (1), and a unit represented by the following Formula (5):

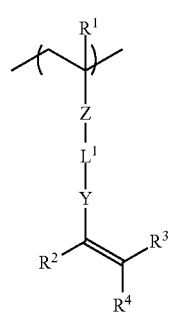

Formula (1)

wherein in Formula (1), $R^1$ to $R^4$ each independently represents a hydrogen atom or a substituted or unsubstituted alkyl group; Y and Z each independently represents a single bond, a substituted or unsubstituted divalent organic group, an ester group, an amide group or an ether group; and $L^1$ represents a substituted or unsubstituted divalent organic group, and

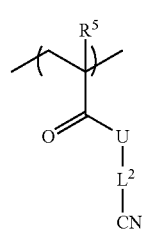

Formula (5)

wherein in Formula (5), $R^5$ represents a hydrogen atom or a substituted or unsubstituted alkyl group; U represents an oxygen atom, or NR' in which R' represents a hydrogen atom or an alkyl group; and $L^2$ represents a substituted or unsubstituted divalent organic group.

2. The polymer of claim 1, wherein the unit represented by Formula (1) is a unit represented by the following Formula (3):

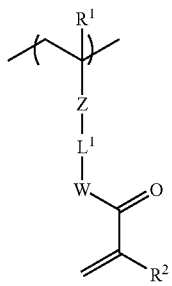

Formula (3)

wherein $R^1$ and $R^2$ each independently represents a hydrogen atom or a substituted or unsubstituted alkyl group; Z represents a single bond, a substituted or unsubstituted divalent organic group, an ester group, an amide group, or an ether group; W represents an oxygen atom or NR in which R represents a hydrogen atom or an alkyl group; and $L^1$ represents a substituted or unsubstituted divalent organic group.

3. The polymer of claim 2, wherein the unit represented by Formula (3) is a unit represented by the following Formula (4):

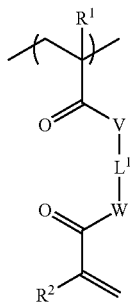

Formula (4)

wherein $R^1$ and $R^2$ each independently represents a hydrogen atom, or a substituted or unsubstituted alkyl group; V and W each independently represents an oxygen atom, or NR in which R represents a hydrogen atom or an alkyl group; and $L^1$ represents a substituted or unsubstituted divalent organic group.

4. The polymer of claim 3, wherein W in Formula (4) is an oxygen atom.

5. The polymer of claim 1, wherein $L^1$ in Formula (1) is a divalent organic group having a urethane bond or a urea bond.

6. The polymer of claim 1, wherein $L^1$ in Formula (1) is a divalent organic group having 1 to 9 carbon atoms in total.

7. The polymer of claim 1, wherein the linkage site to a cyano group in $L^2$ in Formula (5) is a divalent organic group having a linear, branched or cyclic alkylene group.

8. The polymer of claim 7, wherein the divalent organic group has 1 to 10 carbon atoms in total.

9. The polymer of claim 1, wherein the linkage site to a cyano group in $L^2$ in Formula (5) is a divalent organic group having an aromatic group.

10. The polymer of claim 9, wherein the divalent organic group has 6 to 15 carbon atoms in total.

11. The polymer of claim 1, wherein $R^5$ in Formula (5) is a hydrogen atom.

12. The polymer of claim 1, wherein $L^1$ in Formula (1) is a divalent organic group having a urethane bond.

13. The polymer of claim 1, having a weight average molecular weight of 20,000 or more.

14. A method of synthesizing the polymer of claim 12, the method comprising at least forming, in a solvent, a urethane bond in $L^1$ by adding an isocyanate group to an hydroxyl group, employing a polymer comprising the hydroxyl group in a side chain and a compound comprising the isocyanate group and a polymerizable group.

15. The method of synthesizing the polymer of claim 14, wherein the polymer having a hydroxyl group in a side chain thereof is synthesized using a hydroxyl group-containing (meth)acrylate obtained by sequentially performing the following processes (1) to (4):
    (1) dissolving, in water, a mixture containing the hydroxyl group-containing (meth)acrylate and a bifunctional acrylate which is byproduced upon synthesis of the hydroxyl group-containing (meth)acrylate;
    (2) adding, to the obtained aqueous solution, a first organic solvent which is separable from water, and then separating a phase containing the first organic solvent and the bifunctional acrylate from the aqueous phase;
    (3) dissolving, in the aqueous phase, a compound having higher water-solubility than that of the hydroxyl group-containing (meth)acrylate; and
    (4) adding a second organic solvent to the aqueous phase, extracting the hydroxyl group-containing (meth)acrylate, and then concentrating the extract.

16. The method of synthesizing the polymer of claim 15, wherein the isolated product containing the hydroxyl group-containing (meth)acrylate, which is obtained by sequentially performing the processes (1) to (4), contains the bifunctional acrylate in an amount in the range of 0% by mass to 0.10% by mass with respect to the total mass of the isolated product.

17. The method of synthesizing the polymer of claim 14, wherein the SP value (calculated by the Okitsu method) of the solvent is 20 to 23 $MPa^{1/2}$.

18. The method of synthesizing the polymer of claim 17, wherein the solvent is an ester solvent.

19. The method of synthesizing the polymer of claim 18, wherein the solvent is a diacetate solvent.

20. A composition containing the polymer of claim 1, and a ketone solvent or a nitrile solvent.

21. The composition of claim 20, wherein the concentration of the polymer comprising the unit represented by Formula (1) and the unit represented by Formula (5) is in the range of 2% by mass to 50% by mass.

22. A laminate formed by applying the composition of claim 20 on a resin base material.

* * * * *